(12) United States Patent
Kubota et al.

(10) Patent No.: US 12,478,273 B2
(45) Date of Patent: Nov. 25, 2025

(54) VEHICLE CONTROL DEVICE

(71) Applicant: SEMICONDUCTOR ENERGY LABORATORY CO., LTD., Atsugi (JP)

(72) Inventors: Daisuke Kubota, Kanagawa (JP); Kensuke Yoshizumi, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 377 days.

(21) Appl. No.: 18/008,232

(22) PCT Filed: May 31, 2021

(86) PCT No.: PCT/IB2021/054736
§ 371 (c)(1),
(2) Date: Dec. 5, 2022

(87) PCT Pub. No.: WO2021/250502
PCT Pub. Date: Dec. 16, 2021

(65) Prior Publication Data
US 2023/0200670 A1 Jun. 29, 2023

(30) Foreign Application Priority Data
Jun. 12, 2020 (JP) ................................. 2020-102400

(51) Int. Cl.
A61B 5/024 (2006.01)
A61B 5/00 (2006.01)
(Continued)

(52) U.S. Cl.
CPC ........ *A61B 5/02416* (2013.01); *A61B 5/1172* (2013.01); *A61B 5/6893* (2013.01);
(Continued)

(58) Field of Classification Search
CPC . A61B 5/02416; A61B 5/1172; A61B 5/6893; A61B 2503/22; H10K 39/34; B62D 1/04
(Continued)

(56) References Cited

U.S. PATENT DOCUMENTS 6,320,325 B1 * 11/2001 Cok ....................... H10K 59/13
315/169.3
7,227,305 B2 * 6/2007 Liu ........................ H10K 59/32
313/506
(Continued)

FOREIGN PATENT DOCUMENTS

JP 2005-312653 A 11/2005
JP 2008-237378 A 10/2008
(Continued)

OTHER PUBLICATIONS

International Search Report (Application No. PCT/IB2021/054736) Dated Sep. 7, 2021.
(Continued)

*Primary Examiner* — Zhen Y Wu
(74) *Attorney, Agent, or Firm* — Fish & Richardson P.C.

(57) ABSTRACT

A highly safe vehicle control device is provided. The vehicle control device includes an operation unit, a light-emitting and light-receiving unit, and a control unit. The operation unit includes a steering wheel including a rim, a hub, and a spoke. The rim is connected to the hub through the spoke. The light-emitting and light-receiving unit is provided along a surface of the rim. The light-emitting and light-receiving unit includes a first light-emitting element and a first light-receiving element. The first light-emitting element has a function of emitting light with a first wavelength range. The first light-receiving element has a function of receiving the light with the first wavelength range and converting it into an electrical signal. The first light-emitting element and the first light-receiving element are arranged on the same plane.
(Continued)

The light-emitting and light-receiving unit has a function of sequentially outputting received-light data to the control unit. The control unit has a function of obtaining biological information of a driver from a plurality of received-light data and executing processing corresponding to the biological information.

10 Claims, 18 Drawing Sheets

(51) Int. Cl.
    *A61B 5/1172*      (2016.01)
    *B62D 1/04*      (2006.01)
    *H10K 39/34*      (2023.01)

(52) U.S. Cl.
    CPC ............... *B62D 1/04* (2013.01); *H10K 39/34* (2023.02); *A61B 2503/22* (2013.01)

(58) Field of Classification Search
    USPC .......................................................... 340/576
    See application file for complete search history.

(56) References Cited

U.S. PATENT DOCUMENTS

| | | | |
|---|---|---|---|
| 7,248,997 | B2 | 7/2007 | Nagai et al. |
| 7,964,328 | B2* | 6/2011 | Ferrar ................. G03G 5/0651 |
| | | | 430/123.43 |
| 8,456,382 | B2 | 6/2013 | Yamazaki et al. |
| 8,469,134 | B2 | 6/2013 | Osaki et al. |
| 8,643,482 | B2 | 2/2014 | Yamazaki |
| 10,032,834 | B2* | 7/2018 | Udaka ................... H10K 39/34 |
| 10,434,847 | B2 | 10/2019 | Yoshizumi et al. |
| 10,589,660 | B2 | 3/2020 | Kimura et al. |
| 11,205,356 | B2 | 12/2021 | Yoshizumi et al. |
| 11,394,014 | B2 | 7/2022 | Kubota et al. |
| 11,487,373 | B2 | 11/2022 | Kubota et al. |
| 2004/0031966 | A1* | 2/2004 | Forrest .................. H10K 39/00 |
| | | | 257/79 |
| 2008/0238695 | A1* | 10/2008 | Yanai .................... G08B 21/04 |
| | | | 340/576 |
| 2008/0317303 | A1* | 12/2008 | Konno ................. G06V 10/141 |
| | | | 382/124 |
| 2009/0079345 | A1* | 3/2009 | Inuiya ................... H10K 59/65 |
| | | | 313/523 |
| 2010/0036592 | A1* | 2/2010 | Osaki ....................... B60T 7/14 |
| | | | 701/113 |
| 2010/0084642 | A1 | 4/2010 | Hanari |
| 2010/0134735 | A1 | 6/2010 | Nakamura et al. |
| 2015/0221706 | A1* | 8/2015 | Udaka .................... H10K 59/65 |
| | | | 257/40 |
| 2016/0044751 | A1 | 2/2016 | Ikeda et al. |
| 2017/0156651 | A1* | 6/2017 | Arias ................. A61B 5/14552 |
| 2017/0202464 | A1* | 7/2017 | Tsao ....................... A61B 5/332 |
| 2017/0288001 | A1 | 10/2017 | Ito |
| 2018/0062098 | A1 | 3/2018 | Li et al. |
| 2018/0076256 | A1 | 3/2018 | Jiang et al. |
| 2018/0107301 | A1 | 4/2018 | Kimura et al. |
| 2022/0229488 | A1 | 7/2022 | Akimoto et al. |
| 2022/0327187 | A1 | 10/2022 | Yoshimoto et al. |
| 2022/0335747 | A1 | 10/2022 | Kubota et al. |
| 2022/0344443 | A1 | 10/2022 | Yamazaki et al. |
| 2022/0350150 | A1 | 11/2022 | Ikeda et al. |

FOREIGN PATENT DOCUMENTS

| | | |
|---|---|---|
| JP | 2009-081296 A | 4/2009 |
| JP | 2009-231577 A | 10/2009 |
| JP | 2010-036799 A | 2/2010 |
| JP | 2010-252875 A | 11/2010 |
| JP | 4585553 | 11/2010 |

OTHER PUBLICATIONS

Written Opinion (Application No. PCT/IB2021/054736) Dated Sep. 7, 2021.

* cited by examiner

FIG. 1A
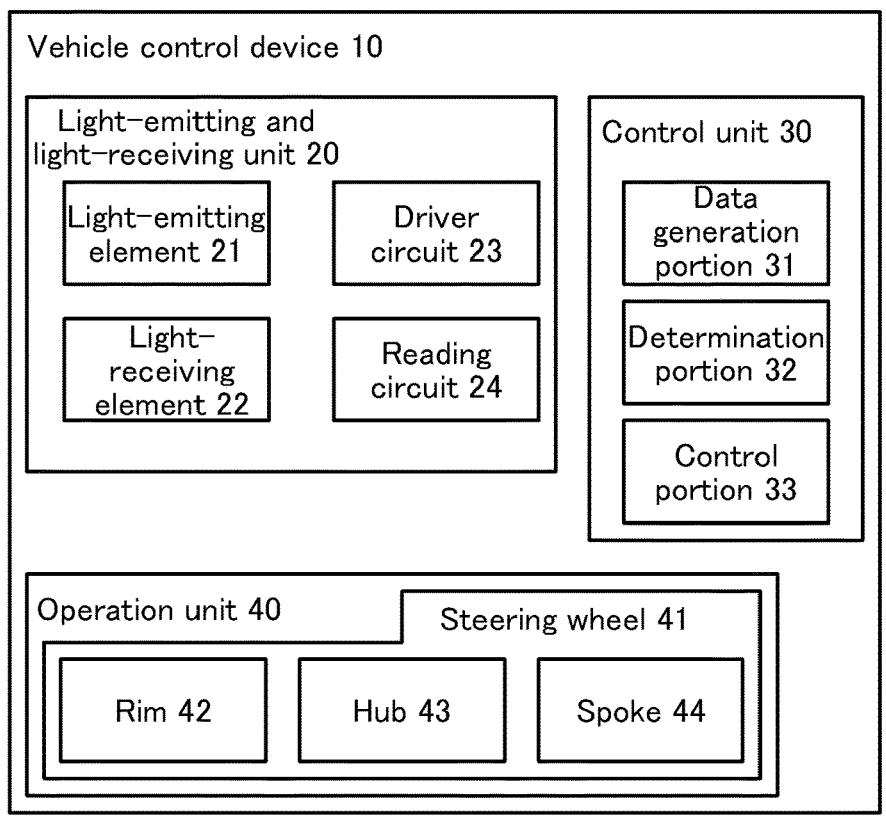
FIG. 1B
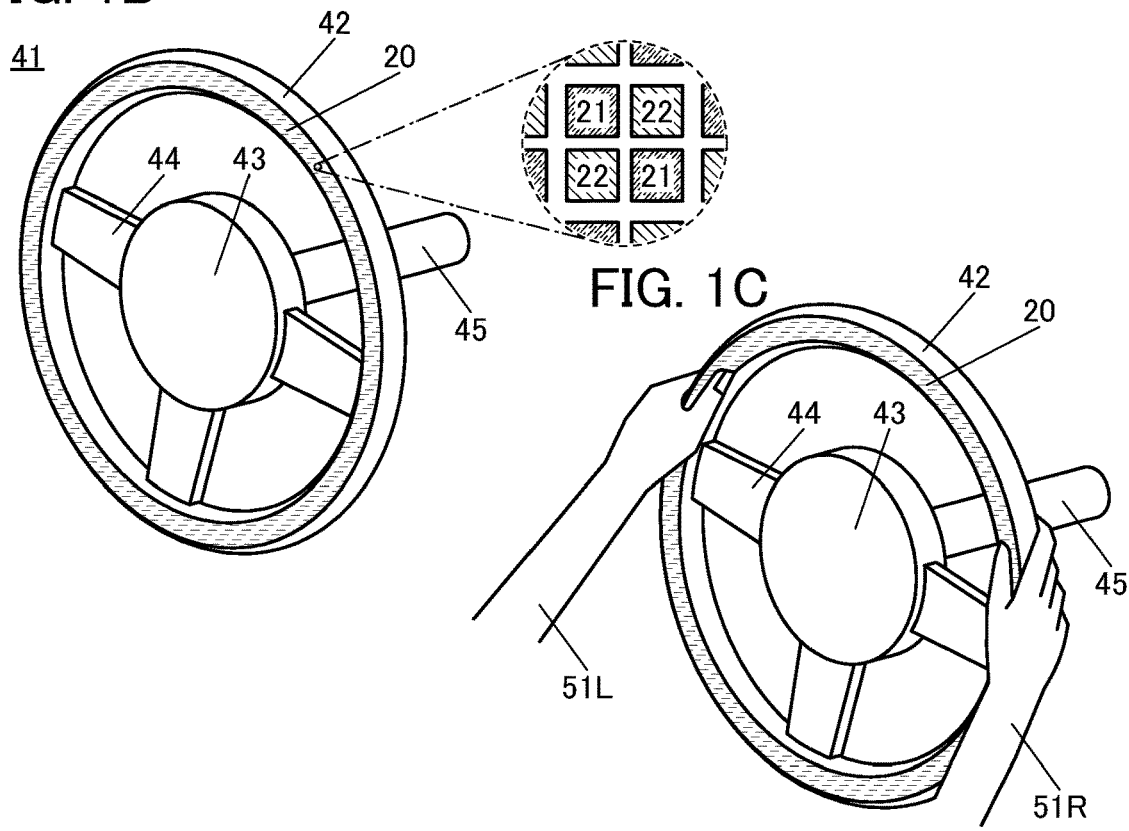
FIG. 1C

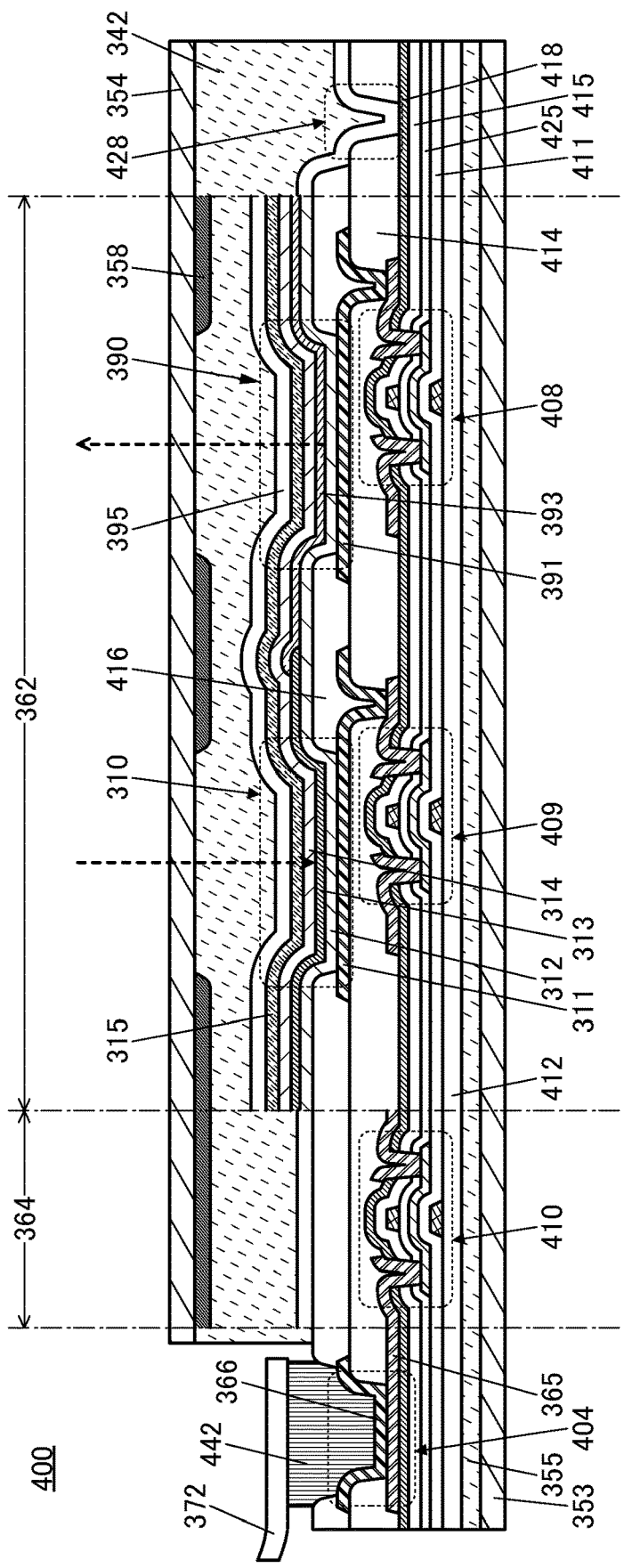
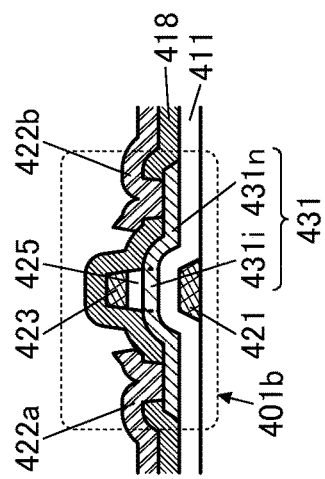
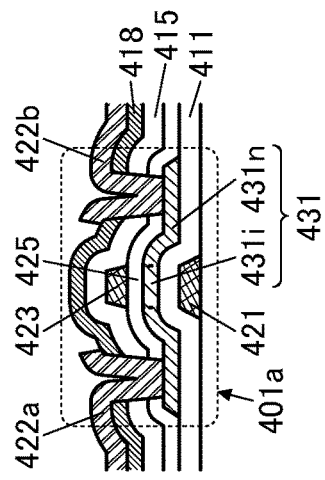
FIG. 17A
FIG. 17B
FIG. 17C

VEHICLE CONTROL DEVICE

CROSS REFERENCE TO RELATED APPLICATIONS

This application is a U.S. National Phase Application under 35 U.S.C. § 371 of International Application PCT/IB2021/054736, filed on May 31, 2021, which is incorporated by reference and claims the benefit of a foreign priority application filed in Japan on Jun. 12, 2020, as Application No. 2020-102400.

TECHNICAL FIELD

One embodiment of the present invention relates to a control device for a moving object such as a vehicle. One embodiment of the present invention relates to a light-emitting and light-receiving apparatus. One embodiment of the present invention relates to a biosensor. One embodiment of the present invention relates to a biometric authentication technique.

Note that one embodiment of the present invention is not limited to the above technical field. Examples of the technical field of one embodiment of the present invention disclosed in this specification and the like include a semiconductor device, a display apparatus, a light-emitting device, a power storage device, a memory device, an electronic device, a lighting device, an input device, an input/output device, a driving method thereof, and a manufacturing method thereof. A semiconductor device generally means a device that can function by utilizing semiconductor characteristics.

BACKGROUND ART

An accident derived from drowsiness is one of the most common accidents that a driver causes during driving a vehicle; thus, a variety of methods of monitoring the driver's wakefulness have been studied. For example, Patent Document 1 discloses a technique of determining the degree of the driver's activity from the acceleration of a vehicle and the heart rate of the driver.

REFERENCE

Patent Document

[Patent Document 1] Japanese Published Patent Application No. 2005-312653

SUMMARY OF THE INVENTION

Problems to be Solved by the Invention

An object of one embodiment of the present invention is to provide a highly safe vehicle control device. An object of one embodiment of the present invention is to provide a highly convenient vehicle control device. An object of one embodiment of the present invention is to monitor the driver's state with the driver being unconscious. An object of one embodiment of the present invention is to provide a vehicle control device, a vehicle control method, or the like that has a novel structure.

An object of one embodiment of the present invention is to provide a novel electronic device, moving object, vehicle, device, system, program, or method that uses biological information. An object of one embodiment of the present invention is to provide an electronic device, a moving object, a vehicle, a device, a system, a program, or a method that has a novel structure. An object of one embodiment of the present invention is to at least reduce at least one of problems of the conventional technique.

Note that the description of these objects does not preclude the existence of other objects. One embodiment of the present invention does not have to achieve all these objects. Objects other than these can be derived from the description of the specification, the drawings, the claims, and the like.

Means for Solving the Problems

One embodiment of the present invention is a vehicle control device including an operation unit, a first light-emitting and light-receiving unit, and a control unit. The operation unit includes a steering wheel including a rim, a hub, and a spoke. The rim is connected to the hub through the spoke. The first light-emitting and light-receiving unit is provided along a surface of the rim. The first light-emitting and light-receiving unit includes a first light-emitting element and a first light-receiving element. The first light-emitting element has a function of emitting light with a first wavelength range. The first light-receiving element has a function of receiving the light with the first wavelength range and converting it into an electrical signal. The first light-emitting element and the first light-receiving element are arranged on the same plane. The first light-emitting and light-receiving unit has a function of sequentially outputting received-light data to the control unit. The control unit has a function of obtaining biological information of a driver from a plurality of received-light data and executing processing corresponding to the biological information.

In the above, it is preferable that the biological information be one or more of a pulse wave, a heart rate, a pulse, and artery blood oxygen saturation.

In the above, it is preferable that the biological information be a vein, a fingerprint, or a palm print.

In any of the above, it is preferable that a second light-emitting and light-receiving unit be further included. In this case, the second light-emitting and light-receiving unit is provided along a surface of the hub or the spoke. The second light-emitting and light-receiving unit includes a second light-emitting element and a second light-receiving element. It is preferable that the second light-emitting element have a function of emitting light with a second wavelength range, and the second light-receiving element have a function of receiving the light with the second wavelength range and converting it into an electric signal.

In any of the above, the light with the first wavelength range preferably includes infrared light. The light with the second wavelength range preferably include infrared light.

In any of the above, it is preferable that the first light-emitting and light-receiving unit further include a third light-emitting element. In this case, the third light-emitting element preferably has a function of emitting light with a third wavelength range including visible light.

In any of the above, it is preferable that the second light-emitting and light-receiving unit further include a fourth light-emitting element. In this case, it is preferable that the fourth light-emitting element have a function of emitting light with a fourth wavelength range including visible light.

In any of the above, the first light-emitting element preferably has a stacked-layer structure in which a first electrode, a light-emitting layer, and a common electrode are stacked. Furthermore, the first light-receiving element preferably has a stacked-layer structure in which a second electrode, an active layer, and the common electrode are stacked. In that case, the light-emitting layer and the active layer preferably contain different organic compounds. It is preferable that the first electrode and the second electrode be provided to be apart from each other on the same plane. Furthermore, it is preferable that the common electrode be provided to cover the light-emitting layer and the active layer.

Alternatively, in any of the above, the first light-emitting element preferably has a stacked-layer structure in which a first electrode, a common layer, a light-emitting layer, and a common electrode are stacked. Furthermore, the first light-receiving element preferably has a stacked-layer structure in which a second electrode, the common layer, an active layer, and the common electrode are stacked. In this case, the light-emitting layer and the active layer preferably contain different organic compounds. It is preferable that the first electrode and the second electrode be provided to be apart from each other on the same plane. Furthermore, it is preferable that the common electrode be provided to cover the light-emitting layer and the active layer, and the common layer be provided to cover the first electrode and the second electrode.

Effect of the Invention

According to one embodiment of the present invention, a highly safe vehicle control device can be provided. Alternatively, a highly convenient vehicle control device can be provided. Alternatively, the driver's state can be monitored with the driver being unconscious. Alternatively, a vehicle control device, a vehicle control method, or the like that has a novel structure can be provided.

According to one embodiment of the present invention, a novel electronic device, moving object, vehicle, device, system, program, or method that uses biological information can be provided. Alternatively, an electronic device, a moving object, a vehicle, a device, a system, a program, or a method that has a novel structure can be provided. Alternatively, at least one of problems of the conventional technique can be at least reduced.

Note that the description of the effects does not preclude the existence of other effects. One embodiment of the present invention does not have to have all these effects. Effects other than these can be derived from the description of the specification, the drawings, the claims, and the like.

BRIEF DESCRIPTION OF THE DRAWINGS

FIG. 1A to FIG. 1C are diagrams illustrating a structure example of a vehicle control device.

FIG. 17A is a diagram illustrating a structure example of a display apparatus. FIG. 17B and FIG. 17C are diagrams illustrating structure examples of transistors.

MODE FOR CARRYING OUT THE INVENTION

Figure 2A:
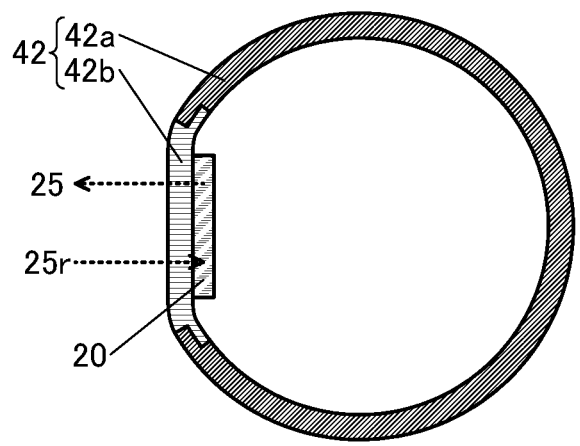
FIG. 2A and FIG. 2B are diagrams illustrating structure examples of a vehicle control device.

Hereinafter, embodiments will be described with reference to the drawings. Note that the embodiments can be implemented in many different modes, and it is readily understood by those skilled in the art that modes and details thereof can be changed in various ways without departing from the spirit and scope thereof. Thus, the present invention should not be construed as being limited to the following description of the embodiments.

Note that in structures of the invention described below, the same portions or portions having similar functions are denoted by the same reference numerals in different drawings, and the description thereof is not repeated. Furthermore, the same hatch pattern is used for the portions having similar functions, and the portions are not especially denoted by reference numerals in some cases.

Note that in each drawing described in this specification, the size, the layer thickness, or the region of each component is exaggerated for clarity in some cases. Therefore, they are not limited to the illustrated scale.

Note that in this specification and the like, the ordinal numbers such as "first" and "second" are used in order to avoid confusion among components and do not limit the number.

Embodiment 1

In this embodiment, a vehicle control device of one embodiment of the present invention will be described.

Structure Example 1

FIG. 1A is a block diagram of a vehicle control device 10 exemplified below. The vehicle control device 10 includes a light-emitting and light-receiving unit 20, a control unit 30, an operation unit 40, and the like.

The light-emitting and light-receiving unit 20 has a function of obtaining received-light data including biological information of a driver and a function of outputting the received-light data to the control unit 30. The control unit 30 has a function of generating (obtaining) data including the biological information of the driver (such data is also referred to as biological data) on the basis of the received-light data provided from the light-emitting and light-receiving unit 20 and a function of executing various types of processing on the basis of the biological data. The operation unit 40 corresponds to an operation means with which the driver can operate a vehicle. In the operation unit 40, a light-emitting and light-receiving region of the light-emitting and light-receiving unit 20 is provided along a portion that the driver holds, a portion that the driver touches, or the like.

The light-emitting and light-receiving unit 20 has a function of irradiating part of the driver's body, for example, with light and obtaining the reflected light as the received-light data. The light-emitting and light-receiving unit 20 can obtain biological data, such as a fingerprint and a palm print, by capturing an image of part of skin. With the use of the biological data for authentication, a key (including a smart key) for starting a vehicle is unnecessary; thus, a vehicle in which the engine (or power supply) can be started without a key can be achieved.

Here, the reflectance of light for human skin changes periodically due to bloodstream; thus, data on a pulse wave can be obtained from a time-dependent change in received-light luminance that is obtained by repeatedly receiving light with the light-emitting and light-receiving unit 20. A variety of vital data can be obtained from the pulse wave. For example, a heart rate can be obtained from the period of the pulse wave. Furthermore, with two kinds of received-light data obtained using light having different wavelengths (e.g., infrared light and red light), artery blood oxygen saturation ($SpO_2$) can be measured. In addition, using a high-accuracy pulse wave obtained with high sampling frequency, stress level, blood vessel age, or the like can be obtained. Moreover, the degree of progress of arteriosclerosis can be estimated, or blood pressure can be estimated from an electrocardiogram measured separately and the pulse wave, for example.

The biological data that can be used in the control unit 30 is roughly classified into vital data and biometric authentication data (biometrics data). The vital data relates to vital information derived from vital activity of a person, and includes data on a pulse wave, a heart rate, a pulse, artery blood oxygen saturation, blood pressure, or the like. On the other hand, the biometrics data, which is derived from a physical feature of a person, can be used for individual authentication (biometric authentication), and includes data on a fingerprint, a palm print, the shape of a pulse (including the shapes of a vein and an artery), an iris, a voiceprint, or the like. In addition, data derived from a behavioral feature of a person (e.g., the position of a steering wheel that the person holds) can also be included in the biometrics data.

As light with which the driver's body is irradiated in the light-emitting and light-receiving unit 20, visible light, infrared light, or ultraviolet light can be used. The light preferably includes infrared light, further preferably includes near infrared light. Since such light is not recognized by the driver, image capturing can be constantly performed without hindering the driver's driving, which is preferable.

As illustrated in FIG. 1A, the light-emitting and light-receiving unit 20 includes a light-emitting element 21, a light-receiving element 22, a driver circuit 23, and a reading circuit 24. The control unit 30 includes a data generation portion 31, a determination portion 32, a processing portion 33, and the like. The operation unit 40 includes at least a steering wheel 41. The steering wheel 41 includes a rim 42, a hub 43, and spokes 44.

In the light-emitting and light-receiving unit 20, the light-emitting element 21 and the light-receiving element 22 are preferably arranged on the same plane. The light-receiving element 22 functions as a photoelectric conversion element that receives incident light and converts it into an electric signal. The light-receiving element 22 has sensitivity to at least part of light emitted from the light-emitting element 21. In particular, it is preferable that the light-emitting element 21 emit light with a wavelength range including infrared light and the light-receiving element 22 have sensitivity to light with a wavelength range including infrared light.

Light emitted from the light-emitting element 21 preferably includes infrared light, further preferably includes near-infrared light. In particular, near-infrared light having one or more peaks in the range of a wavelength greater than or equal to 700 nm and less than or equal to 2500 nm can be favorably used. In particular, the use of light having one or more peaks in the range of a wavelength greater than or equal to 750 nm and less than or equal to 1000 nm is preferable because it permits an extensive choice of a material used for an active layer of the light-receiving element 22.

In particular, the light-emitting and light-receiving unit 20 is preferably provided with a plurality of light-emitting elements 21 and a plurality of light-receiving elements 22. In that case, the light-emitting elements 21 and the light-receiving elements 22 are preferably arranged on the same plane. Furthermore, it is preferable that the light-emitting elements 21 and the light-receiving elements 22 be alternately arranged in one direction or in a matrix.

As the light-emitting element 21, an EL element such as an OLED (Organic Light Emitting Diode) or a QLED (Quantum-dot Light Emitting Diode) is preferably used. Examples of a light-emitting substance included in the EL element include a substance emitting fluorescent light (a fluorescent material), a substance emitting phosphorescent light (a phosphorescent material), a substance exhibiting thermally activated delayed fluorescence (a thermally activated delayed fluorescent (TADF) material), and an inorganic compound (e.g., a quantum dot material).

As the light-receiving element 22, a pn photodiode or a pin photodiode can be used, for example. The light-receiving element functions as a photoelectric conversion element that detects light incident on the light-receiving element and generates charge. The amount of generated charge in the photoelectric conversion element is determined depending on the amount of incident light. It is particularly preferable to use an organic photodiode including a layer containing an organic compound as the light-receiving element. An organic photodiode, which is easily made thin, lightweight, and large in area and has a high degree of freedom for shape and design, can be used in a variety of devices.

An organic compound is preferably used for the active layer of the light-receiving element 22. In that case, one electrode of the light-emitting element 21 and one electrode of the light-receiving element 22 (the electrodes are also referred to as pixel electrodes) are preferably provided on the same plane. It is further preferable that the other electrode of the light-emitting element 21 and the other electrode of the light-receiving element 22 be an electrode (also referred to as a common electrode) formed using one continuous conductive layer. It is still further preferable that the light-emitting element 21 and the light-receiving element 22 include a common layer. Thus, the manufacturing process of the light-emitting element 21 and the light-receiving element 22 can be simplified, so that the manufacturing cost can be reduced and the manufacturing yield can be increased.

The driver circuit 23 includes a circuit controlling light emission of the light-emitting element 21 and a circuit controlling light reception of the light-receiving element 22. For example, in the case where the light-emitting and light-receiving unit 20 has a structure in which a plurality of pixels each including the light-emitting element 21 and the light-receiving element 22 are arranged in a matrix, the driver circuit 23 includes a pixel circuit included in the pixel, a scan line driver circuit, a signal line driver circuit, and the like.

The reading circuit 24 has a function of generating received-light data on the basis of the electric signal output from the light-receiving element 22 and outputting the data to the control unit 30. For example, the reading circuit 24 includes an amplifier circuit and an AD converter circuit. The received-light data output from the reading circuit 24 to the control unit 30 is preferably digital data.

Light emitted from the light-emitting element 21 is reflected by an object touching or approaching a light-emitting and light-receiving surface of the light-emitting and light-receiving unit 20 and enters the light-receiving element 22. The light-receiving element 22 outputs an electric signal corresponding to the amount of incident light. Accordingly, the touch or approach of the object can be detected.

The data generation portion 31 has a function of generating biological data to be output to the determination portion 32 from the received-light data input by the light-emitting and light-receiving unit 20.

Examples of the vital data that is one of biological data include data on a pulse wave, a heart rate, or the like generated from time-varying data including data obtained by sampling in a certain period, and a variety of data calculated from the pulse wave. The image capturing data on a fingerprint, a palm print, a vein, or the like generated by a still image or the like can be used as biometrics data and is included in biological data.

The determination portion 32 has a function of determining whether the processing portion 33 executes processing or not on the basis of the biological data supplied from the data generation portion 31. In addition, the determination portion 32 has a function of selecting the processing that the processing portion 33 executes on the basis of the biological data.

A variety of vital data or biometrics data can be obtained regularly and constantly by the light-emitting and light-receiving unit 20 and the data generation portion 31; thus, the determination portion 32 can use the vital data or biometrics data for individual authentication, management of a driver's condition, or the like.

Examples of the biological data that can be obtained using visible light and infrared rays include a fingerprint, a palm print, the shape of a vein, a pulse wave, a respiration rate, a pulse, oxygen saturation, blood sugar level, and neutral fat concentration. Examples of the biological data that can be obtained with a different means include facial expression, complexion, a pupil, and a voiceprint. It is preferable to use such a variety of biological data to comprehensively determine the user's health conditions.

Whether a plurality of pieces of measured biological data each have a normal value or an abnormal value is determined, and on the basis of a plurality of determination results, the processing can be determined. Alternatively, the conditions of the driver may be determined from the plurality of pieces of measured biological data (e.g., it is determined that the value of a pulse is high, low, or normal), and on the basis of a plurality of determination results, the processing may be determined. These methods have an advantage of a clear basis for the obtained determination results.

Feature values may be extracted from all the pieces of measured biological data, and the processing may be determined from the feature values. According to such a method, it is easy to perform the determination on the basis of not only each piece of the biological data but also a correlation relationship between the plurality of pieces of the biological data.

As a classifier or an identifier for determining the processing from a variety of biological data, a machine learning model that has learned by machine learning is preferably used. The machine learning is roughly classified into supervised machine learning, unsupervised machine learning, outlier detection, and the like.

Examples of the supervised machine learning include k-nearest neighbor, a Naive Bayes classifier, a decision tree, a support vector machine, a random forest, and a neural network. The neural network is especially suitable for a method for extracting feature values from a plurality of pieces of data because learning during the extraction of feature values is possible in the neural network.

Examples of a method for extracting feature values used in the unsupervised machine learning include principal component analysis (PCA) and non-negative matrix factorization (NMF). Examples of the classifier include k-means clustering and DBSCAN.

A combination of a supervised machine learning model and an unsupervised machine learning model may be used for determination of the obtained plurality of pieces of biological data. In that case, as classification labels classified by the unsupervised machine learning model, labels used in another supervised machine learning model may be used.

In the outlier detection, whether the obtained biological data or feature values obtained from one or more pieces of biological data deviate from the normal area is detected. When the outlier is detected, it is highly probable that the conditions of the driver deviate from the normal conditions.

Examples of a model for detecting the outlier include k-nearest neighbor, Local Outlier Factor, One class SVM, and Mahalanobis' Distance. The use of multidimensional data combining information is effective for the outlier detection. The execution of the outlier detection on the basis of a plurality of pieces of information can prevent incorrect detection. In the case where biological data is information that changes over time depending on the state of the user (e.g., a pulse or a respiration rate) or the like, a neighbor method using a sliding window, a dynamic time warping (DTW) method, a singular spectrum transformation method, or the like may be used. In the case of periodically changing biological information, deviation from a prediction model may be detected using LSTM (Long Short Term Memory) or the like.

The determination portion 32 may have a function of comparing information on a fingerprint, a palm print, or the shape of a blood vessel that is input from the data generation portion 31, with information on a fingerprint, a palm print, or the shape of a blood vessel of the driver that is stored in advance, and executing the processing (authentication processing) of determining whether these pieces of information match or not. Examples of the authentication method executed by the determination portion 32 include a method using the degree of similarity between two images compared, e.g., a template matching method or a pattern matching method. Alternatively, fingerprint authentication processing may be executed by inference using machine learning. At this time, the authentication processing is preferably executed by inference using a neural network, in particular.

The processing portion 33 has a function of executing various types of processing in accordance with the result of the determination portion 32.

For example, when a driver is authenticated by the determination portion 32 on the basis of biological information on a fingerprint, a palm print, a vein, or the like of the driver, the processing portion 33 can transfer the vehicle to a state where the vehicle can be driven (also referred to as an idling state). In addition, in the case where the driver is authenticated by the determination portion 32, the processing portion 33 may execute the processing of setting the environment in the vehicle to an environment of the driver's preference. For example, one or more of adjustment of the position of the seat, adjustment of the position of a handle, adjustment of the position of the side view mirror and the rearview mirror, setting of brightness, setting of an air conditioner, setting of the speed and frequency of wipers, volume setting of audio, and reading of the playlist of the audio are preferably performed by the processing portion 33 after authentication.

In the case where the determination portion 32 determines the wakefulness level of the driver, the processing portion 33 performs processing in accordance with the wakefulness level. For example, luminance in the vehicle is changed or sound is reproduced such that the wakefulness of the driver is promoted. Furthermore, in the case where it is determined that the driver is incapable of driving, for example, the driving mode of the vehicle is changed to an emergency autonomous driving mode, a hazard lamp is turned on, the vehicle is transferred to a road shoulder, the police, a rescue squad, or an insurance company is called, or other processing can be performed.

The determination portion 32 may further have a function of determining from the biological data, for example, whether the driver had taken alcohol or not, or whether the driver has had a heart attack or the like or not.

The determination portion 32 may further have a function of constantly monitoring whether the driver holds the steering wheel 41 or not. Depending on the kind of autonomous driving, the steering wheel 41 needs to be constantly held; thus, when the determination portion 32 determines that the driver does not hold the steering wheel 41, for example, the processing portion 33 may execute the processing for warning the driver to hold the steering wheel 41.

The rim 42 included in the steering wheel 41 functions as a grip portion that the driver holds, and has a circular shape. The hub 43 is connected to an axis (a shaft) extended from the vehicle and positioned at the center of the steering wheel 41. The spokes 44 are portions to connect the rim 42 to the hub 43. Although the number of spokes 44 may be one, two or more spokes 44 are preferably included because the intense of the steering wheel 41 increases. For example, a plurality of (typically two to four) spokes 44 are preferably provided in a radial manner with the hub 43 at the center.

An operation switch or an operation panel (touch panel) may be provided on the hub 43 and the spoke 44.

The operation unit 40 may include, in addition to the steering wheel 41, an operation lever such as a column shift or a paddle shift, an operation lever for a winker or a wiper, and the like.

Here, at least part of the light-emitting and light-receiving unit 20 is provided along a surface of the rim 42 of the steering wheel 41. Therefore, when the driver holds the rim 42, received-light data on part of the driver's palm can be obtained.

Structure Example 1-1

FIG. 1B is a perspective view illustrating an example of the steering wheel 41 provided with the light-emitting and light-receiving unit 20. FIG. 1B illustrates part of a shaft 45 connected to the hub 43.

The light-emitting and light-receiving unit 20 is provided along the surface of the rim 42 having a circular shape. The rim 42 is processed such that a surface positioned on the front side when seen from the driver is flat, and the light-emitting and light-receiving unit 20 is provided along the flat surface.

An enlarged view of part of the light-emitting and light-receiving unit 20 is illustrated on the right side in FIG. 1B. The light-emitting elements 21 and the light-receiving elements 22 are alternately arranged in a matrix in the light-emitting and light-receiving unit 20. Note that the arrangement method of the light-emitting element 21 and the light-receiving element 22 is not limited thereto, and a variety of arrangement methods can be employed.

FIG. 1C illustrates a state where a driver holds the rim 42 with his/her left hand 51L and right hand 51R. At this time, the light-emitting element 21 emits light and the light-receiving element 22 receives the light, whereby an image of part of the palms of the driver's left hand 51L and right hand 51R can be captured. Since the light-emitting and light-receiving unit 20 has a circular top surface like the surface of the rim 42, image capturing can be constantly performed when the left hand 51L and the right hand 51R hold any position of the rim 42.

The light-emitting and light-receiving unit 20 is provided on a surface of the rim 42 on the driver's side, and thus the light-emitting and light-receiving unit 20 is positioned in the view of the driver. At this time, the use of a light-emitting element that emits infrared light as the light-emitting element 21 enables image capturing while the driver does not feel glare.

Note that the light-emitting element 21 may be a light-emitting element that emits visible light, in which case it is important that the emission luminance during image capturing is reduced to a level at which the driver does not feel glare. For example, it is preferable to reduce the emission luminance of the light-emitting element 21 at night compared with the daytime.

FIG. 2A is an example of a schematic cross-sectional view of the rim 42.

The rim 42 includes a member 42a and a member 42b. The member 42b has a light-transmitting property. The light-emitting and light-receiving unit 20 is positioned on the inner side of the rim 42 and provided along part of the member 42b. The light-emitting and light-receiving unit 20 can emit light 25 through the light-transmitting member 42b. Reflected light 25r reflected by an object enters the light-emitting and light-receiving unit 20 through the member 42b.

Here, in FIG. 2A, part of a surface of the member 42b (a surface that is touched by a hand) is flat. Thus, an image capturing surface can be flat, so that an image with little distortion can be captured when an image of a fingerprint, a palm print, the shape of a blood vessel, or the like, which is used in authentication, is captured.

Figure 2B:
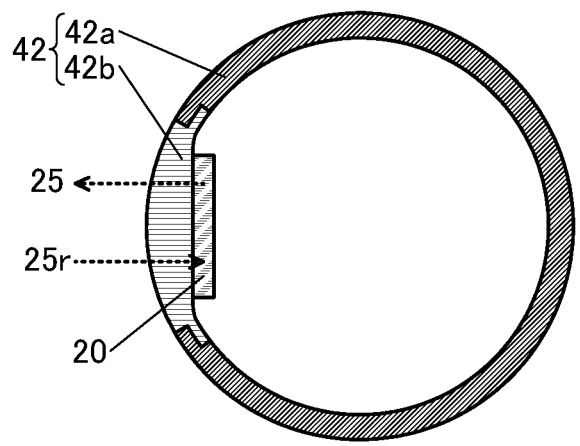

As illustrated in FIG. 2B, the surface may have a curved surface. Therefore, the cross section of the rim 42 can be circular, and thus the driver can easily hold the steering while without a sense of strangeness compared with the case where the rim has the flat surface. Part of the member 42b can function as a lens.

As illustrated in FIG. 2A and FIG. 2B, the light-emitting and light-receiving unit 20 is preferably attached to a flat surface. Thus, the light-emitting and light-receiving unit 20 does not need to be flexible, leading to a reduced manufacturing cost.

Structure Example 1-2

Figure 3A:
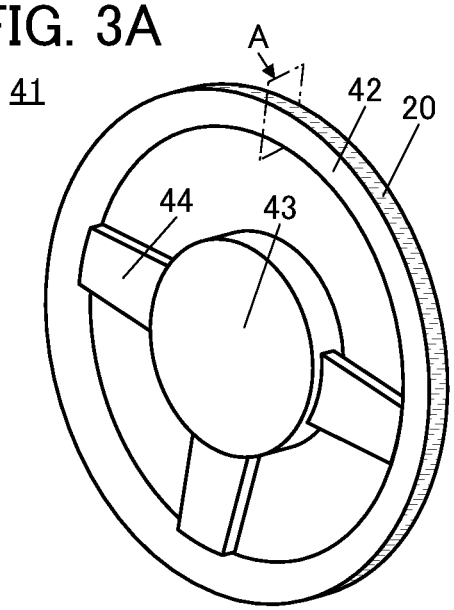
FIG. 3A to FIG. 3D are diagrams illustrating structure examples of a vehicle control device.

The steering wheel 41 illustrated in FIG. 3A is an example in which the light-emitting and light-receiving unit 20 is provided along the periphery of the rim 42.

Figure 3B:
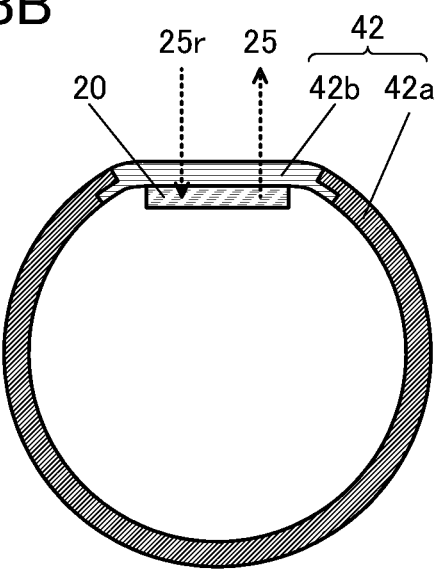

FIG. 3B is a schematic cross-sectional view of the rim 42 at a cutting plane A illustrated in FIG. 3A. FIG. 3B is substantially the same as a diagram obtained by rotating FIG. 2A clockwise by 90°.

In the structure illustrated in FIG. 3A, the light-emitting and light-receiving unit 20 having a stripe shape is attached along the member 42b. The light-emitting and light-receiving unit 20 needs to be attached to a curved surface, and thus is preferably flexible. For example, an organic resin is preferably used for a base supporting the light-emitting element 21 and the light-receiving element 22 in the light-emitting and light-receiving unit 20. Alternatively, glass or the like that is thin enough to have flexibility may be used for the base.

Structure Example 1-3

Figure 3C:
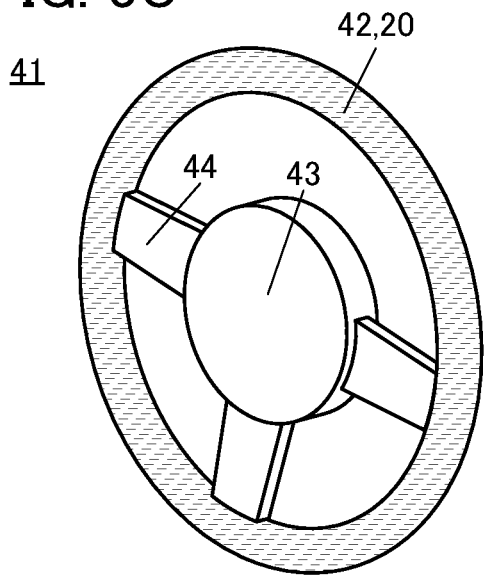

FIG. 3C illustrates an example of the steering wheel 41 in which the light-emitting and light-receiving unit 20 is provided on a large part of the surface of the rim 42.

Figure 3D:
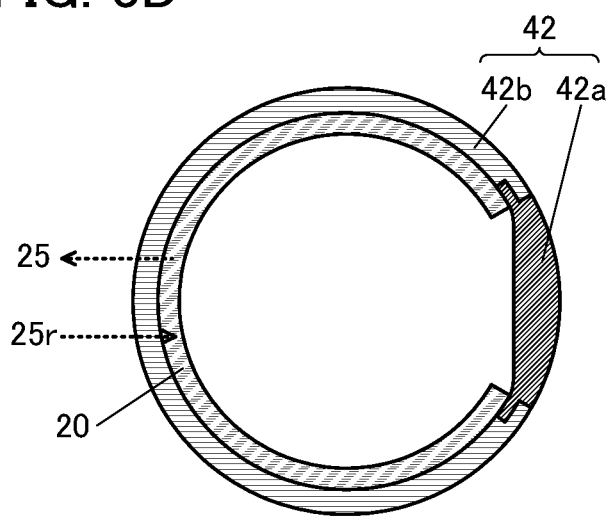

FIG. 3D is a schematic cross-sectional view of the rim 42. The rim 42 includes the member 42a and the member 42b. The member 42a is positioned on the back surface side of the rim 42 (on the side opposite to the driver side). The light-emitting and light-receiving unit 20 is provided along an inner surface of the member 42b. The inner surface of the member 42b is a curved surface that is not a developable surface (three-dimensional curved surface), and the light-emitting and light-receiving surface of the light-emitting and light-receiving unit 20 also forms a three-dimensional curved surface. Therefore, in the case where the light-emitting and light-receiving unit 20 is attached to the inner surface of the member 42a, the light-emitting and light-receiving unit 20 is preferably stretchable. For example, in the light-emitting and light-receiving unit 20, an elastic body such as rubber is preferably used for the base supporting the light-emitting element 21 and the light-receiving element 22.

With the structure illustrated in FIG. 3C, the area capable of being subjected to image capturing can be increased. For example, in the case where a pulse wave is estimated from a time-dependent change in the reflectance of skin, a higher sensitivity is preferable to increase the accuracy. An image of a fingerprint, a palm print, the shape of a blood vessel, or the like, which is used in authentication, can be captured in a large area, and thus the authentication accuracy can be increased.

Structure Example 2

A structure including a plurality of light-emitting and light-receiving units is described below.

Structure Example 2-1

Figure 4A:
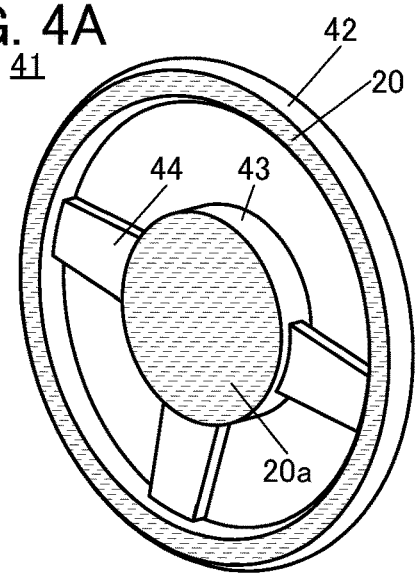
FIG. 4A to FIG. 4D are diagrams illustrating structure examples of a vehicle control device.

FIG. 4A illustrates an example in which a light-emitting and light-receiving unit 20a is provided along a surface of the hub 43 on the driver's side.

The light-emitting and light-receiving unit 20a has a structure similar to the light-emitting and light-receiving unit 20, in which light-emitting elements and light-receiving elements are arranged. The light-receiving element is a photoelectric conversion element having sensitivity to light in a wavelength range that is emitted from the light-emitting element. The wavelength of light emitted from the light-emitting element in the light-emitting and light-receiving unit 20 may be different from or the same as that in the light-emitting and light-receiving unit 20a.

Figure 4B:
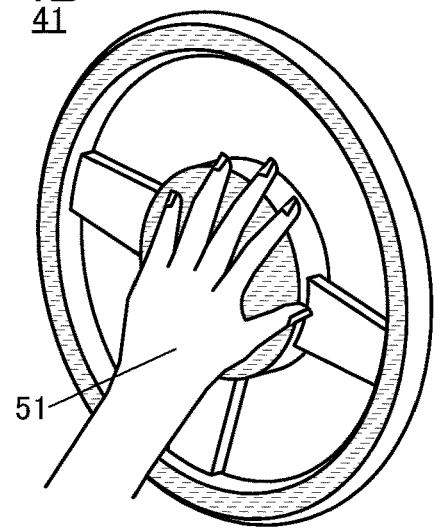

For example, with the use of the light-emitting and light-receiving unit 20a, biological information such as a fingerprint or a palm print can be obtained and authentication can be performed. FIG. 4B illustrates a state where a hand 51 is held over the light-emitting and light-receiving unit 20a.

The light-emitting and light-receiving unit is provided in each of the rim 42 and the hub 43, so that information obtained in the light-emitting and light-receiving unit 20 provided in the rim 42 and information obtained in the light-emitting and light-receiving unit 20a provided in the hub 43 may be different from each other. For example, the light-emitting and light-receiving unit 20a obtains an image for authentication as information, and the light-emitting and light-receiving unit 20 obtains a time-dependent change in the reflectance of skin as information. In this case, the light-emitting and light-receiving unit 20a need capture a high-resolution image, and thus the light-receiving elements 22 are arranged with high density. On the other hand, the light-emitting and light-receiving unit 20 does not need to capture a high-resolution image, and thus the light-receiving elements 22 are arranged with lower density than in the light-emitting and light-receiving unit 20a. In this manner, the structure of the light-emitting and light-receiving unit can be varied in accordance with information to be obtained.

The light-emitting and light-receiving unit 20a provided in the hub 43 may have a function of displaying an image and a function of detecting touch operation or gesture operation. For example, the light-emitting and light-receiving unit 20a may function as a touch panel. Thus, a variety of information can be displayed on the light-emitting and light-receiving unit 20a. For example, the light-emitting and light-receiving unit 20a can also be used as a display portion of a navigation system.

Structure Example 2-2

Figure 4C:
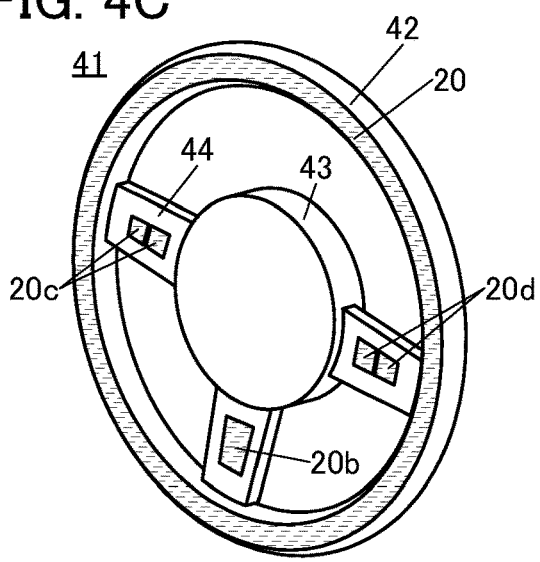

FIG. 4C illustrates an example in which the light-emitting and light-receiving units are provided along surfaces of the spokes 44.

In FIG. 4C, of the three spokes 44, the spoke 44 positioned on the lower side is provided with a light-emitting and light-receiving unit 20b; the spoke 44 positioned on the left side is provided with a plurality of light-emitting and light-receiving units 20c; and the spoke 44 positioned on the right side is provided with a plurality of light-emitting and light-receiving units 20d. Note that the number of the spokes 44 and the number of the light-emitting and light-receiving units are not limited thereto, and can be changed as appropriate depending on the purpose.

Each of the light-emitting and light-receiving unit 20b, the light-emitting and light-receiving unit 20c, and the light-emitting and light-receiving unit 20d has a structure similar to that of the light-emitting and light-receiving unit 20, in which the light-emitting elements and the light-receiving elements are arranged.

Figure 4D:
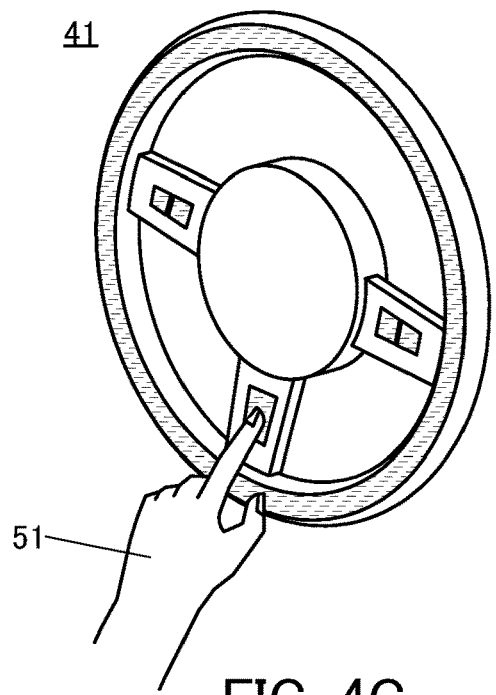

For example, with the light-emitting and light-receiving unit 20b, information on a fingerprint of a driver is obtained, and authentication can be performed using the information. FIG. 4D illustrates a state where a finger of the hand 51 is held over the light-emitting and light-receiving unit 20b.

The light-emitting and light-receiving unit 20c and the light-emitting and light-receiving unit 20d preferably function as touch sensors. Touching the light-emitting and light-receiving unit 20c, the light-emitting and light-receiving unit 20d, and the like, the driver can operate a navigation system, an audio system, a call system, and the like included in the vehicle. In addition, it is possible to employ a structure capable of a variety of operations such as adjustment of a rearview mirror, adjustment of a sideview mirror, turning on or off of an interior light, adjustment of luminance, and opening or closing a window.

The light-emitting and light-receiving unit 20b, the light-emitting and light-receiving unit 20c, and the light-emitting and light-receiving unit 20d preferably include light-emitting elements that emit visible light. Alternatively, both light-emitting elements that emit visible light and light-emitting elements that emit infrared light may be provided. Accordingly, the position of the light-emitting and light-receiving unit can be shown to the driver even at night. Alternatively, an uneven portion for showing the position of the light-emitting and light-receiving unit may be provided on the surface of the light-emitting and light-receiving unit 20b, the light-emitting and light-receiving unit 20c, and the light-emitting and light-receiving unit 20d or the vicinity thereof.

Note that although in the structure example 2-1 and the structure example 2-2 above, the light-emitting and light-receiving unit 20 provided in the rim 42 has the same structure as FIG. 1B and the like, the structure is not limited thereto, and the structure illustrated in FIG. 3A or FIG. 3B can be employed.

Although the cases where the light-emitting and light-receiving unit 20 provided in the rim 42 is provided in the circumferential direction of the rim 42 are described above, the light-emitting and light-receiving unit 20 does not necessarily have a continuous circular shape and may have an arc-like top surface along the surface of the rim 42. That is, in the circumferential direction of the rim 42, part where the light-emitting and light-receiving unit 20 is not provided may exist. A plurality of light-emitting and light-receiving units 20 may be provided along the surface of the rim 42. In that case, a plurality of light-emitting and light-receiving units 20 may be arranged so that two adjacent light-emitting and light-receiving units 20 overlap with each other, whereby the light-emitting and light-receiving region is continuous in the circumferential direction of the rim 42.

[Structure Example of Light-Emitting and Light-Receiving Unit]

A structure example of a light-emitting and light-receiving unit including two or more kinds of light-emitting elements is described below. In the light-emitting and light-receiving unit exemplified below, the light-emitting elements can be used not only as a light source for image capturing but also for displaying an image. That is, the light-emitting and light-receiving unit exemplified below also functions as a display portion. Such light-emitting and light-receiving unit can be used as the light-emitting and light-receiving unit 20, the light-emitting and light-receiving units 20a to 20d, or the like.

Figure 4E:
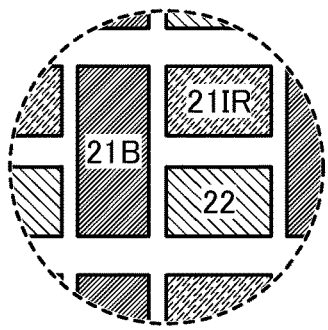
FIG. 4E to FIG. 4G are diagrams illustrating structure examples of a pixel of a light-emitting and light-receiving unit.
Figure 4F:
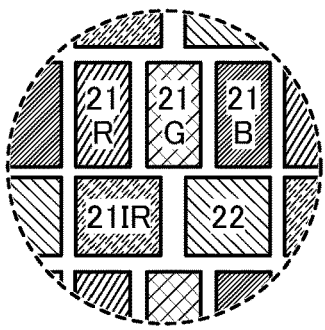
Figure 4G:
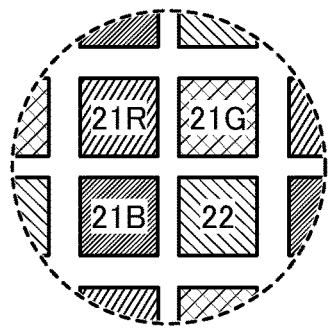

FIG. 4E to FIG. 4G illustrate an enlarged view of the light-emitting and light-receiving unit.

The light-emitting and light-receiving unit illustrated in FIG. 4E includes a light-emitting element 21B that emits blue light, a light-emitting element 21IR that emits infrared light, and the light-receiving element 22. The light-receiving element 22 is a photoelectric conversion element having sensitivity to at least infrared light. The light-receiving element 22 may have sensitivity to blue and infrared light.

The light-emitting and light-receiving unit illustrated in FIG. 4E can display a blue image, emit blue light, and the like. Blue light is preferable because glare is less likely to be felt and driving is less likely to be hindered even at night. Note that the light-emitting element of visible light provided in the light-emitting and light-receiving unit is not limited to a light-emitting element that emits blue light, and may be a light-emitting element that emits another color such as red or green.

The light-emitting and light-receiving unit illustrated in FIG. 4F includes a light-emitting element 21R that emits red light, a light-emitting element 21G that emits green light, the light-emitting element 21B that emits blue light, the light-emitting element 21IR that emits infrared light, and the light-receiving element 22. The light-receiving element 22 is a photoelectric conversion element having sensitivity to at least infrared light. The light-receiving element 22 may have sensitivity to at least one of red, blue, and green.

The light-emitting and light-receiving unit illustrated in FIG. 4F can display a full-color image. Even when an image is not displayed, that is, even when visible light is not emitted from the light-emitting and light-receiving unit, image capturing can be performed using infrared light.

The light-emitting and light-receiving unit illustrated in FIG. 4G includes the light-emitting element 21R that emits red light, the light-emitting element 21G that emits green light, the light-emitting element 21B that emits blue light, and the light-receiving element 22. The light-receiving element 22 has sensitivity to at least one of red, blue, and green.

The light-emitting and light-receiving unit illustrated in FIG. 4G has a function of image capturing using visible light, not infrared light, as a light source. A full-color image can be displayed. Since the light-emitting element 21IR is not provided, the pixels can be provided with a high density and an image with a high definition can be captured compared with FIG. 4F. Alternatively, since the area of the light-receiving element can be large, the sensitivity of the light-receiving element can be increased. Furthermore, since the area of each light-emitting element can be large, emission luminance can be increased.

[Operation Method Example]

An example of an operation method of the vehicle control device 10 of one embodiment of the present invention is described below.

Figure 5:
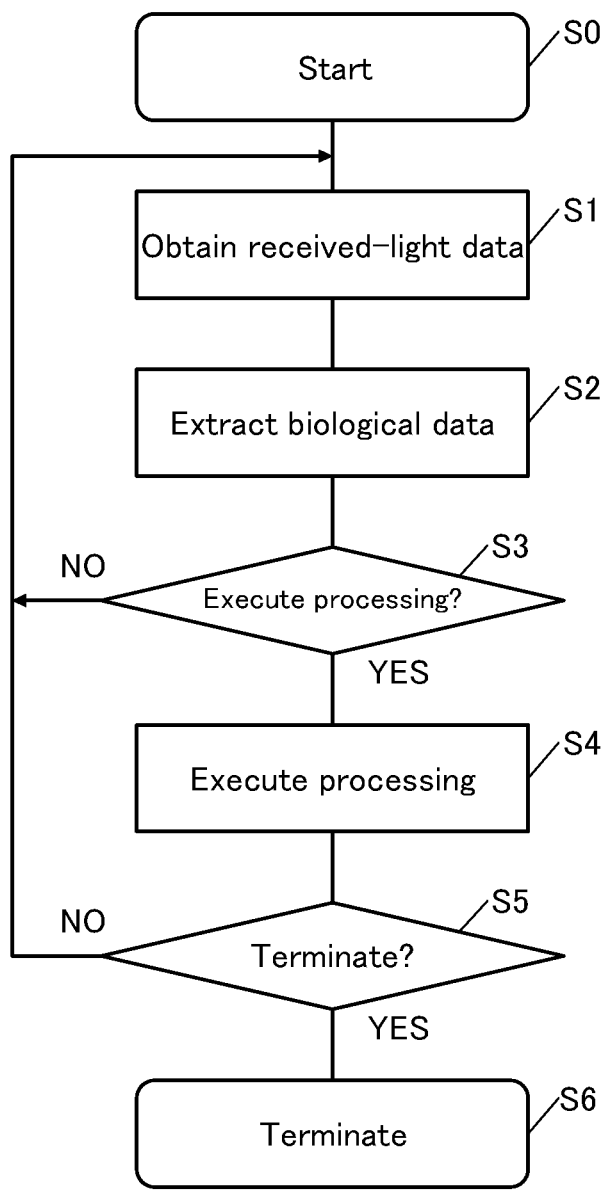
FIG. 5 is a flow chart of an operation method example of a vehicle control device.

FIG. 5 is a flow chart of the operation of the vehicle control device 10. The flow chart shown in FIG. 5 includes Step S0 to Step S6.

First, the operation starts in Step S0.

In Step S1, received-light data is obtained in the light-emitting and light-receiving unit 20. Specifically, the light-emitting element 21 emits light, the light-receiving element 22 receives the light, and the reading circuit 24 reads the received-light data. In Step S1, the received-light data may be output from the reading circuit 24 to the control unit 30.

In Step S2, the data generation portion 31 extracts biological data. Specifically, the data generation portion 31 generates required biological data from the received-light data supplied from the light-emitting and light-receiving unit 20. For example, vital data such as waveform data of a pulse wave, a heart rate, a pulse, blood oxygen saturation, blood pressure, stress level, blood sugar level, body temperature, neutral fat concentration, or blood alcohol concentration can be generated. Furthermore, biometrics data such as a fingerprint, a palm print, or the shape of a blood vessel can be generated as the biological data.

In Step S3, the determination portion 32 determines whether processing is executed or not. When the processing is executed, the operation proceeds to Step S4. When the processing is not executed, the operation returns to Step S1.

In Step S3, the determination portion 32 can perform the determination on the basis of the above biological data. The determination portion 32 may perform the determination on the basis of two or more pieces of the above biological data.

In Step S4, the processing portion 33 executes processing.

In Step S5, it is determined whether the operation is terminated or not. When the operation is terminated on the basis of the processing executed in the processing portion 33, the operation proceeds to Step S6 to be terminated. When the operation is not terminated (the operation is continued), the operation returns to Step S1.

The above is the description of the operation method example.

In the above driving method example, a variety of data can be used as the biological data that can be used for the determination of the determination portion 32. Furthermore, a wide range of processing is executed in the processing portion 33 on the basis of the determination of the determination portion 32. An example is described below.

Figure 6:
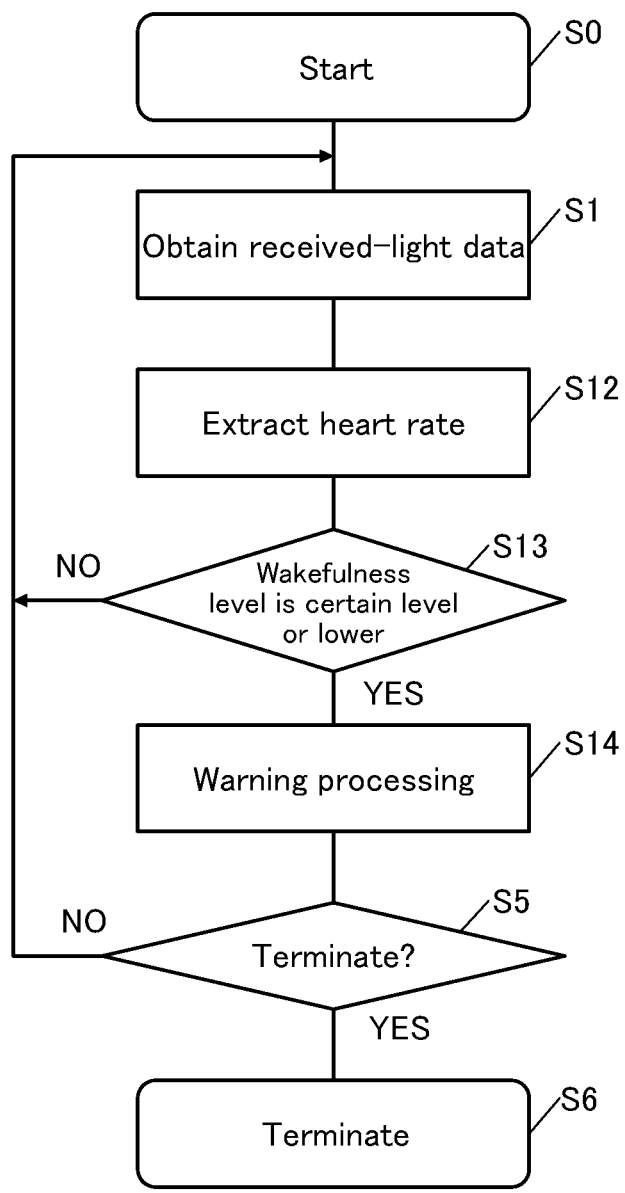
FIG. 6 is a flow chart of an operation method example of a vehicle control device.

FIG. 6 shows a flow chart relating to an operation in which the driver's wakefulness is determined and, in the case where drowsy driving might be happened, the driver is warned. In the flow chart shown in FIG. 6, Step S2 to Step S4 in FIG. 5 are replaced with Step S12 to Step S14.

In Step S12, a heart rate is extracted in the data generation portion 31 as the vital data.

In Step S13, the determination portion 32 determines whether the wakefulness level is lower than or equal to a certain level on the basis of a change in the heart rate. When the wakefulness level is lower than or equal to a certain level, the operation proceeds to Step S14.

On the other hand, when the wakefulness level is higher than a certain level, the operation returns to Step S1.

For example, the determination portion 32 can estimate the wakefulness level of the driver from a late heart rate or generation of a change in variation of the heart rate.

In Step S14, the processing portion 33 executes the warning processing to the driver. In the warning processing, the driver's sense of sight, hearing, touch, or smell is stimulated, whereby the driver can recognize a decrease in the wakefulness level or the wakefulness of the driver can be promoted. Specific examples of the processing executed by the processing portion 33 include playing sound, turning up the volume, vibrating a seat, a seat belt, a steering wheel, or the like, changing luminance in a vehicle, opening a window, diffusing scent from an aroma diffuser.

The above is the description of the flow chart in FIG. 6.

Note that in the case where the wakefulness level is too high, it can be determined that the driver is in an excited state; thus, processing for making the driver conscious or relax.

As described above, the vehicle control device of one embodiment of the present invention can monitor a variety of physical states of a driver or the change from vital data that can be obtained in a light-emitting and light-receiving unit. In addition, various types of processing can be executed in accordance with the driver's state such that the driver can continue safe driving or avoid danger.

Modification Example

One embodiment of the present invention can detect the user's physical or mental state with the use of a light-emitting and light-receiving unit and execute processing in accordance with the state. Therefore, one embodiment of the present invention can be applied to a variety of uses other than a vehicle control device. Here, an example in which one embodiment of the present invention is applied to a game system is described.

Figure 7A:
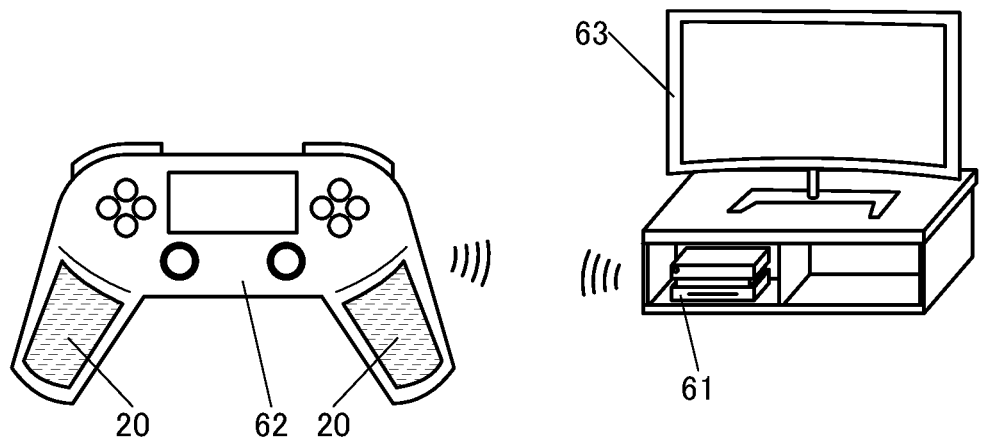
FIG. 7A is a diagram illustrating a structure example of a game system.

FIG. 7A illustrates a game system 60. The game system 60 includes a main body 61, a controller 62, a monitor 63, and the like. The monitor 63 can display an image output from the main body 61. Data transmission and reception between the main body 61 and the controller 62 is carried out by wireless communication.

The controller 62 includes a pair of gripping portions, and the light-emitting and light-receiving units 20 are provided along surfaces of the gripping portions. The controller 62 further includes a plurality of buttons.

The controller 62 can output received-light data obtained in the light-emitting and light-receiving unit 20 to the main body 61 in real time by wireless communication.

The main body 61 can execute a game program. The game program may be installed in a memory region (e.g., an HDD (Hard Disk Drive) or an SSD (Solid State Disk)) included in the main body 61 or may be stored in a recording medium such as a flash memory, a Blu-ray disc, or a DVD.

The main body 61 can generate vital data on the basis of the received-light data obtained in the controller 62. The game program can execute processing on the basis of the vital data.

An example where one embodiment of the present invention is applied to a soccer game as a game program is described below.

In the soccer game, one or more characters that can be operated by a player are set. A plurality of specific parameters for determining individual characteristics are set for the character. Examples of the specific parameters include speed, stamina, concentration, a dribble skill, a shoot skill, a pass skill, and a defense skill. The specific parameters can be increased or decreased in accordance with the growing level of the character.

Furthermore, variable parameters are set for the character in addition to the specific parameters. The variable parameters are parameters varying in accordance with the vital data of the player at any time. The kinds of the variable parameters can be the same as those of the specific parameters. Alternatively, the variable parameters may be set as parameters different from the specific parameters.

The parameters that determine the characteristics of the character are each determined using two kinds of parameters, i.e., the specific parameters and the variable parameters. For example, the parameters of the character may be simply the sum or product of the specific parameters and the variable parameters, or may be determined on the basis of a predetermined formula.

Here, there may be a parameter that is increased (raised) or decreased (lowered) in accordance with the player's vital data. For example, when the player's heart rate is raised, the parameter of concentration can be decreased, but the parameter of a dribble skill, a defense skill, or the like can be increased in some cases.

The received-light data obtained in the light-emitting and light-receiving unit 20 in the controller 62 is transmitted to the main body 61 wirelessly. A data generation portion in the main body 61 generates the vital data on the basis of the received-light data. The game program sets the variable parameters of the character on the basis of the vital data. The vital data is generated at any time during the playing, and the variable parameters of the character can also be updated in accordance with a change in the vital data.

Figure 7B:
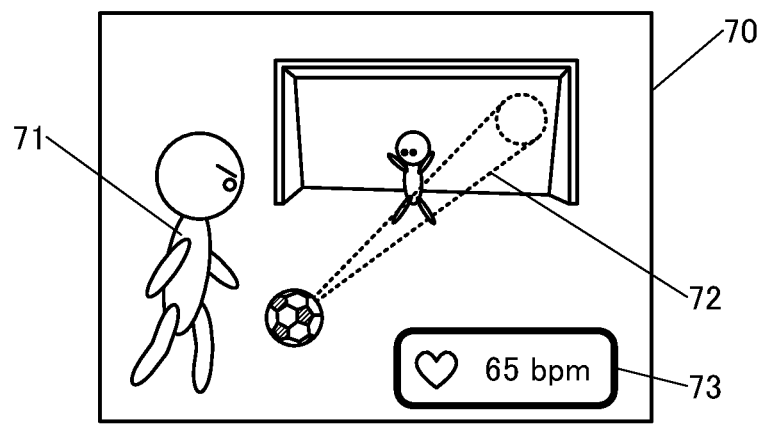
FIG. 7B and FIG. 7C are examples of an image of a game.

FIG. 7B illustrates an image 70 that is an example of an image where a character 71 operated by the player is about to shoot. In the image 70, a shoot area 72 and information 73 are shown in addition to the character 71.

The shoot area 72 shows the path range of a ball after the shoot. The path of the shot ball fits in the shoot area 72; thus, the narrower the shoot area 72 is, the higher the accuracy of the shoot is. The size, the shape, or the like of the shoot area 72 is affected by the parameter of the character such as concentration or a shoot skill.

The information 73 shows the current heart rate of the player (65 bpm) with an image showing a heart rate. The heart rate affects the parameter of concentration of the character, and thus the size, the shape, or the like of the shoot area 72 varies in accordance with the heart rate.

Figure 7C:
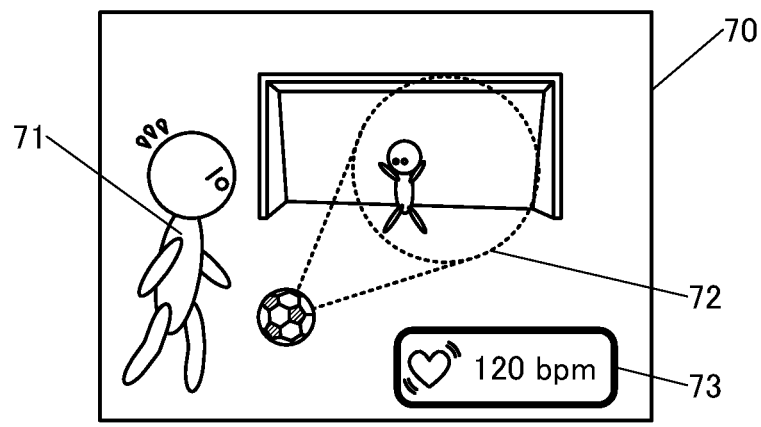

For example, FIG. 7C illustrates the case where the heart rate is 120 bpm, which is much higher than that in FIG. 7B. In FIG. 7C, the shoot area 72 is large compared with FIG. 7B, which means the shoot accuracy is low.

In this manner, the vital data of the player and the parameter determining the characteristics of the character are linked, whereby a highly realistic game program can be provided. Furthermore, using a plurality of controllers 62, two or more people can play the game at the same time or two or more people can play the game on line through the Internet at the same time.

The above is the description of the modification example.

At least part of this embodiment can be implemented in combination with the other embodiments described in this specification as appropriate.

Embodiment 2

In this embodiment, a light-emitting and light-receiving apparatus of one embodiment of the present invention will be described. A display apparatus exemplified below can be favorably used for the light-emitting and light-receiving unit of the vehicle control device described in Embodiment 1.

A light-emitting and light-receiving unit of the light-emitting and light-receiving apparatus of one embodiment of the present invention includes light-receiving elements (also referred to as light-receiving devices) and light-emitting elements (also referred to as light-emitting devices). The light-emitting and light-receiving unit has a function of displaying an image with the use of the light-emitting elements. Furthermore, the light-emitting and light-receiving unit has one or both of a function of capturing an image with the use of the light-receiving elements and a detection function. Thus, the light-emitting and light-receiving apparatus of one embodiment of the present invention can be expressed as a display apparatus, and the light-emitting and light-receiving unit can be expressed as a display portion.

Alternatively, the light-emitting and light-receiving apparatus of one embodiment of the present invention may have a structure including light-emitting and light-receiving elements (also referred to as light-emitting and light-receiving devices) and light-emitting elements.

First, a light-emitting and light-receiving apparatus including light-receiving elements and light-emitting elements is described.

The light-emitting and light-receiving apparatus of one embodiment of the present invention includes a light-receiving element and a light-emitting element in a light-emitting and light-receiving unit. In the light-emitting and light-receiving apparatus of one embodiment of the present invention, the light-emitting elements are arranged in a matrix in the light-emitting and light-receiving unit, and an image can be displayed on the light-emitting and light-receiving unit. Furthermore, the light-receiving elements are arranged in a matrix in the light-emitting and light-receiving unit, and the light-emitting and light-receiving unit has one or both of an image capturing function and a sensing function. The light-emitting and light-receiving unit can be used as an image sensor, a touch sensor, or the like. That is, by detecting light with the light-emitting and light-receiving unit, an image can be captured and touch operation of an object (e.g., a finger or a stylus) can be detected. Furthermore, in the light-emitting and light-receiving apparatus of one embodiment of the present invention, the light-emitting elements can be used as a light source of the sensor. Accordingly, a light-receiving portion and a light source do not need to be provided separately from the light-emitting and light-receiving apparatus; hence, the number of components of an electronic device can be reduced.

In the light-emitting and light-receiving apparatus of one embodiment of the present invention, when an object reflects (or scatters) light emitted from the light-emitting element included in the light-emitting and light-receiving unit, the light-receiving element can detect the reflected light (or the scattered light); thus, image capturing, touch operation detection, or the like is possible even in a dark place.

The light-emitting element included in the light-emitting and light-receiving apparatus of one embodiment of the present invention functions as a display element (also referred to as a display device).

As the light-emitting element, an EL element (also referred to as an EL device) such as an OLED or a QLED is preferably used. Examples of a light-emitting substance contained in the EL element include a substance exhibiting fluorescence (a fluorescent material), a substance exhibiting phosphorescence (a phosphorescent material), an inorganic compound (such as a quantum dot material), and a substance exhibiting thermally activated delayed fluorescence (a thermally activated delayed fluorescent (TADF) material). An LED such as a micro LED can also be used as the light-emitting element.

The light-emitting and light-receiving apparatus of one embodiment of the present invention has a function of detecting light with the use of a light-receiving element.

When the light-receiving elements are used as an image sensor, the light-emitting and light-receiving apparatus can capture an image using the light-receiving elements. For example, the light-emitting and light-receiving apparatus can be used as a scanner.

An electronic device including the light-emitting and light-receiving apparatus of one embodiment of the present invention can obtain data related to biological information such as a fingerprint or a palm print by using a function of an image sensor. That is, a biometric authentication sensor can be incorporated in the light-emitting and light-receiving apparatus. When the light-emitting and light-receiving apparatus incorporates a biometric authentication sensor, the number of components of an electronic device can be reduced as compared to the case where a biometric authentication sensor is provided separately from the light-emitting and light-receiving apparatus; thus, the size and weight of the electronic device can be reduced.

When the light-receiving elements are used as the touch sensor, the light-emitting and light-receiving apparatus can detect touch operation of an object with the use of the light-receiving elements.

As the light-receiving element, a pn photodiode or a pin photodiode can be used, for example. The light-receiving element functions as a photoelectric conversion element (also referred to as a photoelectric conversion device) that detects light entering the light-receiving element and generates electric charge. The amount of electric charge generated from the light-receiving element depends on the amount of light entering the light-receiving element.

It is particularly preferable to use an organic photodiode including a layer containing an organic compound as the light-receiving element. An organic photodiode, which is easily made thin, lightweight, and large in area and has a high degree of freedom for shape and design, can be used in a variety of devices.

In one embodiment of the present invention, organic EL elements (also referred to as organic EL devices) are used as the light-emitting elements, and organic photodiodes are used as the light-receiving elements. The organic EL elements and the organic photodiodes can be formed over one substrate. Thus, the organic photodiodes can be incorporated in the display apparatus including the organic EL elements.

In the case where all the layers of the organic EL elements and the organic photodiodes are formed separately, the number of deposition steps becomes extremely large. However, a large number of layers of the organic photodiodes can have a structure in common with the organic EL elements; thus, concurrently depositing the layers that can have a common structure can inhibit an increase in the number of deposition steps.

For example, one of a pair of electrodes (a common electrode) can be a layer shared by the light-receiving element and the light-emitting element. For example, at least one of a hole-injection layer, a hole-transport layer, an electron-transport layer, and an electron-injection layer is preferably a layer shared by the light-receiving element and the light-emitting element. As another example, the light-receiving element and the light-emitting element can have the same structure except that the light-receiving element includes an active layer and the light-emitting element includes a light-emitting layer. In other words, the light-receiving element can be manufactured by only replacing the light-emitting layer of the light-emitting element with an active layer. When the light-receiving element and the light-emitting element include common layers in such a manner, the number of deposition steps and the number of masks can be reduced, whereby the number of manufacturing steps and the manufacturing cost of the light-emitting and light-receiving apparatus can be reduced. Furthermore, the light-emitting and light-receiving apparatus including the light-receiving element can be manufactured using an existing manufacturing apparatus and an existing manufacturing method for the display apparatus.

Note that a layer shared by the light-receiving element and the light-emitting element might have functions different in the light-receiving element and the light-emitting element. In this specification, the name of a component is based on its function in the light-emitting element. For example, a hole-injection layer functions as a hole-injection layer in the light-emitting element and functions as a hole-transport layer in the light-receiving element. Similarly, an electron-injection layer functions as an electron-injection layer in the light-emitting element and functions as an electron-transport layer in the light-receiving element. A layer shared by the light-receiving element and the light-emitting element may have the same functions in the light-emitting element and the light-receiving element. A hole-transport layer functions as a hole-transport layer in both of the light-emitting element and the light-receiving element, and an electron-transport layer functions as an electron-transport layer in both of the light-emitting element and the light-receiving element.

Next, a light-emitting and light-receiving apparatus including light-emitting and light-receiving elements and light-emitting elements is described. Note that functions, behavior, effects, and the like similar to those in the above are not be described in some cases.

In the light-emitting and light-receiving apparatus of one embodiment of the present invention, a subpixel exhibiting any color includes a light-emitting and light-receiving element instead of a light-emitting element, and subpixels exhibiting the other colors each include a light-emitting element. The light-emitting and light-receiving element has both a function of emitting light (a light-emitting function) and a function of receiving light (a light-receiving function). For example, in the case where a pixel includes three subpixels of a red subpixel, a green subpixel, and a blue subpixel, at least one of the subpixels includes a light-emitting and light-receiving element, and the other subpixels each include a light-emitting element. Thus, the light-emitting and light-receiving unit of the light-emitting and light-receiving apparatus of one embodiment of the present invention has a function of displaying an image using both light-emitting and light-receiving elements and light-emitting elements.

The light-emitting and light-receiving element functions as both a light-emitting element and a light-receiving element, whereby the pixel can have a light-receiving function without an increase in the number of subpixels included in the pixel. Thus, the light-emitting and light-receiving unit of the light-emitting and light-receiving apparatus can be provided with one or both of an image capturing function and a sensing function while keeping the aperture ratio of the pixel (aperture ratio of each subpixel) and the resolution of the light-emitting and light-receiving apparatus. Accordingly, in the light-emitting and light-receiving apparatus of one embodiment of the present invention, the aperture ratio of the pixel can be more increased and the resolution can be increased more easily than in a light-emitting and light-receiving apparatus provided with a subpixel including a light-receiving element separately from a subpixel including a light-emitting element.

In the light-emitting and light-receiving unit of the light-emitting and light-receiving apparatus of one embodiment of the present invention, the light-emitting and light-receiving elements and the light-emitting elements are arranged in a matrix, and an image can be displayed on the light-emitting and light-receiving unit. The light-emitting and light-receiving unit can be used as an image sensor, a touch sensor, or the like. In the light-emitting and light-receiving apparatus of one embodiment of the present invention, the light-emitting elements can be used as a light source of the sensor. Thus, image capturing, touch operation detection, or the like is possible even in a dark place.

The light-emitting and light-receiving element can be manufactured by combining an organic EL element and an organic photodiode. For example, by adding an active layer of an organic photodiode to a stacked-layer structure of an organic EL element, the light-emitting and light-receiving element can be manufactured. Furthermore, in the light-emitting and light-receiving element formed of a combination of an organic EL element and an organic photodiode, concurrently depositing layers that can be shared with the organic EL element can inhibit an increase in the number of deposition steps.

For example, one of a pair of electrodes (a common electrode) can be a layer shared by the light-emitting and light-receiving element and the light-emitting element. For example, at least one of a hole-injection layer, a hole-transport layer, an electron-transport layer, and an electron-injection layer is preferably a layer shared by the light-emitting and light-receiving element and the light-emitting element. As another example, the light-emitting and light-receiving element and the light-emitting element can have the same structure except for the presence or absence of an active layer of the light-receiving element. That is, the light-emitting and light-receiving element can be manufactured by only adding the active layer of the light-receiving element to the light-emitting element. When the light-emitting and light-receiving element and the light-emitting element include common layers in such a manner, the number of deposition steps and the number of masks can be reduced, thereby reducing the number of manufacturing steps and the manufacturing cost of the light-emitting and light-receiving apparatus. Furthermore, the light-emitting and light-receiving apparatus including the light-emitting and light-receiving element can be manufactured using an existing manufacturing device and an existing manufacturing method for the display apparatus.

Note that a layer included in the light-emitting and light-receiving element might have a different function between the case where the light-emitting and light-receiving element functions as a light-receiving element and the case where the light-emitting and light-receiving element functions as a light-emitting element. In this specification, the name of a component is based on its function in the case where the light-emitting and light-receiving element functions as a light-emitting element.

The light-emitting and light-receiving apparatus of this embodiment has a function of displaying an image with the use of the light-emitting elements and the light-emitting and light-receiving elements. That is, the light-emitting elements and the light-emitting and light-receiving elements function as display elements.

The light-emitting and light-receiving apparatus of this embodiment has a function of detecting light with the use of the light-emitting and light-receiving elements. The light-emitting and light-receiving element can detect light having a shorter wavelength than light emitted from the light-emitting and light-receiving element itself.

When the light-emitting and light-receiving elements are used as an image sensor, the light-emitting and light-receiving apparatus of this embodiment can capture an image using the light-emitting and light-receiving elements. When the light-emitting and light-receiving elements are used as a touch sensor, the light-emitting and light-receiving apparatus of this embodiment can detect touch operation of an object with the use of the light-emitting and light-receiving elements.

The light-emitting and light-receiving element functions as a photoelectric conversion element. The light-emitting and light-receiving element can be manufactured by adding an active layer of the light-receiving element to the above-described structure of the light-emitting element. For the light-emitting and light-receiving element, an active layer of a pn photodiode or a pin photodiode can be used, for example.

It is particularly preferable to use, for the light-emitting and light-receiving element, an active layer of an organic photodiode including a layer containing an organic compound. An organic photodiode, which is easily made thin, lightweight, and large in area and has a high degree of freedom for shape and design, can be used in a variety of devices.

The display apparatus that is an example of the light-emitting and light-receiving apparatus of one embodiment of the present invention is specifically described below with reference to drawings.

Structure Example 1 of Display Apparatus

Structure Example 1-1

Figure 8A:
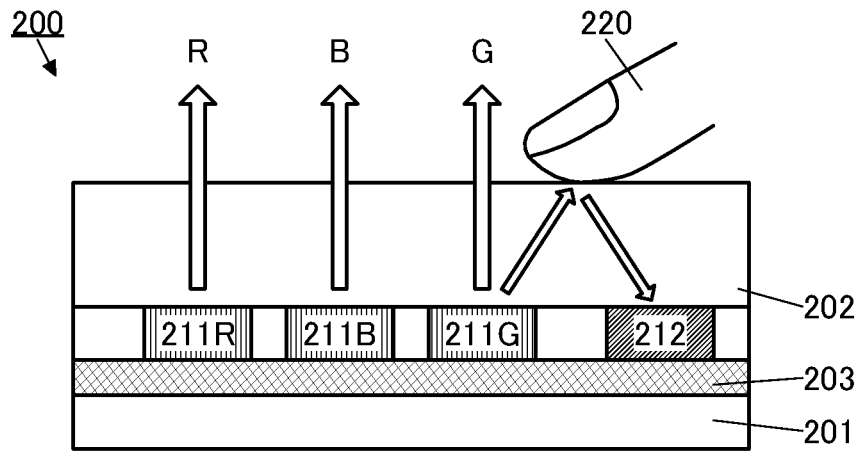
FIG. 8A, FIG. 8B, and FIG. 8D are cross-sectional views illustrating an example of a display apparatus.

FIG. 8A is a schematic view of a display panel 200. The display panel 200 includes a substrate 201, a substrate 202, a light-receiving element 212, a light-emitting element 211R, a light-emitting element 211G, a light-emitting element 211B, a functional layer 203, and the like.

The light-emitting element 211R, the light-emitting element 211G, the light-emitting element 211B, the light-receiving element 212 are provided between the substrate 201 and the substrate 202. The light-emitting element 211R, the light-emitting element 211G, and the light-emitting element 211B emit red (R) light, green (G) light, and blue (B) light, respectively. Note that in the following description, the term "light-emitting element 211" may be used when the light-emitting element 211R, the light-emitting element 211G, and the light-emitting element 211B are not distinguished from each other.

The display panel 200 includes a plurality of pixels arranged in a matrix. One pixel includes one or more subpixels. One subpixel includes one light-emitting element. For example, the pixel can have a structure including three subpixels (e.g., three colors of R, G, and B or three colors of yellow (Y), cyan (C), and magenta (M)) or four subpixels (e.g., four colors of R, G, B, and white (W) or four colors of R, G, B, and Y). The pixel further includes the light-receiving element 212. The light-receiving element 212 may be provided in all the pixels or may be provided in some of the pixels. In addition, one pixel may include a plurality of light-receiving elements 212.

FIG. 8A illustrates a finger 220 touching a surface of the substrate 202. Part of light emitted from the light-emitting element 211G is reflected at a contact portion of the substrate 202 and the finger 220. In the case where part of the reflected light is incident on the light-receiving element 212, the contact of the finger 220 with the substrate 202 can be detected. That is, the display panel 200 can function as a touch panel.

The functional layer 203 includes a circuit for driving the light-emitting element 211R, the light-emitting element 211G, and the light-emitting element 211B and a circuit for driving the light-receiving element 212. The functional layer 203 is provided with a switch, a transistor, a capacitor, a wiring, and the like. Note that in the case where the light-emitting element 211R, the light-emitting element 211G, the light-emitting element 211B, and the light-receiving element 212 are driven by a passive-matrix method, a structure not provided with a switch, a transistor, or the like may be employed.

Figure 8B:
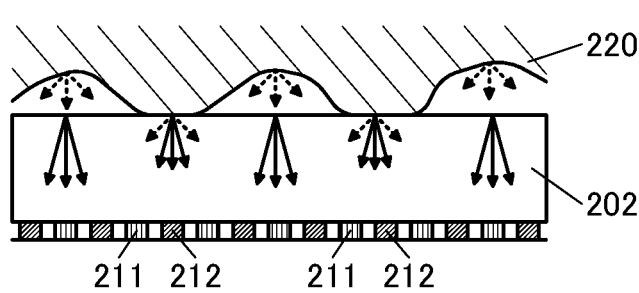

The display panel 200 preferably has a function of detecting a fingerprint of the finger 220. FIG. 8B schematically illustrates an enlarged view of the contact portion in a state where the finger 220 touches the substrate 202. FIG. 8B illustrates light-emitting elements 211 and the light-receiving elements 212 that are alternately arranged.

The fingerprint of the finger 220 is formed of depressions and projections. Therefore, as illustrated in FIG. 8B, the projections of the fingerprint touch the substrate 202.

Reflection of light from a surface, an interface, or the like is categorized into regular reflection and diffuse reflection. Regularly reflected light is highly directional light with an angle of reflection equal to the angle of incidence. Diffusely reflected light has low directionality and low angular dependence of intensity. As for regular reflection and diffuse reflection, diffuse reflection components are dominant in the light reflected from the surface of the finger 220. Meanwhile, regular reflection components are dominant in the light reflected from the interface between the substrate 202 and the air.

The intensity of light that is reflected from contact surfaces or non-contact surfaces between the finger 220 and the substrate 202 and is incident on the light-receiving elements 212 positioned directly below the contact surfaces or the non-contact surfaces is the sum of intensities of regularly reflected light and diffusely reflected light. As described above, regularly reflected light (indicated by solid arrows) is dominant near the depressions of the finger 220, where the finger 220 is not in contact with the substrate 202; whereas diffusely reflected light (indicated by dashed arrows) from the finger 220 is dominant near the projections of the finger 220, where the finger 220 is in contact with the substrate 202. Thus, the intensity of light received by the light-receiving element 212 positioned directly below the depression is higher than the intensity of light received by the light-receiving element 212 positioned directly below the projection. Accordingly, a fingerprint image of the finger 220 can be captured.

In the case where an arrangement interval between the light-receiving elements 212 is smaller than a distance between two projections of a fingerprint, preferably a distance between a depression and a projection adjacent to each other, a clear fingerprint image can be obtained. The distance between a depression and a projection of a human's fingerprint is approximately 200 μm; thus, the arrangement interval between the light-receiving elements 212 is, for example, less than or equal to 400 μm, preferably less than or equal to 200 μm, further preferably less than or equal to 150 μm, still further preferably less than or equal to 100 μm, even still further preferably less than or equal to 50 μm and greater than or equal to 1 μm, preferably greater than or equal to 10 μm, further preferably greater than or equal to 20 μm.

Figure 8C:
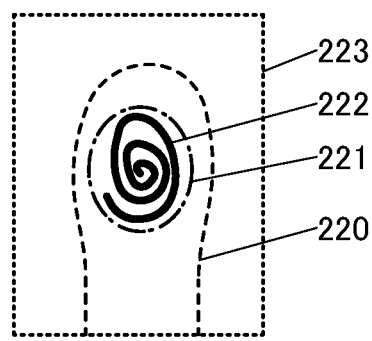
FIG. 8C and FIG. 8E are diagrams illustrating examples of an image captured by the display apparatus.

FIG. 8C illustrates an example of a fingerprint image captured by the display panel 200. In an image-capturing range 223 in FIG. 8C, the outline of the finger 220 is indicated by a dashed line and the outline of a contact portion 221 is indicated by a dashed-dotted line. In the contact portion 221, a high-contrast image of a fingerprint 222 can be captured owing to a difference in the amount of light incident on the light-receiving elements 212.

Figure 8D:
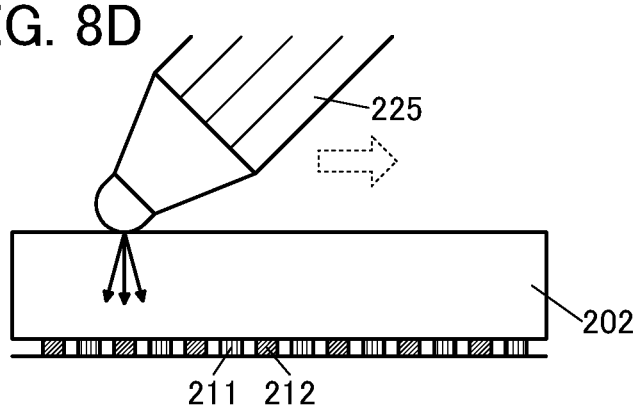

The display panel 200 can also function as a touch panel or a pen tablet. FIG. 8D illustrates a state where a tip of a stylus 225 slides in a direction indicated with a dashed arrow while the tip of the stylus 225 touches the substrate 202.

As illustrated in FIG. 8D, when diffusely reflected light that is diffused at the contact surface of the tip of the stylus 225 and the substrate 202 is incident on the light-receiving element 212 that overlaps with the contact surface, the position of the tip of the stylus 225 can be detected with high accuracy.

Figure 8E:
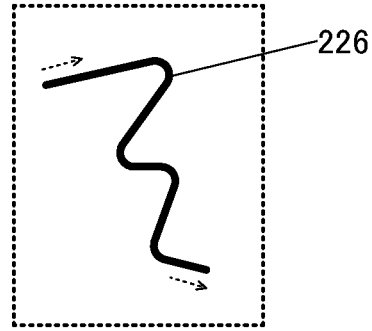

FIG. 8E illustrates an example of a path 226 of the stylus 225 that is detected by the display panel 200. The display panel 200 can detect the position of a detection target, such as the stylus 225, with high position accuracy, so that high-definition drawing can be performed using a drawing application or the like. Unlike the case of using a capacitive touch sensor, an electromagnetic induction touch pen, or the like, the display panel 200 can detect even the position of a highly insulating object to be detected, the material of a tip portion of the stylus 225 is not limited, and a variety of writing materials (e.g., a brush, a glass pen, a quill pen, and the like) can be used.

Figure 8F:
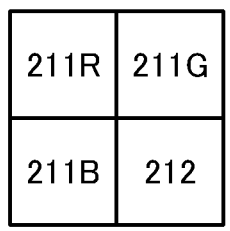
FIG. 8F to FIG. 8H are top views illustrating examples of a pixel.
Figure 8G:
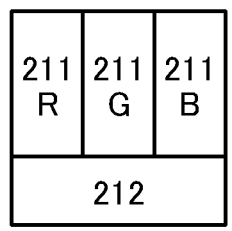
Figure 8H:
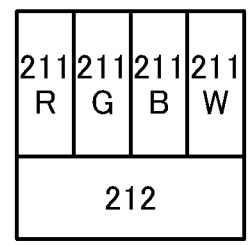

Here, FIG. 8F to FIG. 8H illustrate examples of a pixel that can be used in the display panel 200.

The pixels illustrated in FIG. 8F and FIG. 8G each include the light-emitting element 211R for red (R), the light-emitting element 211G for green (G), the light-emitting element 211B for blue (B), and the light-receiving element 212. The pixels each include a pixel circuit for driving the light-emitting element 211R, the light-emitting element 211G, the light-emitting element 211B, and the light-receiving element 212.

FIG. 8F illustrates an example in which three light-emitting elements and one light-receiving element are provided in a matrix of 2×2. FIG. 8G illustrates an example in which three light-emitting elements are arranged in one line and one laterally long light-receiving element 212 is provided below the three light-emitting elements.

The pixel illustrated in FIG. 8H is an example including a light-emitting element 211W for white (W). Here, four light-emitting elements are arranged in one line and the light-receiving element 212 is provided below the four light-emitting elements.

Note that the pixel structure is not limited to the above structure, and a variety of arrangement methods can be employed.

Structure Example 1-2

An example of a structure including light-emitting elements emitting visible light, a light-emitting element emitting infrared light, and a light-receiving element is described below.

Figure 9A:
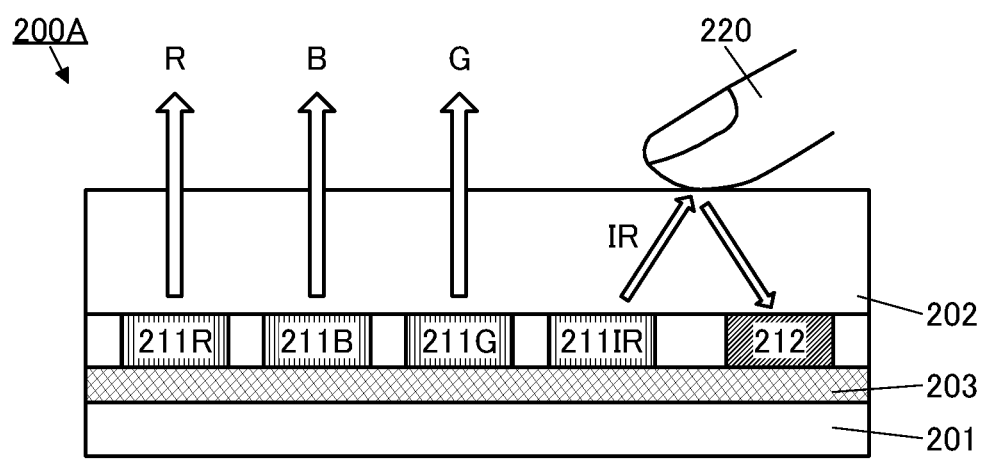
FIG. 9A is a cross-sectional view illustrating a structure example of a display apparatus.

A display panel 200A illustrated in FIG. 9A includes a light-emitting element 211IR in addition to the components illustrated in FIG. 8A as an example. The light-emitting element 211IR is a light-emitting element emitting infrared light IR. Moreover, in that case, an element capable of receiving at least the infrared light IR emitted from the light-emitting element 211IR is preferably used as the light-receiving element 212. As the light-receiving element 212, an element capable of receiving visible light and infrared light is further preferably used.

As illustrated in FIG. 9A, when the finger 220 touches the substrate 202, the infrared light IR emitted from the light-emitting element 2111R is reflected by the finger 220 and part of reflected light is incident on the light-receiving element 212, so that the positional information of the finger 220 can be obtained.

Figure 9B:
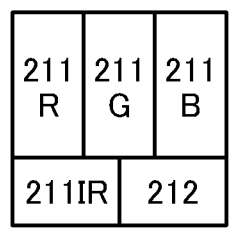
FIG. 9B to FIG. 9D are top views illustrating examples of a pixel.
Figure 9C:
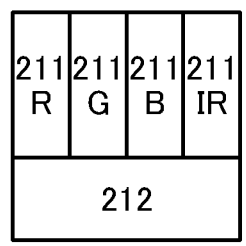
Figure 9D:
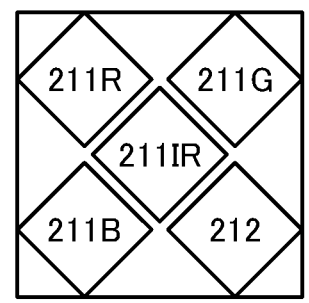

FIG. 9B to FIG. 9D illustrate examples of a pixel that can be used in the display panel 200A.

FIG. 9B illustrates an example in which three light-emitting elements are arranged in one line and the light-emitting element 2111R and the light-receiving element 212 are arranged below the three light-emitting elements in a horizontal direction. FIG. 9C illustrates an example in which four light-emitting elements including the light-emitting element 2111R are arranged in one line and the light-receiving element 212 is provided below the four light-emitting elements.

FIG. 9D illustrates an example in which three light-emitting elements and the light-receiving element 212 are arranged in all directions with the light-emitting element 2111R as the center.

Note that in the pixels illustrated in FIG. 9B to FIG. 9D, the positions of the light-emitting elements can be interchangeable, or the positions of the light-emitting element and the light-receiving element can be interchangeable.

Structure Example 1-3

An example of a structure including a light-emitting element emitting visible light and a light-emitting and light-receiving element emitting and receiving visible light is described below.

Figure 10A:
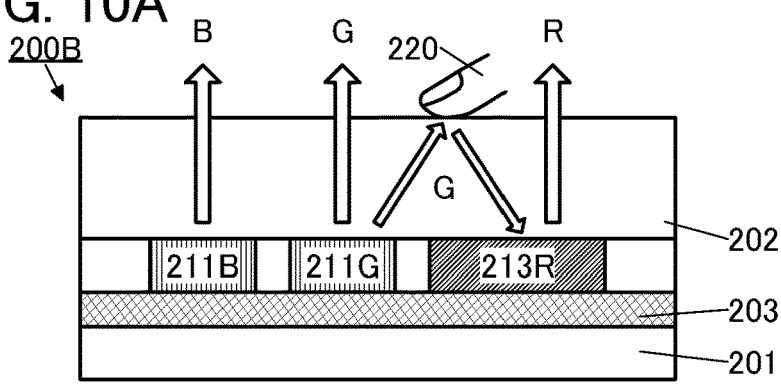
FIG. 10A is a cross-sectional view of a structure example of a display apparatus.

A display panel 200B illustrated in FIG. 10A includes the light-emitting element 211B, the light-emitting element 211G, and a light-emitting and light-receiving element 213R. The light-emitting and light-receiving element 213R has a function of a light-emitting element that emits red (R) light, and a function of a photoelectric conversion element that receives visible light. FIG. 10A illustrates an example in which the light-emitting and light-receiving element 213R receives green (G) light emitted from the light-emitting element 211G. Note that the light-emitting and light-receiving element 213R may receive blue (B) light emitted from the light-emitting element 211B. Alternatively, the light-emitting and light-receiving element 213R may receive both green light and blue light.

For example, the light-emitting and light-receiving element 213R preferably receives light having a shorter wavelength than light emitted from itself. Alternatively, the light-emitting and light-receiving element 213R may receive light (e.g., infrared light) having a longer wavelength than light emitted from itself. The light-emitting and light-receiving element 213R may receive light having approximately the same wavelength as light emitted from itself; however, in that case, the light-emitting and light-receiving element 213R also receives light emitted from itself, whereby its emission efficiency might be decreased. Therefore, the peak of the emission spectrum and the peak of the absorption spectrum of the light-emitting and light-receiving element 213R preferably overlap as little as possible.

Here, light emitted from the light-emitting and light-receiving element is not limited to red light. Furthermore, the light emitted from the light-emitting elements is not limited to the combination of green light and blue light. For example, the light-emitting and light-receiving element can be an element that emits green or blue light and receives light having a different wavelength from light emitted from itself.

The light-emitting and light-receiving element 213R serves as both a light-emitting element and a light-receiving element as described above, whereby the number of elements provided in one pixel can be reduced. Thus, higher definition, a higher aperture ratio, higher resolution, and the like can be easily achieved.

FIG. 10B to FIG. 10I illustrate examples of a pixel that can be used in the display panel 200B.

Figure 10B:
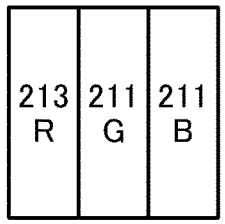
FIG. 10B to FIG. 10I are top views illustrating examples of a pixel.
Figure 10C:
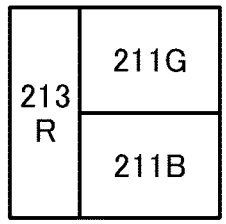

FIG. 10B illustrates an example in which the light-emitting and light-receiving element 213R, the light-emitting element 211G, and the light-emitting element 211B are arranged in one column. FIG. 10C illustrates an example in which the light-emitting element 211G and the light-emitting element 211B are alternately arranged in the vertical direction and the light-emitting and light-receiving element 213R is provided alongside the light-emitting elements.

Figure 10D:
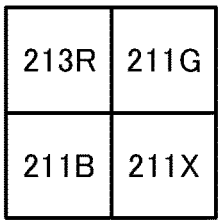

FIG. 10D illustrates an example in which three light-emitting elements (the light-emitting element 211G, the light-emitting element 211B, and a light-emitting element 211X) and one light-emitting and light-receiving element are arranged in matrix of 2×2. The light-emitting element 211X is an element that emits light of a color other than R, G, and B. The light of a color other than R, G, and B can be white (W) light, yellow (Y) light, cyan (C) light, magenta (M) light, infrared light (IR), ultraviolet light (UV), or the like. In the case where the light-emitting element 211X emits infrared light, the light-emitting and light-receiving element preferably has a function of detecting infrared light or a function of detecting both visible light and infrared light. The wavelength of light detected by the light-emitting and light-receiving element can be determined depending on the application of a sensor.

Figure 10E:

FIG. 10E illustrates two pixels. A region that includes three elements and is enclosed by a dotted line corresponds to one pixel. Each of the pixels includes the light-emitting element 211G, the light-emitting element 211B, and the light-emitting and light-receiving element 213R. In the left pixel in FIG. 10E, the light-emitting element 211G is provided in the same row as the light-emitting and light-receiving element 213R, and the light-emitting element 211B is provided in the same column as the light-emitting and light-receiving element 213R. In the right pixel in FIG. 10E, the light-emitting element 211G is provided in the same row as the light-emitting and light-receiving element 213R, and the light-emitting element 211B is provided in the same column as the light-emitting element 211G. In the pixel layout in FIG. 10E, the light-emitting and light-receiving element 213R, the light-emitting element 211G, and the light-emitting element 211B are repeatedly arranged in both the odd-numbered row and the even-numbered row, and in each column, the light-emitting elements or the light-emitting element and the light-emitting and the receiving elements arranged in the odd-numbered row and the even-numbered row emit light of different colors.

Figure 10F:
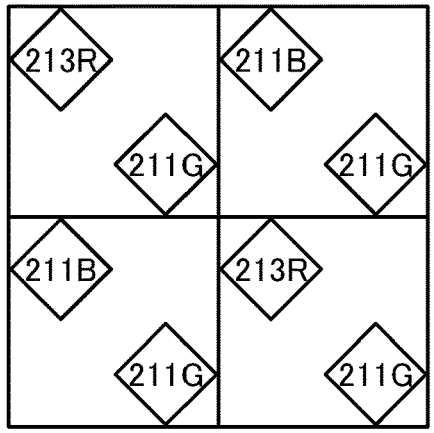

FIG. 10F illustrates four pixels which employ PenTile arrangement; adjacent two pixels have different combinations of light-emitting elements or light-emitting and light-receiving elements that emit light of two different colors. FIG. 10F illustrates the top-surface shapes of the light-emitting elements or light-emitting and light-receiving elements.

The upper left pixel and the lower right pixel in FIG. 10F each include the light-emitting and light-receiving element 213R and the light-emitting element 211G. The upper right pixel and the lower left pixel each include the light-emitting element 211G and the light-emitting element 211B. That is, in the example illustrated in FIG. 10F, the light-emitting element 211G is provided in each pixel.

The top surface shape of the light-emitting elements and the light-emitting and light-receiving elements is not particularly limited and can be a circular shape, an elliptical shape, a polygonal shape, a polygonal shape with rounded corners, or the like. FIG. 10F and the like illustrate examples in which the top surface shapes of the light-emitting elements and the light-emitting and light-receiving elements are each a square tilted at approximately 45° (a diamond shape). Note that the top surface shape of the light-emitting elements and the light-emitting and light-receiving elements may vary depending on the color thereof, or the light-emitting elements and the light-emitting and light-receiving elements of some colors or every color may have the same top surface shape.

The sizes of light-emitting regions (or light-emitting and light-receiving regions) of the light-emitting elements and the light-emitting and light-receiving elements may vary depending on the color thereof, or the light-emitting elements and the light-emitting and light-receiving elements of some colors or every color may have light-emitting regions of the same size. For example, in FIG. 10F, the light-emitting region of the light-emitting element 211G provided in each pixel may have a smaller area than the light-emitting region (or the light-emitting and light-receiving region) of the other elements.

Figure 10H:
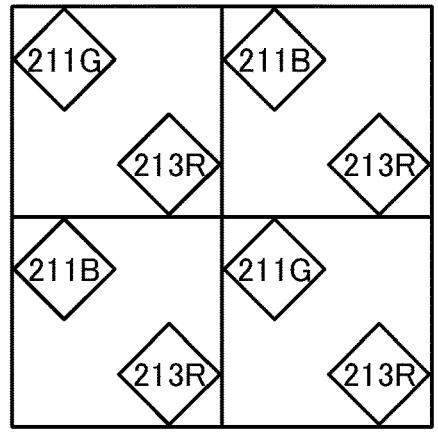
Figure 10G:
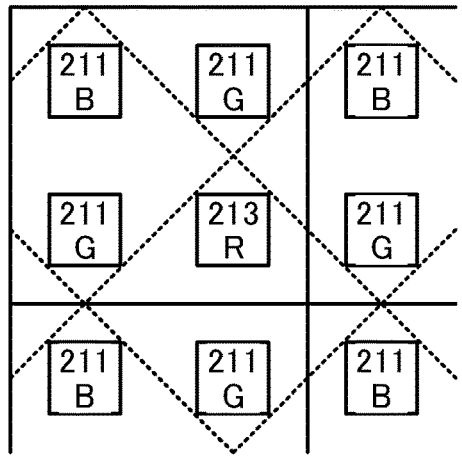

FIG. 10G is a modification example of the pixel arrangement of FIG. 10F. Specifically, the structure of FIG. 10G is obtained by rotating the structure of FIG. 10F by 45°. Although one pixel is regarded as including two elements in FIG. 10F, one pixel can be regarded as being formed of four elements as illustrated in FIG. 10G.

FIG. 10H is a modification example of the pixel arrangement of FIG. 10F. The upper left pixel and the lower right pixel in FIG. 10H each include the light-emitting and light-receiving element 213R and the light-emitting element 211G. The upper right pixel and the lower left pixel each include the light-emitting and light-receiving element 213R and the light-emitting element 211B. That is, in the example illustrated in FIG. 10H, the light-emitting and light-receiving element 213R is provided in each pixel. The structure illustrated in FIG. 10H achieves higher-resolution image capturing than the structure illustrated in FIG. 10F because of having the light-emitting and light-receiving element 213R in each pixel. Thus, the accuracy of biometric authentication can be increased, for example.

Figure 10I:
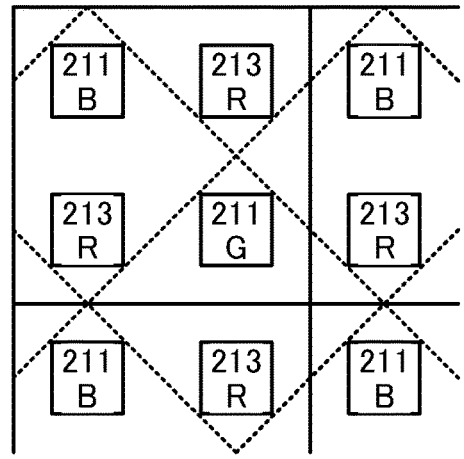

FIG. 10I illustrates a modification example of the pixel arrangement in FIG. 10H, obtained by rotating the pixel arrangement in FIG. 10H by 45°.

In FIG. 10I, one pixel is described as being formed of four elements (two light-emitting elements and two light-emitting and light-receiving elements). One pixel including a plurality of light-emitting and light-receiving elements having a light-receiving function allows high-resolution image capturing. Accordingly, the accuracy of biometric authentication can be increased. For example, the resolution of image capturing can be the square root of 2 times the resolution of display.

A display apparatus that employs the structure shown in FIG. 10H or FIG. 10I includes p (p is an integer greater than or equal to 2) first light-emitting elements, q (q is an integer greater than or equal to 2) second light-emitting elements, and r (r is an integer greater than p and q) light-emitting and light-receiving elements. As for p and r, r=2p is satisfied. As for p, q, and r, r=p+q is satisfied. Either the first light-emitting elements or the second light-emitting elements emit green light, and the other light-emitting elements emit blue light. The light-emitting and light-receiving elements emit red light and have a light-receiving function.

In the case where touch operation is detected with the light-emitting and light-receiving elements, for example, it is preferable that light emitted from a light source be hard for a user to recognize. Since blue light has lower visibility than green light, light-emitting elements that emit blue light are preferably used as a light source. Accordingly, the light-emitting and light-receiving elements preferably have a function of receiving blue light. Note that without limitation to the above, light-emitting elements used as a light source can be selected as appropriate depending on the sensitivity of the light-emitting and light-receiving elements.

As described above, the display apparatus of this embodiment can employ any of various types of pixel arrangements.

[Device Structure]

Next, detailed structures of the light-emitting element, the light-receiving element, and the light-emitting and light-receiving element which can be used in the display apparatus of one embodiment of the present invention are described.

The display apparatus of one embodiment of the present invention can have any of the following structures: a top-emission structure in which light is emitted in a direction opposite to the substrate where the light-emitting elements are formed, a bottom-emission structure in which light is emitted toward the substrate where the light-emitting elements are formed, and a dual-emission structure in which light is emitted toward both surfaces.

In this embodiment, a top-emission display apparatus is described as an example.

In this specification and the like, unless otherwise specified, in describing a structure including a plurality of components (e.g., light-emitting elements or light-emitting layers), alphabets are not added when a common part for the components is described. For example, when a common part of a light-emitting layer 283R, a light-emitting layer 283G, and the like is described, the light-emitting layers are simply referred to as a light-emitting layer 283, in some cases.

Figure 11A:
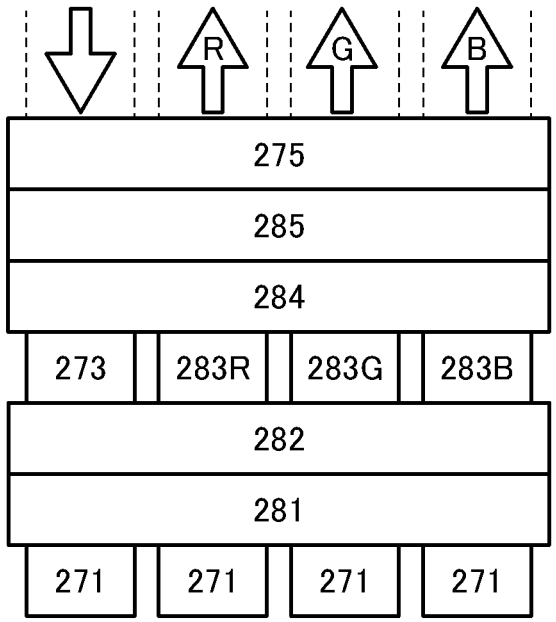
FIG. 11A and FIG. 11B are diagrams illustrating structure examples of display apparatuses.

A display apparatus 280A illustrated in FIG. 11A includes a light-receiving element 270PD, a light-emitting element 270R that emits red (R) light, a light-emitting element 270G that emits green (G) light, and a light-emitting element 270B that emits blue (B) light.

Each of the light-emitting elements includes a pixel electrode 271, a hole-injection layer 281, a hole-transport layer 282, a light-emitting layer, an electron-transport layer 284, an electron-injection layer 285, and a common electrode 275, which are stacked in this order. The light-emitting element 270R includes the light-emitting layer 283R, the light-emitting element 270G includes the light-emitting layer 283G, and the light-emitting element 270B includes a light-emitting layer 283B. The light-emitting layer 283R includes a light-emitting substance that emits red light, the light-emitting layer 283G includes a light-emitting substance that emits green light, and the light-emitting layer 283B includes a light-emitting substance that emits blue light.

The light-emitting elements are electroluminescent elements that emit light to the common electrode 275 side by voltage application between the pixel electrodes 271 and the common electrode 275.

The light-receiving element 270PD includes the pixel electrode 271, the hole-injection layer 281, the hole-transport layer 282, an active layer 273, the electron-transport layer 284, the electron-injection layer 285, and the common electrode 275, which are stacked in this order.

The light-receiving element 270PD is a photoelectric conversion element that receives light entering from the outside of the display apparatus 280A and converts it into an electric signal.

In the description made in this embodiment, the pixel electrode 271 functions as an anode and the common electrode 275 functions as a cathode in both of the light-emitting element and the light-receiving element. In other words, when the light-receiving element is driven by application of reverse bias between the pixel electrode 271 and the common electrode 275, light incident on the light-receiving element can be detected and charge can be generated and extracted as current.

In the display apparatus of this embodiment, an organic compound is used for the active layer 273 of the light-receiving element 270PD. In the light-receiving element 270PD, the layers other than the active layer 273 can have structures in common with the layers in the light-emitting elements. Therefore, the light-receiving element 270PD can be formed concurrently with the formation of the light-emitting elements only by adding a step of depositing the active layer 273 in the manufacturing process of the light-emitting elements. The light-emitting elements and the light-receiving element 270PD can be formed over one substrate. Accordingly, the light-receiving element 270PD can be incorporated into the display apparatus without a significant increase in the number of manufacturing steps.

The display apparatus 280A is an example in which the light-receiving element 270PD and the light-emitting elements have a common structure except that the active layer 273 of the light-receiving element 270PD and the light-emitting layers 283 of the light-emitting elements are separately formed. Note that the structures of the light-receiving element 270PD and the light-emitting elements are not limited thereto. The light-receiving element 270PD and the light-emitting elements may include separately formed layers other than the active layer 273 and the light-emitting layers 283. The light-receiving element 270PD and the light-emitting elements preferably include at least one layer used in common (common layer). Thus, the light-receiving element 270PD can be incorporated into the display apparatus without a significant increase in the number of manufacturing steps.

A conductive film that transmits visible light is used as the electrode through which light is extracted, which is either the pixel electrode 271 or the common electrode 275. A conductive film that reflects visible light is preferably used as the electrode through which light is not extracted.

The light-emitting elements included in the display apparatus of this embodiment preferably employs a micro optical resonator (microcavity) structure. Thus, one of the pair of electrodes of the light-emitting elements is preferably an electrode having properties of transmitting and reflecting visible light (a semi-transmissive and semi-reflective electrode), and the other is preferably an electrode having a property of reflecting visible light (a reflective electrode). When the light-emitting elements have a microcavity structure, light obtained from the light-emitting layers can be resonated between both of the electrodes, whereby light emitted from the light-emitting elements can be intensified.

Note that the semi-transmissive and semi-reflective electrode can have a stacked-layer structure of a reflective electrode and an electrode having a property of transmitting visible light (also referred to as a transparent electrode).

The transparent electrode has a light transmittance higher than or equal to 40%. For example, an electrode having a visible light (light with a wavelength greater than or equal to 400 nm and less than 750 nm) transmittance higher than or equal to 40% is preferably used in the light-emitting elements. The semi-transmissive and semi-reflective electrode has a visible light reflectance of higher than or equal to 10% and lower than or equal to 95%, preferably higher than or equal to 30% and lower than or equal to 80%. The reflective electrode has a visible light reflectance of higher than or equal to 40% and lower than or equal to 100%, preferably higher than or equal to 70% and lower than or equal to 100%. These electrodes preferably have a resistivity of $1\times10^{-2}$ Ωcm or lower. Note that in the case where any of the light-emitting elements emits near-infrared light (light with a wavelength greater than or equal to 750 nm and less than or equal to 1300 nm), the near-infrared light transmittance and reflectance of these electrodes preferably satisfy the above-described numerical ranges of the visible light transmittance and reflectance.

The light-emitting element includes at least the light-emitting layer 283. The light-emitting element may further include, as a layer other than the light-emitting layer 283, a layer containing a substance with a high hole-injection property, a substance with a high hole-transport property, a hole-blocking material, a substance with a high electron-transport property, a substance with a high electron-injection property, an electron-blocking material, a substance with a bipolar property (a substance with a high electron- and hole-transport property), or the like.

For example, the light-emitting elements and the light-receiving element can share at least one of the hole-injection layer, the hole-transport layer, the electron-transport layer, and the electron-injection layer. Furthermore, at least one of the hole-injection layer, the hole-transport layer, the electron-transport layer, and the electron-injection layer can be separately formed for the light-emitting elements and the light-receiving element.

The hole-injection layer is a layer injecting holes from an anode to the hole-transport layer, and a layer containing a material with a high hole-injection property. As the material with a high hole-injection property, it is possible to use, for example, a composite material containing a hole-transport material and an acceptor material (electron-accepting material) or an aromatic amine compound.

In the light-emitting element, the hole-transport layer is a layer transporting holes, which are injected from the anode by the hole-injection layer, to the light-emitting layer. In the light-receiving element, the hole-transport layer is a layer transporting holes, which are generated in the active layer on the basis of incident light, to the anode. The hole-transport layer is a layer containing a hole-transport material. As the hole-transport material, a substance having a hole mobility greater than or equal to $1\times10^{-6}$ cm$^2$/Vs is preferable. Note that other substances can also be used as long as they have a property of transporting more holes than electrons. As the hole-transport material, materials having a high hole-transport property, such as a π-electron rich heteroaromatic compound (e.g., a carbazole derivative, a thiophene derivative, and a furan derivative) and an aromatic amine (a compound having an aromatic amine skeleton), are preferable.

In the light-emitting element, the electron-transport layer is a layer transporting electrons, which are injected from the cathode by the electron-injection layer, to the light-emitting layer. In the light-receiving element, the electron-transport layer is a layer transporting electrons, which are generated in the active layer on the basis of incident light, to the cathode. The electron-transport layer is a layer containing an electron-transport material. As the electron-transport material, a substance having an electron mobility greater than or equal to $1\times10^{-6}$ cm$^2$/Vs is preferable. Note that other substances can also be used as long as they have a property of transporting more electrons than holes. As the electron-transport material, it is possible to use a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound such as a nitrogen-containing heteroaromatic compound.

The electron-injection layer is a layer injecting electrons from a cathode to the electron-transport layer, and a layer containing a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

The light-emitting layer 283 is a layer containing a light-emitting substance. The light-emitting layer 283 can contain one or more kinds of light-emitting substances. As the light-emitting substance, a substance that exhibits an emission color of blue, purple, bluish purple, green, yellowish green, yellow, orange, red, or the like is appropriately used. As the light-emitting substance, a substance that emits near-infrared light can also be used.

Examples of the light-emitting substance include a fluorescent material, a phosphorescent material, a TADF material, and a quantum dot material.

Examples of the fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer 283 may contain one or more kinds of organic compounds (e.g., a host material and an assist material) in addition to the light-emitting substance (a guest material). As one or more kinds of organic compounds, one or both of the hole-transport material and the electron-transport material can be used. Alternatively, as one or more kinds of organic compounds, a bipolar material or a TADF material may be used.

The light-emitting layer 283 preferably contains a phosphorescent material and a combination of a hole-transport material and an electron-transport material that easily forms an exciplex. With such a structure, light emission can be efficiently obtained by ExTET (Exciplex—Triplet Energy Transfer), which is energy transfer from an exciplex to a light-emitting substance (a phosphorescent material). When a combination of materials is selected so as to form an exciplex that exhibits light emission whose wavelength overlaps the wavelength of a lowest-energy-side absorption band of the light-emitting substance, energy can be transferred smoothly and light emission can be obtained efficiently. With this structure, high efficiency, low-voltage driving, and a long lifetime of the light-emitting element can be achieved at the same time.

In the combination of materials for forming an exciplex, the HOMO level (highest occupied molecular orbital level) of the hole-transport material is preferably higher than or equal to the HOMO level of the electron-transport material. The LUMO level (lowest unoccupied molecular orbital level) of the hole-transport material is preferably higher than or equal to the LUMO level of the electron-transport material. The LUMO levels and the HOMO levels of the materials can be derived from the electrochemical characteristics (reduction potentials and oxidation potentials) of the materials that are measured by cyclic voltammetry (CV).

Note that the formation of an exciplex can be confirmed by a phenomenon in which the emission spectrum of a mixed film in which the hole-transport material and the electron-transport material are mixed is shifted to the longer wavelength side than the emission spectrum of each of the materials (or has another peak on the longer wavelength side), observed by comparison of the emission spectra of the hole-transport material, the electron-transport material, and the mixed film of these materials, for example. Alternatively, the formation of an exciplex can be confirmed by a difference in transient response, such as a phenomenon in which the transient photoluminescence (PL) lifetime of the mixed film has longer lifetime components or has a larger proportion of delayed components than that of each of the materials, observed by comparison of the transient PL of the hole-transport material, the transient PL of the electron-transport material, and the transient PL of the mixed film of these materials. The transient PL can be rephrased as transient electroluminescence (EL). That is, the formation of an exciplex can also be confirmed by a difference in transient response observed by comparison of the transient EL of the hole-transport material, the transient EL of the electron-transport material, and the transient EL of the mixed film of these materials.

The active layer 273 includes a semiconductor. Examples of the semiconductor include an inorganic semiconductor such as silicon and an organic semiconductor containing an organic compound. This embodiment shows an example in which an organic semiconductor is used as the semiconductor included in the active layer 273. The use of an organic semiconductor is preferable because the light-emitting layer 283 and the active layer 273 can be formed by the same method (e.g., a vacuum evaporation method) and thus the same manufacturing apparatus can be used.

Examples of an n-type semiconductor material contained in the active layer 273 are electron-accepting organic semiconductor materials such as fullerene (e.g., $C_{60}$ and $C_{70}$) and a fullerene derivative. Fullerene has a soccer ball-like shape, which is energetically stable. Both the HOMO level and the LUMO level of fullerene are deep (low). Having a deep LUMO level, fullerene has an extremely high electron-accepting property (acceptor property). When π-electron conjugation (resonance) spreads in a plane as in benzene, the electron-donating property (donor property) usually increases. Although π-electrons widely spread in fullerene having a spherical shape, its electron-accepting property is high. The high electron-accepting property efficiently causes rapid charge separation and is useful for a light-receiving element. Both $C_{60}$ and $C_{70}$ have a wide absorption band in the visible light region, and $C_{70}$ is especially preferable because of having a larger π-electron conjugation system and a wider absorption band in the long wavelength region than $C_{60}$.

Examples of the n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material contained in the active layer 273 include electron-donating organic semiconductor materials such as copper(II) phthalocyanine (CuPc), tetraphenyldibenzoperiflanthene (DBP), zinc phthalocyanine (ZnPc), tin phthalocyanine (SnPc), and quinacridone.

Examples of a p-type semiconductor material include a carbazole derivative, a thiophene derivative, a furan derivative, and a compound having an aromatic amine skeleton. Other examples of the p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of similar kinds, which have molecular orbital energy levels close to each other, can improve the carrier-transport property.

For example, the active layer 273 is preferably formed by co-evaporation of an n-type semiconductor and a p-type semiconductor. Alternatively, the active layer 273 may be formed by stacking an n-type semiconductor and a p-type semiconductor.

Either a low molecular compound or a high molecular compound can be used for the light-emitting element and the light-receiving element, and an inorganic compound may also be contained. Each of the layers included in the light-emitting element and the light-receiving element can be formed by an evaporation method (including a vacuum evaporation method), a transfer method, a printing method, an inkjet method, a coating method, or the like.

Figure 11B:
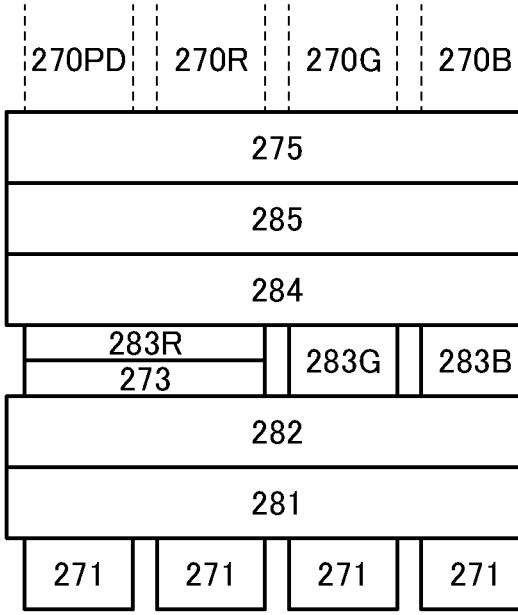

A display apparatus 280B illustrated in FIG. 11B is different from the display apparatus 280A in that the light-receiving element 270PD and the light-emitting element 270R have the same structure.

The light-receiving element 270PD and the light-emitting element 270R share the active layer 273 and the light-emitting layer 283R.

Here, it is preferable that the light-receiving element 270PD have a structure in common with the light-emitting element that emits light with a wavelength longer than that of the light desired to be detected. For example, the light-receiving element 270PD having a structure in which blue light is detected can have a structure which is similar to that of one or both of the light-emitting element 270R and the light-emitting element 270G. For example, the light-receiving element 270PD having a structure in which green light is detected can have a structure similar to that of the light-emitting element 270R.

When the light-receiving element 270PD and the light-emitting element 270R have a common structure, the number of deposition steps and the number of masks can be smaller than those for the structure in which the light-receiving element 270PD and the light-emitting element 270R include separately formed layers. As a result, the number of manufacturing steps and the manufacturing cost of the display apparatus can be reduced.

When the light-receiving element 270PD and the light-emitting element 270R have a common structure, a margin for misalignment can be narrower than that for the structure in which the light-receiving element 270PD and the light-emitting element 270R include separately formed layers. Accordingly, the aperture ratio of a pixel can be increased, so that the light extraction efficiency of the display apparatus can be increased. This can extend the life of the light-emitting element. Furthermore, the display apparatus can exhibit a high luminance. Moreover, the resolution of the display apparatus can also be increased.

The light-emitting layer 283R includes a light-emitting material that emits red light. The active layer 273 contains an organic compound that absorbs light with a wavelength shorter than that of red light (e.g., one or both of green light and blue light). The active layer 273 preferably contains an organic compound that does not easily absorb red light and that absorbs light with a wavelength shorter than that of red light. In this way, red light can be efficiently extracted from the light-emitting element 270R, and the light-receiving element 270PD can detect light with a wavelength shorter than that of red light at high accuracy.

Although the light-emitting element 270R and the light-receiving element 270PD have the same structure in an example of the display apparatus 280B, the light-emitting element 270R and the light-receiving element 270PD may include optical adjustment layers with different thicknesses.

Figure 12A:
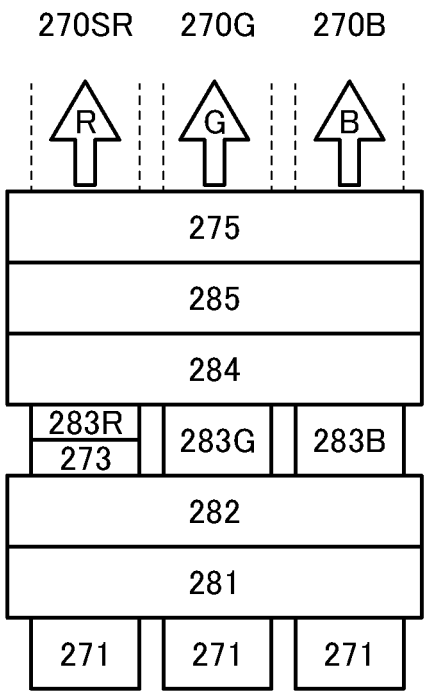
FIG. 12A to FIG. 12G are diagrams illustrating structure examples of display apparatuses.
Figure 12B:
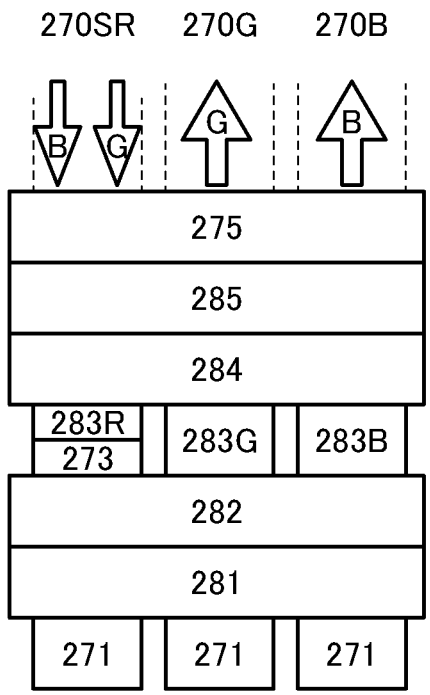

A display apparatus 280C illustrated in FIG. 12A and FIG. 12B includes a light-emitting and light-receiving element 270SR that emits red (R) light and has a light-receiving function, the light-emitting element 270G, and the light-emitting element 270B. The above description of the display apparatus 280A and the like can be referred to for the structures of the light-emitting element 270G and the light-emitting element 270B.

The light-emitting and light-receiving element 270SR includes the pixel electrode 271, the hole-injection layer 281, the hole-transport layer 282, the active layer 273, the light-emitting layer 283R, the electron-transport layer 284, the electron-injection layer 285, and the common electrode 275, which are stacked in this order. The light-emitting and light-receiving element 270SR has the same structure as the light-emitting element 270R and the light-receiving element 270PD in the display apparatus 280B.

FIG. 12A illustrates a case where the light-emitting and light-receiving element 270SR functions as a light-emitting element. In the example of FIG. 12A, the light-emitting element 270B emits blue light, the light-emitting element 270G emits green light, and the light-emitting and light-receiving element 270SR emits red light.

FIG. 12B illustrates a case where the light-emitting and light-receiving element 270SR functions as a light-receiving element. In FIG. 12B, the light-emitting and light-receiving element 270SR detects blue light emitted by the light-emitting element 270B and green light emitted by the light-emitting element 270G.

The light-emitting element 270B, the light-emitting element 270G, and the light-emitting and light-receiving element 270SR each include the pixel electrode 271 and the common electrode 275. In this embodiment, the case where the pixel electrode 271 functions as an anode and the common electrode 275 functions as a cathode is described as an example. When the light-emitting and light-receiving element 270SR is driven by application of reverse bias between the pixel electrode 271 and the common electrode 275, light incident on the light-emitting and light-receiving element 270SR can be detected and charge can be generated and extracted as current.

Note that it can be said that the light-emitting and light-receiving element 270SR has a structure in which the active layer 273 is added to the light-emitting element. That is, the light-emitting and light-receiving element 270SR can be formed concurrently with the formation of the light-emitting element only by adding a step of depositing the active layer 273 in the manufacturing process of the light-emitting element. The light-emitting element and the light-emitting and light-receiving element can be formed over one substrate. Thus, the display portion can be provided with one or both of an image capturing function and a sensing function without a significant increase in the number of manufacturing steps.

The stacking order of the light-emitting layer 283R and the active layer 273 is not limited. FIG. 12A and FIG. 12B each illustrate an example in which the active layer 273 is provided over the hole-transport layer 282, and the light-emitting layer 283R is provided over the active layer 273. The stacking order of the light-emitting layer 283R and the active layer 273 may be reversed.

The light-emitting and light-receiving element may exclude at least one layer of the hole-injection layer 281, the hole-transport layer 282, the electron-transport layer 284, and the electron-injection layer 285. Furthermore, the light-emitting and light-receiving element may include another functional layer such as a hole-blocking layer or an electron-blocking layer.

In the light-emitting and light-receiving element, a conductive film that transmits visible light is used as the electrode through which light is extracted. A conductive film that reflects visible light is preferably used as the electrode through which light is not extracted.

The functions and materials of the layers constituting the light-emitting and light-receiving element are similar to those of the layers constituting the light-emitting elements and the light-receiving element and are not described in detail.

FIG. 12C to FIG. 12G illustrate examples of stacked-layer structures of light-emitting and light-receiving elements.

Figures 12C, 12D, 12E, 12F, 12G:
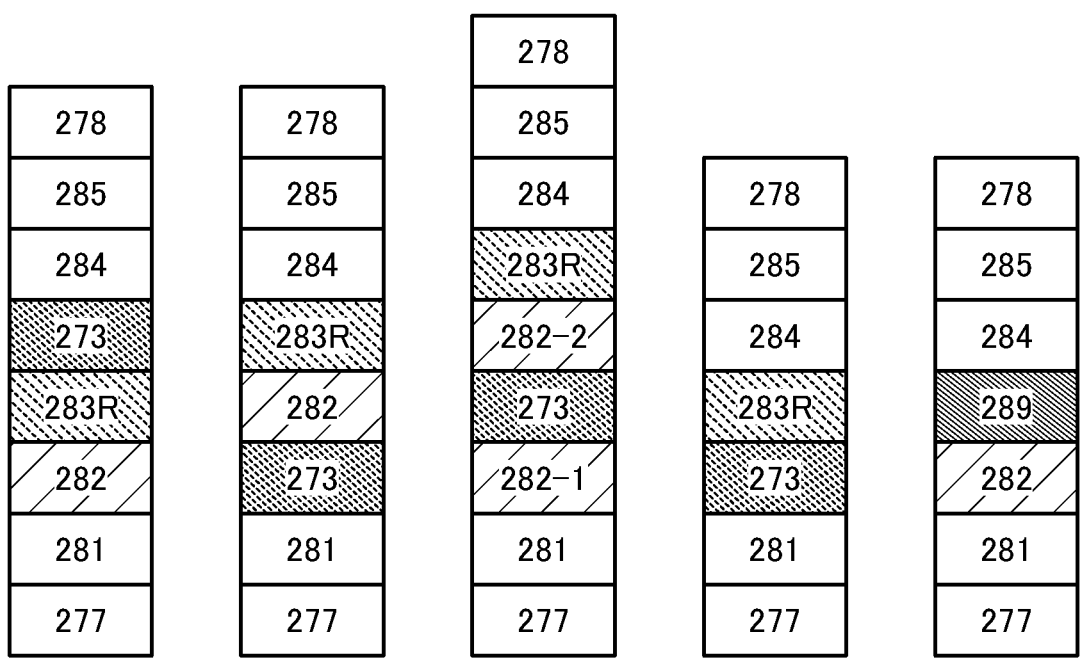

The light-emitting and light-receiving element illustrated in FIG. 12C includes a first electrode 277, the hole-injection layer 281, the hole-transport layer 282, the light-emitting layer 283R, the active layer 273, the electron-transport layer 284, the electron-injection layer 285, and a second electrode 278.

FIG. 12C illustrates an example in which the light-emitting layer 283R is provided over the hole-transport layer 282, and the active layer 273 is stacked over the light-emitting layer 283R.

As illustrated in FIG. 12A to FIG. 12C, the active layer 273 and the light-emitting layer 283R may be in contact with each other.

A buffer layer is preferably provided between the active layer 273 and the light-emitting layer 283R. In this case, the buffer layer preferably has a hole-transport property and an electron-transport property. For example, a substance with a bipolar property is preferably used for the buffer layer. Alternatively, as the buffer layer, at least one layer of a hole-injection layer, a hole-transport layer, an electron-transport layer, an electron-injection layer, a hole-blocking layer, an electron-blocking layer, and the like can be used. FIG. 12D illustrates an example in which the hole-transport layer 282 is used as the buffer layer.

The buffer layer provided between the active layer 273 and the light-emitting layer 283R can inhibit transfer of excitation energy from the light-emitting layer 283R to the active layer 273. Furthermore, the buffer layer can also be used to adjust the optical path length (cavity length) of the microcavity structure. Thus, high emission efficiency can be obtained from a light-emitting and light-receiving element including the buffer layer between the active layer 273 and the light-emitting layer 283R.

FIG. 12E illustrates an example of a stacked-layer structure in which a hole-transport layer 282-1, the active layer 273, a hole-transport layer 282-2, and the light-emitting layer 283R are stacked in this order over the hole-injection layer 281. The hole-transport layer 282-2 functions as a buffer layer. The hole-transport layer 282-1 and the hole-transport layer 282-2 may contain the same material or different materials. Instead of the hole-transport layer 282-2, any of the above layers that can be used as the buffer layer may be used. The positions of the active layer 273 and the light-emitting layer 283R may be interchanged.

The light-emitting and light-receiving element illustrated in FIG. 12F is different from the light-emitting and light-receiving element illustrated in FIG. 12A in not including the hole-transport layer 282. In this manner, the light-emitting and light-receiving element may exclude at least one layer of the hole-injection layer 281, the hole-transport layer 282, the electron-transport layer 284, and the electron-injection layer 285. Furthermore, the light-emitting and light-receiving element may include another functional layer such as a hole-blocking layer or an electron-blocking layer.

The light-emitting and light-receiving element illustrated in FIG. 12G is different from the light-emitting and light-receiving element illustrated in FIG. 12A in including a layer 289 serving as both a light-emitting layer and an active layer instead of including the active layer 273 and the light-emitting layer 283R.

As the layer serving as both a light-emitting layer and an active layer, a layer containing three materials which are an n-type semiconductor that can be used for the active layer 273, a p-type semiconductor that can be used for the active layer 273, and a light-emitting substance that can be used for the light-emitting layer 283R can be used, for example.

Note that an absorption band on the lowest energy side of an absorption spectrum of a mixed material of the n-type semiconductor and the p-type semiconductor and a maximum peak of an emission spectrum (PL spectrum) of the light-emitting substance preferably do not overlap each other and are further preferably positioned fully apart from each other.

Structure Example 2 of Display Apparatus

A detailed structure of the display apparatus of one embodiment of the present invention will be described below. Here, in particular, an example of the display apparatus including light-receiving elements and light-emitting elements will be described.

Structure Example 2-1

Figure 13A:
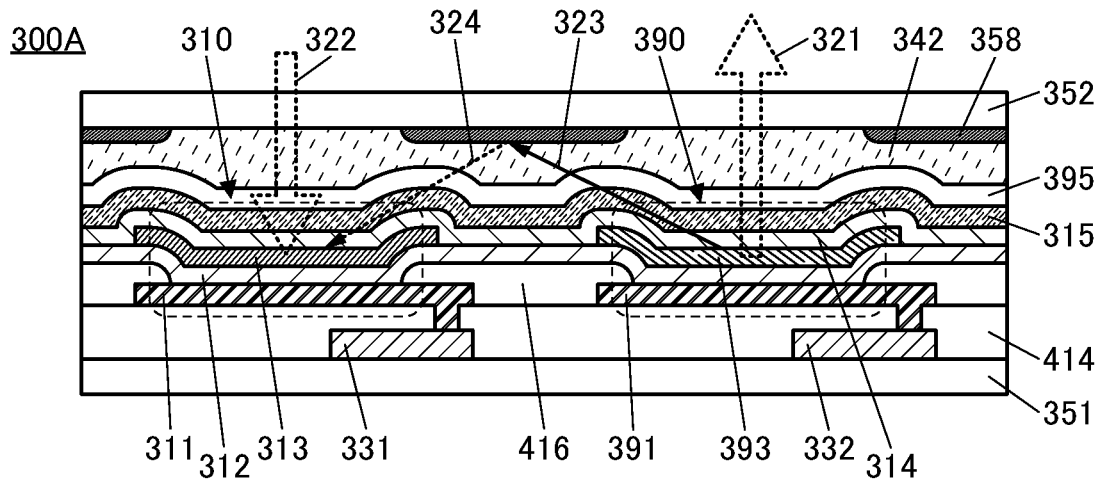
FIG. 13A to FIG. 13C are diagrams illustrating structure examples of display apparatuses.

FIG. 13A illustrates a cross-sectional view of a display apparatus 300A. The display apparatus 300A includes a substrate 351, a substrate 352, a light-receiving element 310, and a light-emitting element 390.

The light-emitting element 390 includes a pixel electrode 391, a buffer layer 312, a light-emitting layer 393, a buffer layer 314, and a common electrode 315, which are stacked in this order. The buffer layer 312 can include one or both of a hole-injection layer and a hole-transport layer. The light-emitting layer 393 contains an organic compound. The buffer layer 314 can include one or both of an electron-injection layer and an electron-transport layer. The light-emitting element 390 has a function of emitting visible light 321. Note that the display apparatus 300A may also include a light-emitting element having a function of emitting infrared light.

The light-receiving element 310 includes a pixel electrode 311, the buffer layer 312, an active layer 313, the buffer layer 314, and the common electrode 315, which are stacked in this order. The active layer 313 contains an organic compound. The light-receiving element 310 has a function of detecting visible light. Note that the light-receiving element 310 may also have a function of detecting infrared light.

The buffer layer 312, the buffer layer 314, and the common electrode 315 are common layers shared by the light-emitting element 390 and the light-receiving element 310 and provided across them. The buffer layer 312, the buffer layer 314, and the common electrode 315 each include a portion overlapping with the active layer 313 and the pixel electrode 311, a portion overlapping with the light-emitting layer 393 and the pixel electrode 391, and a portion overlapping with none of them.

This embodiment is described assuming that the pixel electrode functions as an anode and the common electrode 315 functions as a cathode in both of the light-emitting element 390 and the light-receiving element 310. In other words, the light-receiving element 310 is driven by application of reverse bias between the pixel electrode 311 and the common electrode 315, so that light incident on the light-receiving element 310 can be detected and charge can be generated and extracted as current in the display apparatus 300A.

The pixel electrode 311, the pixel electrode 391, the buffer layer 312, the active layer 313, the buffer layer 314, the light-emitting layer 393, and the common electrode 315 may each have a single-layer structure or a stacked-layer structure.

The pixel electrode 311 and the pixel electrode 391 are each positioned over an insulating layer 414. The pixel electrodes can be formed using the same material in the same step. An end portion of the pixel electrode 311 and an end portion of the pixel electrode 391 are covered with a partition 416. Two adjacent pixel electrodes are electrically insulated (electrically isolated) from each other by the partition 416.

An organic insulating film is suitable for the partition 416. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins. The partition 416 is a layer that transmits visible light. A partition that blocks visible light may be provided instead of the partition 416.

The common electrode 315 is a layer shared by the light-receiving element 310 and the light-emitting element 390.

The material, thickness, and the like of the pair of electrodes can be the same between the light-receiving element 310 and the light-emitting element 390. Accordingly, the manufacturing cost of the display apparatus can be reduced, and the manufacturing process of the display apparatus can be simplified.

The display apparatus 300A includes the light-receiving element 310, the light-emitting element 390, a transistor 331, a transistor 332, and the like between a pair of substrates (the substrate 351 and the substrate 352).

In the light-receiving element 310, the buffer layer 312, the active layer 313, and the buffer layer 314, which are positioned between the pixel electrode 311 and the common electrode 315, can each be referred to as an organic layer (a layer containing an organic compound). The pixel electrode 311 preferably has a function of reflecting visible light. The common electrode 315 has a function of transmitting visible light. Note that in the case where the light-receiving element 310 is configured to detect infrared light, the common electrode 315 has a function of transmitting infrared light. Furthermore, the pixel electrode 311 preferably has a function of reflecting infrared light.

The light-receiving element 310 has a function of detecting light. Specifically, the light-receiving element 310 is a photoelectric conversion element that receives light 322 incident from the outside of the display apparatus 300A and converts it into an electric signal. The light 322 can also be expressed as light that is emitted from the light-emitting element 390 and then reflected by an object. The light 322 may be incident on the light-receiving element 310 through a lens or the like provided in the display apparatus 300A.

In the light-emitting element 390, the buffer layer 312, the light-emitting layer 393, and the buffer layer 314, which are positioned between the pixel electrode 391 and the common electrode 315, can be collectively referred to as an EL layer. The EL layer includes at least the light-emitting layer 393. As described above, the pixel electrode 391 preferably has a function of reflecting visible light. The common electrode 315 has a function of transmitting visible light. Note that in the case where the display apparatus 300A includes a light-emitting element that emits infrared light, the common electrode 315 has a function of transmitting infrared light. Furthermore, the pixel electrode 391 preferably has a function of reflecting infrared light.

The light-emitting elements included in the display apparatus of this embodiment preferably employ a micro optical resonator (microcavity) structure. The light-emitting element 390 may include an optical adjustment layer between the pixel electrode 391 and the common electrode 315. The use of the micro resonator structure enables light of a specific color to be intensified and extracted from each of the light-emitting elements.

The light-emitting element 390 has a function of emitting visible light. Specifically, the light-emitting element 390 is an electroluminescent element that emits light (here, the visible light 321) to the substrate 352 side when voltage is applied between the pixel electrode 391 and the common electrode 315.

The pixel electrode 311 included in the light-receiving element 310 is electrically connected to a source or a drain of the transistor 331 through an opening provided in the insulating layer 414. The pixel electrode 391 included in the light-emitting element 390 is electrically connected to a source or a drain of the transistor 332 through an opening provided in the insulating layer 414.

The transistor 331 and the transistor 332 are on and in contact with the same layer (the substrate 351 in FIG. 13A).

At least part of a circuit electrically connected to the light-receiving element 310 and a circuit electrically connected to the light-emitting element 390 are preferably formed using the same material in the same step. In that case, the thickness of the display apparatus can be reduced compared with the case where the two circuits are separately formed, resulting in simplification of the manufacturing process.

The light-receiving element 310 and the light-emitting element 390 are each preferably covered with a protective layer 395. In FIG. 13A, the protective layer 395 is provided on and in contact with the common electrode 315. Providing the protective layer 395 can inhibit entry of impurities such as water into the light-receiving element 310 and the light-emitting element 390, so that the reliability of the light-receiving element 310 and the light-emitting element 390 can be increased. The protective layer 395 and the substrate 352 are bonded to each other with an adhesive layer 342.

A light-blocking layer 358 is provided on the surface of the substrate 352 on the substrate 351 side. The light-blocking layer 358 has openings in a position overlapping with the light-emitting element 390 and in a position overlapping with the light-receiving element 310.

Here, the light-receiving element 310 detects light that is emitted from the light-emitting element 390 and then reflected by an object. However, in some cases, light emitted from the light-emitting element 390 is reflected inside the display apparatus 300A and is incident on the light-receiving element 310 without through an object. The light-blocking layer 358 can reduce the influence of such stray light. For example, in the case where the light-blocking layer 358 is not provided, light 323 emitted from the light-emitting element 390 is reflected by the substrate 352 and reflected light 324 is incident on the light-receiving element 310 in some cases. Providing the light-blocking layer 358 can inhibit the reflected light 324 to be incident on the light-receiving element 310. Consequently, noise can be reduced, and the sensitivity of a sensor using the light-receiving element 310 can be increased.

For the light-blocking layer 358, a material that blocks light emitted from the light-emitting element can be used. The light-blocking layer 358 preferably absorbs visible light. As the light-blocking layer 358, a black matrix can be formed using a metal material or a resin material containing pigment (e.g., carbon black) or dye, for example. The light-blocking layer 358 may have a stacked-layer structure of a red color filter, a green color filter, and a blue color filter.

Structure Example 2-2

Figure 13B:
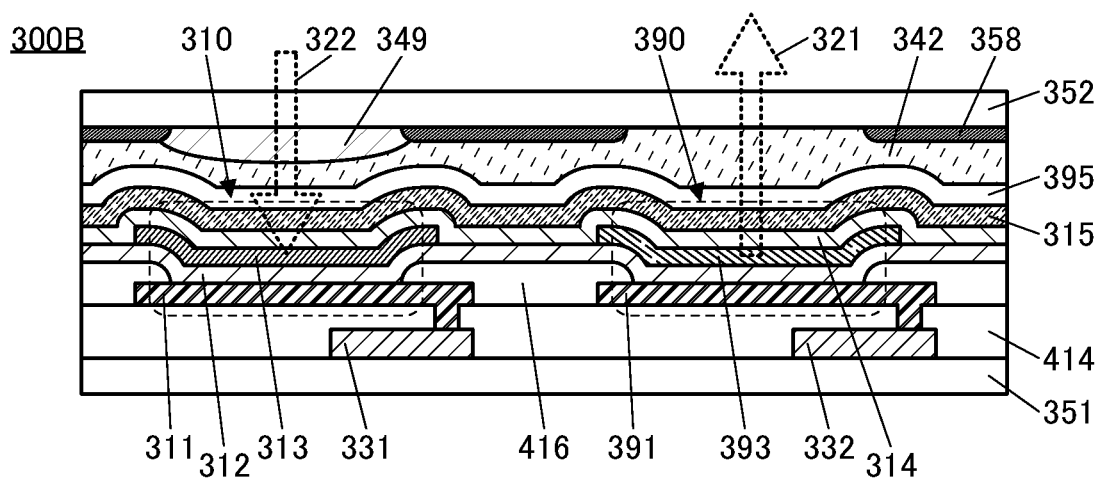

A display apparatus 300B illustrated in FIG. 13B differs from the display apparatus 300A mainly in including a lens 349.

The lens 349 is provided on a surface of the substrate 352 on the substrate 351 side. The light 322 from the outside is incident on the light-receiving element 310 through the lens 349. For each of the lens 349 and the substrate 352, a material that has high visible-light-transmitting property is preferably used.

When light is incident on the light-receiving element 310 through the lens 349, the range of light incident on the light-receiving element 310 can be narrowed. Thus, overlap of image capturing ranges between a plurality of light-receiving elements 310 can be inhibited, whereby a clear image with little blurring can be captured.

In addition, the lens 349 can condense incident light. Accordingly, the amount of light to be incident on the light-receiving element 310 can be increased. This can increase the photoelectric conversion efficiency of the light-receiving element 310.

Structure Example 2-3

Figure 13C:
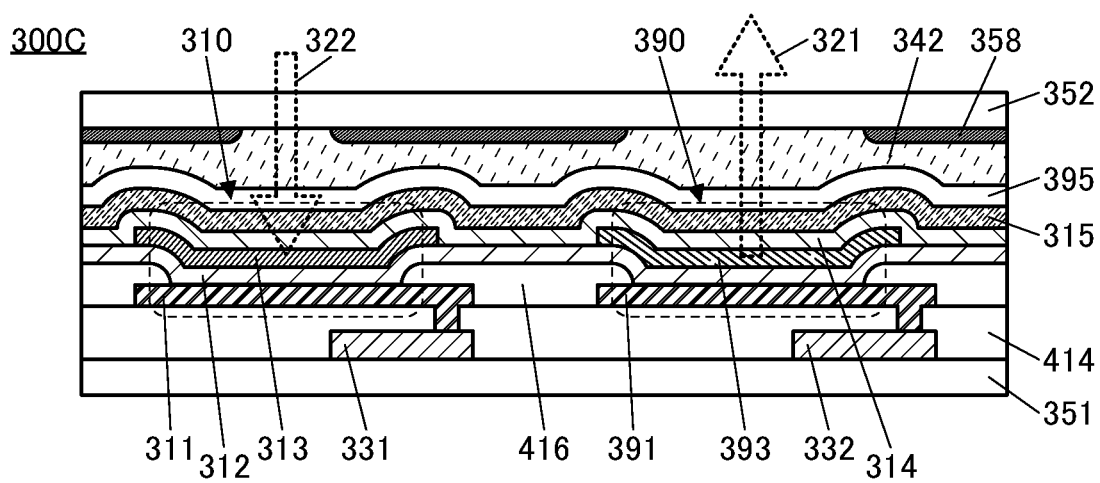

A display apparatus 300C illustrated in FIG. 13C differs from the display apparatus 300A in the shape of the light-blocking layer 358.

The light-blocking layer 358 is provided so that an opening portion overlapping with the light-receiving element 310 is positioned on an inner side of the light-receiving region of the light-receiving element 310 in a plan view. The smaller the diameter of the opening portion overlapping with the light-receiving element 310 of the light-blocking layer 358 is, the narrower the range of light incident on the light-receiving element 310 becomes. Thus, overlap of image capturing ranges between a plurality of light-receiving elements 310 can be inhibited, whereby a clear image with little blurring can be captured.

For example, the area of the opening portion of the light-blocking layer 358 can be less than or equal to 80%, less than or equal to 70%, less than or equal to 60%, less than or equal to 50%, or less than or equal to 40% and greater than or equal to 1%, greater than or equal to 5%, or greater than or equal to 10% of the area of the light-receiving region of the light-receiving element 310. A clearer image can be obtained as the area of the opening portion of the light-blocking layer 358 becomes smaller. In contrast, when the area of the opening portion is too small, the amount of light reaching the light-receiving element 310 might be reduced to reduce light sensitivity. Therefore, the area of the opening is preferably set within the above-described range. The above upper limits and lower limits can be combined freely. Furthermore, the light-receiving region of the light-receiving element 310 can be referred to as the opening portion of the partition 416.

Note that the center of the opening portion of the light-blocking layer 358 overlapping with the light-receiving element 310 may be shifted from the center of the light-receiving region of the light-receiving element 310 in a plan view. Moreover, a structure in which the opening portion of the light-blocking layer 358 does not overlap with the light-receiving region of the light-receiving element 310 in a plan view may be employed. Thus, only oblique light that has passed through the opening portion of the light-blocking layer 358 can be received by the light-receiving element 310. Accordingly, the range of light incident on the light-receiving element 310 can be limited more effectively, so that a clear image can be captured.

Structure Example 2-4

Figure 14A:
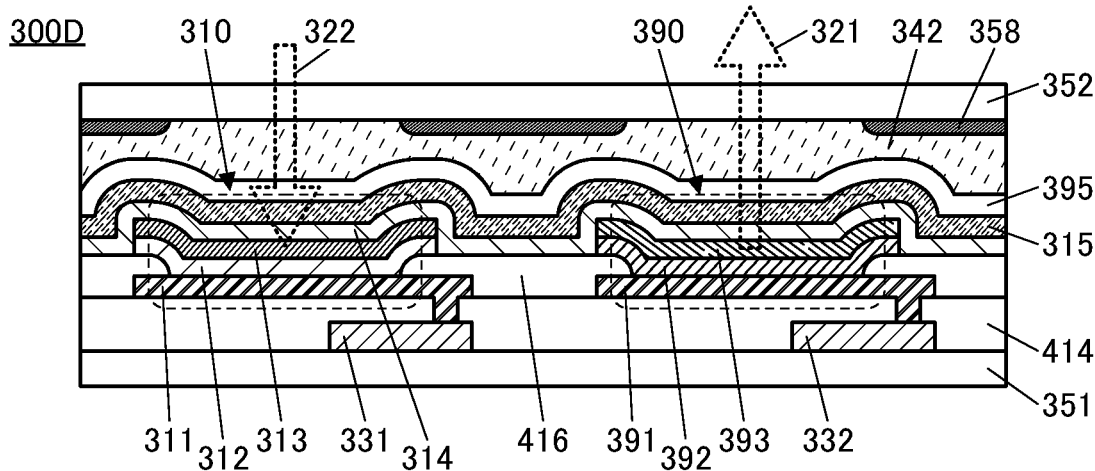
FIG. 14A to FIG. 14C are diagrams illustrating structure examples of display apparatuses.

A display apparatus 300D illustrated in FIG. 14A differs from the display apparatus 300A mainly in that the buffer layer 312 is not a common layer.

The light-receiving element 310 includes the pixel electrode 311, the buffer layer 312, the active layer 313, the buffer layer 314, and the common electrode 315. The light-emitting element 390 includes the pixel electrode 391, a buffer layer 392, the light-emitting layer 393, the buffer layer 314, and the common electrode 315. Each of the active layer 313, the buffer layer 312, the light-emitting layer 393, and the buffer layer 392 has an island-shaped top surface.

The buffer layer 312 and the buffer layer 392 may contain different materials or the same material.

As described above, when the buffer layers are formed separately in the light-emitting element 390 and the light-receiving element 310, the degree of freedom for selecting materials of the buffer layers included in the light-emitting element 390 and the light-receiving element 310 can be increased, which facilitates optimization. In addition, the buffer layer 314 and the common electrode 315 are common layers, whereby the manufacturing process can be simplified and manufacturing cost can be reduced as compared to the case where the light-emitting element 390 and the light-receiving element 310 are manufactured separately.

Structure Example 2-5

Figure 14B:
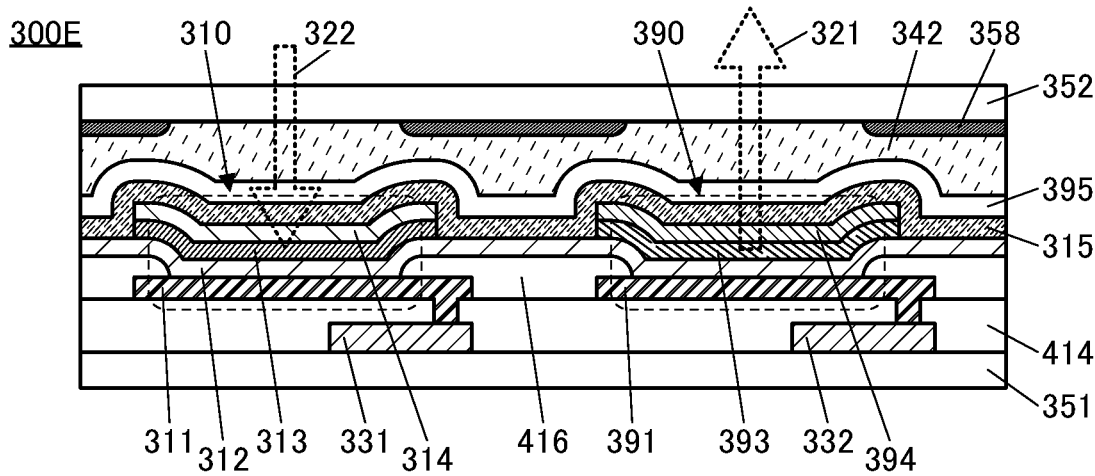

A display apparatus 300E illustrated in FIG. 14B differs from the display apparatus 300A mainly in that the buffer layer 314 is not a common layer.

The light-receiving element 310 includes the pixel electrode 311, the buffer layer 312, the active layer 313, the buffer layer 314, and the common electrode 315. The light-emitting element 390 includes the pixel electrode 391, the buffer layer 312, the light-emitting layer 393, a buffer layer 394, and the common electrode 315. Each of the active layer 313, the buffer layer 314, the light-emitting layer 393, and the buffer layer 394 has an island-shaped top surface.

The buffer layer 314 and the buffer layer 394 may contain different materials or the same material.

As described above, when the buffer layers are formed separately in the light-emitting element 390 and the light-receiving element 310, the degree of freedom for selecting materials of the buffer layers included in the light-emitting element 390 and the light-receiving element 310 can be increased, which facilitates optimization. In addition, the buffer layer 312 and the common electrode 315 are common layers, whereby the manufacturing process can be simplified and manufacturing cost can be reduced as compared to the case where the light-emitting element 390 and the light-receiving element 310 are manufactured separately.

Structure Example 2-6

Figure 14C:
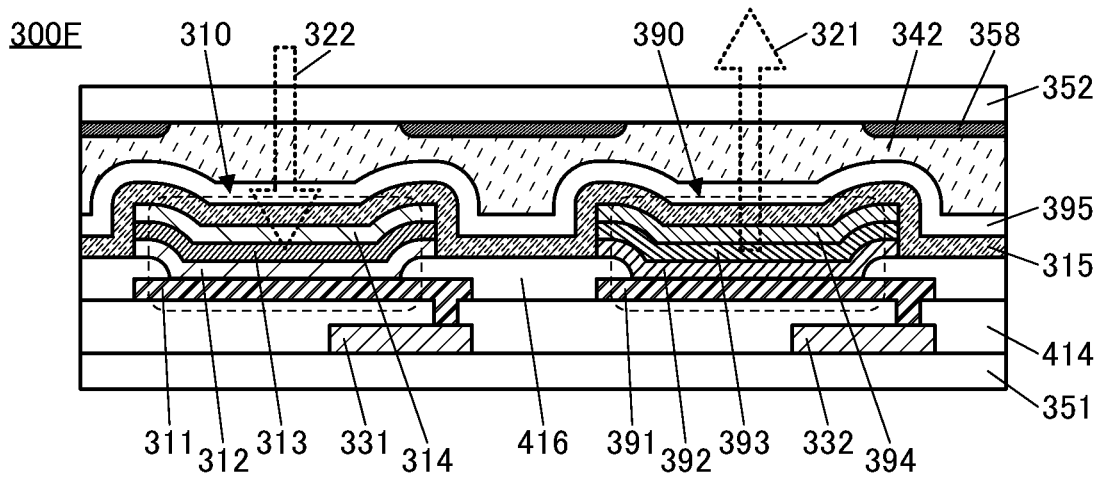

A display apparatus 300F illustrated in FIG. 14C differs from the display apparatus 300A mainly in that the buffer layer 312 and the buffer layer 314 are not common layers.

The light-receiving element 310 includes the pixel electrode 311, the buffer layer 312, the active layer 313, the buffer layer 314, and the common electrode 315. The light-emitting element 390 includes the pixel electrode 391, the buffer layer 392, the light-emitting layer 393, the buffer layer 394, and the common electrode 315. Each of the buffer layer 312, the active layer 313, the buffer layer 314, the buffer layer 392, the light-emitting layer 393, and the buffer layer 394 has an island-shaped top surface.

As described above, when the buffer layers are formed separately in the light-emitting element 390 and the light-receiving element 310, the degree of freedom for selecting materials of the buffer layers included in the light-emitting element 390 and the light-receiving element 310 can be increased, which facilitates optimization. In addition, the common electrode 315 is a common layer, whereby the manufacturing process can be simplified and manufacturing cost can be reduced as compared to the case where the light-emitting element 390 and the light-receiving element 310 are manufactured separately.

Structure Example 3 of Display Apparatus

A detailed structure of the display apparatus of one embodiment of the present invention will be described below. Here, in particular, an example of the display apparatus including light-emitting and light-receiving elements and light-emitting elements will be described.

Note that in the description below, the above description is referred to for portions similar to those described above and the description of the portions is omitted in some cases.

Structure Example 3-1

Figure 15A:
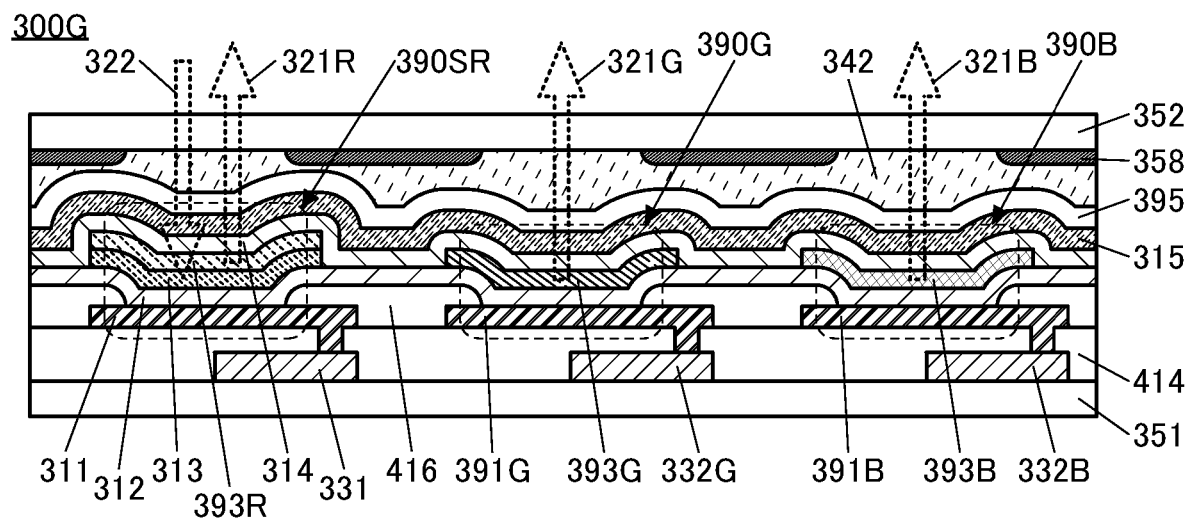
FIG. 15A and FIG. 15B are diagrams illustrating structure examples of display apparatuses.

FIG. 15A illustrates a cross-sectional view of a display apparatus 300G. The display apparatus 300G includes a light-emitting and light-receiving element 390SR, a light-emitting element 390G, and a light-emitting element 390B.

The light-emitting and light-receiving element 390SR has a function of a light-emitting element that emits red light 321R, and a function of a photoelectric conversion element that receives the light 322. The light-emitting element 390G can emit green light 321G. The light-emitting element 390B can emit blue light 321B.

The light-emitting and light-receiving element 390SR includes the pixel electrode 311, the buffer layer 312, the active layer 313, a light-emitting layer 393R, the buffer layer 314, and the common electrode 315. The light-emitting element 390G includes a pixel electrode 391G, the buffer layer 312, a light-emitting layer 393G, the buffer layer 314, and the common electrode 315. The light-emitting element 390B includes a pixel electrode 391B, the buffer layer 312, a light-emitting layer 393B, the buffer layer 314, and the common electrode 315.

The buffer layer 312, the buffer layer 314, and the common electrode 315 are common layers shared by the light-emitting and light-receiving element 390SR, the light-emitting element 390G, and the light-emitting element 390B and provided across them. Each of the active layer 313, the light-emitting layer 393R, the light-emitting layer 393G, and the light-emitting layer 393B has an island-shaped top surface. Note that although the stack body including the active layer 313 and the light-emitting layer 393R, the light-emitting layer 393G, and the light-emitting layer 393B are provided separately from one another in the example illustrated in FIG. 15, and adjacent two of them may include a region where the two overlaps each other.

Note that as in the case of the display apparatus 300D, the display apparatus 300E, or the display apparatus 300F, the display apparatus 300G can have a structure in which one or both of the buffer layer 312 and the buffer layer 314 are not used as common layers.

The pixel electrode 311 is electrically connected to one of the source and the drain of the transistor 331. The pixel electrode 391G is electrically connected to one of a source and a drain of the transistor 332G. The pixel electrode 391B is electrically connected to one of a source and a drain of a transistor 332B.

With such a structure, a display apparatus with higher resolution can be achieved.

Structure Example 3-2

Figure 15B:
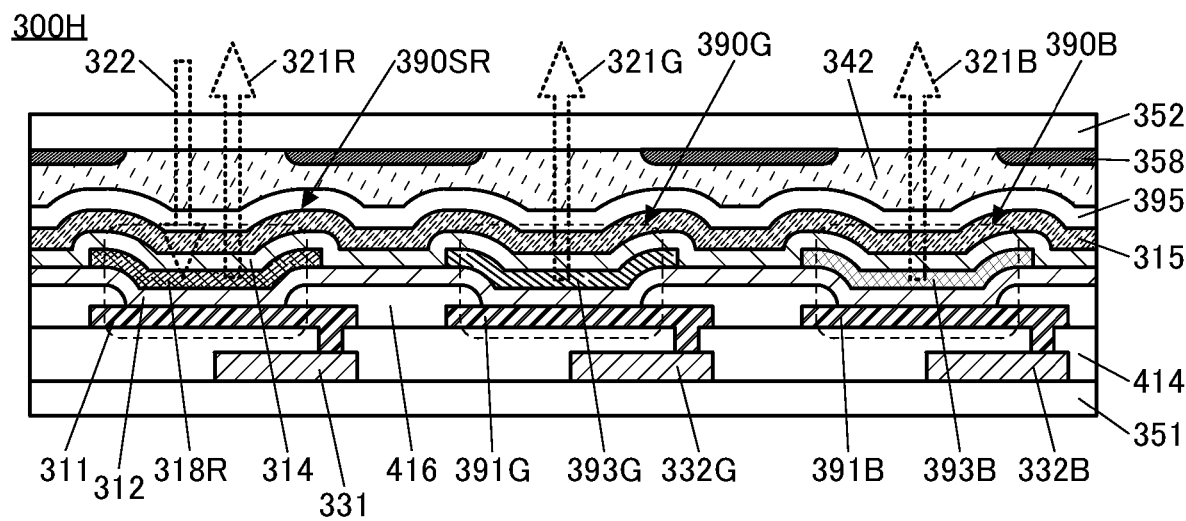

A display apparatus 300H illustrated in FIG. 15B differs from the display apparatus 300G mainly in the structure of the light-emitting and light-receiving element 390SR.

The light-emitting and light-receiving element 390SR includes a light-emitting and light-receiving layer 318R instead of the active layer 313 and the light-emitting layer 393R.

The light-emitting and light-receiving layer 318R is a layer that has both a function of a light-emitting layer and a function of an active layer. For example, a layer including the above-described light-emitting substance, an n-type semiconductor, and a p-type semiconductor can be used.

With such a structure, the manufacturing process can be simplified, facilitating cost reduction.

Structure Example 4 of Display Apparatus

A more specific structure of the display apparatus of one embodiment of the present invention will be described below.

Figure 16:
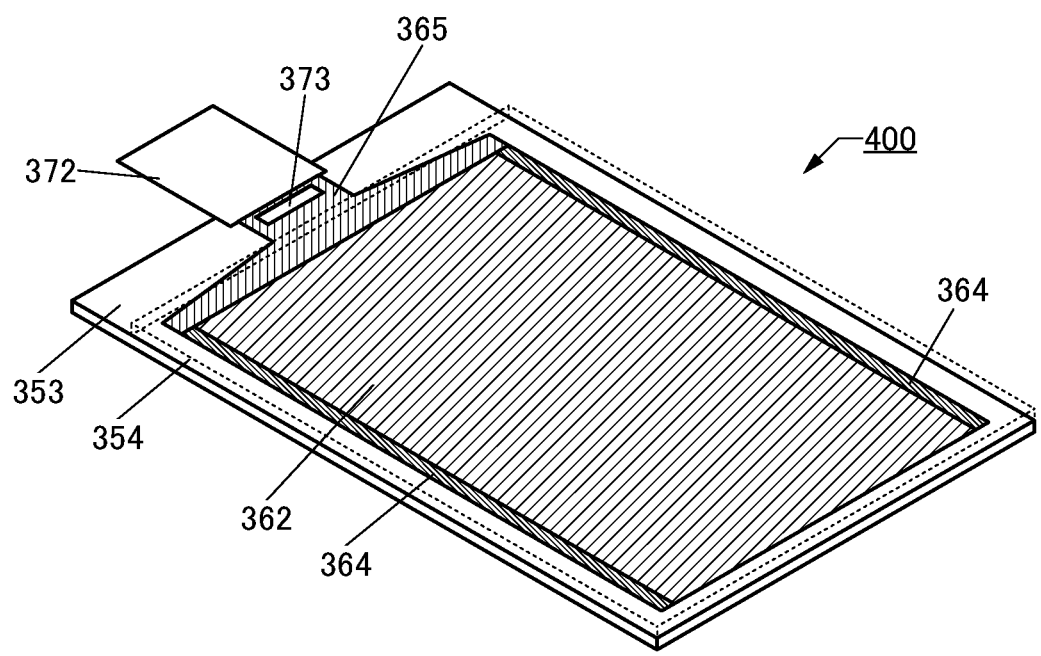
FIG. 16 is a diagram illustrating a structure example of a display apparatus.

FIG. 16 illustrates a perspective view of a display apparatus 400, and FIG. 17A illustrates a cross-sectional view of the display apparatus 400.

In the display apparatus 400, a substrate 353 and a substrate 354 are bonded to each other. In FIG. 16, the substrate 354 is denoted by a dashed line.

The display apparatus 400 includes a display portion 362, a circuit 364, a wiring 365, and the like. FIG. 16 illustrates an example in which the display apparatus 400 is provided with an IC (integrated circuit) 373 and an FPC 372. Thus, the structure illustrated in FIG. 16 can also be regarded as a display module including the display apparatus 400, the IC, and the FPC.

As the circuit 364, for example, a scan line driver circuit can be used.

The wiring 365 has a function of supplying a signal and power to the display portion 362 and the circuit 364. The signal and power are input to the wiring 365 from the outside through the FPC 372 or input to the wiring 365 from the IC 373.

FIG. 16 illustrates an example in which the IC 373 is provided over the substrate 353 by a COG (Chip On Glass) method, a COF (Chip On Film) method, or the like. An IC including a scan line driver circuit, a signal line driver circuit, or the like can be used as the IC 373, for example. Note that the display apparatus 400 and the display module are not necessarily provided with an IC. The IC may be mounted on the FPC by a COF method or the like.

FIG. 17A illustrates an example of cross-sections of part of a region including the FPC 372, part of a region including the circuit 364, part of a region including the display portion 362, and part of a region including an end portion of the display apparatus 400 illustrated in FIG. 16.

The display apparatus 400 illustrated in FIG. 17 includes a transistor 408, a transistor 409, a transistor 410, the light-emitting element 390, the light-receiving element 310, and the like between the substrate 353 and the substrate 354.

The substrate 354 and the protective layer 395 are bonded to each other with the adhesive layer 342, and a solid sealing structure is used for the display apparatus 400.

The substrate 353 and an insulating layer 412 are bonded to each other with an adhesive layer 355.

In a method for manufacturing the display apparatus 400, first, a formation substrate provided with the insulating layer 412, the transistors, the light-receiving element 310, the light-emitting element 390, and the like is bonded to the substrate 354 provided with the light-blocking layer 358 and the like with the adhesive layer 342. Then, with the use of the adhesive layer 355, the substrate 353 is bonded to a surface exposed by separation of the formation substrate, whereby the components formed over the formation substrate are transferred onto the substrate 353. The substrate 353 and the substrate 354 preferably have flexibility. This can increase the flexibility of the display apparatus 400.

The light-emitting element 390 has a stacked-layer structure in which the pixel electrode 391, the buffer layer 312, the light-emitting layer 393, the buffer layer 314, and the common electrode 315 are stacked in this order from the insulating layer 414 side. The pixel electrode 391 is connected to one of a source and a drain of the transistor 408 through an opening provided in the insulating layer 414. The transistor 408 has a function of controlling a current flowing through the light-emitting element 390.

The light-receiving element 310 has a stacked-layer structure in which the pixel electrode 311, the buffer layer 312, the active layer 313, the buffer layer 314, and the common electrode 315 are stacked in this order from the insulating layer 414 side. The pixel electrode 311 is connected to one of a source and a drain of the transistor 409 through an opening provided in the insulating layer 414. The transistor 409 has a function of controlling transfer of charge accumulated in the light-receiving element 310.

Light emitted from the light-emitting element 390 is emitted toward the substrate 354 side. Light is incident on the light-receiving element 310 through the substrate 354 and the adhesive layer 342. For the substrate 354, a material having a high visible-light-transmitting property is preferably used.

The pixel electrode 311 and the pixel electrode 391 can be formed using the same material in the same step. The buffer layer 312, the buffer layer 314, and the common electrode 315 are shared by the light-receiving element 310 and the light-emitting element 390. The light-receiving element 310 and the light-emitting element 390 can have common components except the active layer 313 and the light-emitting layer 393. Thus, the light-receiving element 310 can be incorporated in the display apparatus 400 without a significant increase in the number of manufacturing steps.

The light-blocking layer 358 is provided on a surface of the substrate 354 on the substrate 353 side. The light-blocking layer 358 includes openings in a position overlapping with the light-emitting element 390 and in a position overlapping with the light-receiving element 310. Providing the light-blocking layer 358 can control the range where the light-receiving element 310 detects light. As described above, it is preferable to control light to be incident on the light-receiving element 310 by adjusting the position and area of the opening of the light-blocking layer provided in the position overlapping with the light-receiving element 310. Furthermore, with the light-blocking layer 358, light can be inhibited from being incident on the light-receiving element 310 directly from the light-emitting element 390 without through an object. Hence, a sensor with less noise and a high sensitivity can be obtained.

An end portion of the pixel electrode 311 and an end portion of the pixel electrode 391 are each covered with the partition 416. The pixel electrode 311 and the pixel electrode 391 each contain a material that reflects visible light, and the common electrode 315 contains a material that transmits visible light.

A region where part of the active layer 313 overlaps with part of the light-emitting layer 393 is included in the example illustrated in FIG. 17A. The portion where the active layer 313 overlaps with the light-emitting layer 393 preferably overlaps with the light-blocking layer 358 and the partition 416.

The transistor 408, the transistor 409, and the transistor 410 are formed over the substrate 353. These transistors can be formed using the same materials in the same steps.

The insulating layer 412, an insulating layer 411, an insulating layer 425, an insulating layer 415, an insulating layer 418, and the insulating layer 414 are provided in this order over the substrate 353 with the adhesive layer 355 therebetween. Each of the insulating layer 411 and the insulating layer 425 partially functions as a gate insulating layer for the transistors. The insulating layer 415 and the insulating layer 418 are provided to cover the transistors. The insulating layer 414 is provided to cover the transistors and has a function of a planarization layer. Note that there is no limitation on the number of gate insulating layers and the number of insulating layers covering the transistors, and each insulating layer may have either a single layer or two or more layers.

A material into which impurities such as water or hydrogen do not easily diffuse is preferably used for at least one of the insulating layers that cover the transistors. This allows the insulating layer to serve as a barrier layer. Such a structure can effectively inhibit diffusion of impurities into the transistors from the outside and increase the reliability of the display apparatus.

An inorganic insulating film is preferably used as each of the insulating layer 411, the insulating layer 412, the insulating layer 425, the insulating layer 415, and the insulating layer 418. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, a hafnium oxynitride film, a hafnium nitride oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

Here, an organic insulating film often has a lower barrier property than an inorganic insulating film. Therefore, the organic insulating film preferably has an opening in the vicinity of an end portion of the display apparatus 400. In a region 428 illustrated in FIG. 17, an opening is formed in the insulating layer 414. This can inhibit entry of impurities from the end portion of the display apparatus 400 through the organic insulating film. Alternatively, the organic insulating film may be formed so that an end portion of the organic insulating film is positioned on the inner side compared to the end portion of the display apparatus 400, to prevent the organic insulating film from being exposed at the end portion of the display apparatus 400.

In the region 428 in the vicinity of the end portion of the display apparatus 400, the insulating layer 418 and the protective layer 395 are preferably in contact with each other through the opening in the insulating layer 414. In particular, the inorganic insulating film included in the insulating layer 418 and the inorganic insulating film included in the protective layer 395 are preferably in contact with each other. Thus, entry of impurities into the display portion 362 from the outside through an organic insulating film can be inhibited. Thus, the reliability of the display apparatus 400 can be increased.

An organic insulating film is suitable for the insulating layer 414 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

Providing the protective layer 395 covering the light-emitting element 390 and the light-receiving element 310 can inhibit impurities such as water from entering the light-emitting element 390 and the light-receiving element 310 and increase the reliability of the light-emitting element 390 and the light-receiving element 310.

The protective layer 395 may have a single-layer structure or a stacked-layer structure. For example, the protective layer 395 may have a stacked-layer structure of an organic insulating film and an inorganic insulating film. In that case, an end portion of the inorganic insulating film preferably extends beyond an end portion of the organic insulating film.

FIG. 17B is a cross-sectional view of a transistor 401a that can be used as the transistor 408, the transistor 409, and the transistor 410.

The transistor 401a is provided over the insulating layer 412 (not illustrated) and includes a conductive layer 421 functioning as a first gate, the insulating layer 411 functioning as a first gate insulating layer, a semiconductor layer 431, the insulating layer 425 functioning as a second gate insulating layer, and a conductive layer 423 functioning as a second gate. The insulating layer 411 is positioned between the conductive layer 421 and the semiconductor layer 431. The insulating layer 425 is positioned between the conductive layer 423 and the semiconductor layer 431.

The semiconductor layer 431 includes a region 431$i$ and a pair of regions 431$n$. The region 431$i$ functions as a channel formation region. One of the pair of regions 431$n$ serves as a source and the other thereof serves as a drain. The regions 431$n$ have higher carrier concentration and higher conductivity than the region 431$i$. The conductive layer 422a and the conductive layer 422b are connected to the regions 431$n$ through openings provided in the insulating layer 418 and the insulating layer 415.

FIG. 17C is a cross-sectional view of a transistor 401b that can be used as the transistor 408, the transistor 409, and the transistor 410. Furthermore, in the example illustrated in FIG. 17C, the insulating layer 415 is not provided. In the transistor 401b, the insulating layer 425 is processed in the same manner as the conductive layer 423, and the insulating layer 418 is in contact with the regions 431$n$.

Note that there is no particular limitation on the structure of the transistors included in the display apparatus of this embodiment. For example, a planar transistor, a staggered transistor, or an inverted staggered transistor can be used. A top-gate or a bottom-gate transistor structure may be employed. Alternatively, gates may be provided above and below a semiconductor layer in which a channel is formed.

The structure in which the semiconductor layer where a channel is formed is provided between two gates is used for the transistor 408, the transistor 409, and the transistor 410. The two gates may be connected to each other and supplied with the same signal to drive the transistor. Alternatively, a potential for controlling the threshold voltage may be supplied to one of the two gates and a potential for driving may be supplied to the other to control the threshold voltage of the transistor.

There is no particular limitation on the crystallinity of a semiconductor material used for the transistors; any of an amorphous semiconductor, a single crystal semiconductor, and a semiconductor having crystallinity (a microcrystalline semiconductor, a polycrystalline semiconductor, or a semiconductor partly including crystal regions) may be used. A semiconductor having crystallinity is preferably used, in which case deterioration of the transistor characteristics can be suppressed.

The semiconductor layer of the transistor preferably contains a metal oxide (also referred to as an oxide semiconductor). Alternatively, the semiconductor layer of the transistor may contain silicon. Examples of silicon include amorphous silicon and crystalline silicon (e.g., low-temperature polysilicon or single crystal silicon).

The semiconductor layer preferably includes indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. In particular, M is preferably one or more kinds selected from aluminum, gallium, yttrium, and tin.

It is particularly preferable to use an oxide containing indium (In), gallium (Ga), and zinc (Zn) (also referred to as IGZO) for the semiconductor layer.

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of a desired atomic ratio.

For example, when the atomic ratio is described as In:Ga:Zn=4:2:3 or a composition in the neighborhood thereof, the case is included where the atomic ratio of Ga is greater than or equal to 1 and less than or equal to 3 and the atomic ratio of Zn is greater than or equal to 2 and less than or equal to 4 with the atomic ratio of In being 4. When the atomic ratio is described as In:Ga:Zn=5:1:6 or a composition in the neighborhood thereof, the case is included where the atomic ratio of Ga is greater than 0.1 and less than or equal to 2 and the atomic ratio of Zn is greater than or equal to 5 and less than or equal to 7 with the atomic ratio of In being 5. When the atomic ratio is described as In:Ga:Zn=1:1:1 or a composition in the neighborhood thereof, the case is included where the atomic ratio of Ga is greater than 0.1 and less than or equal to 2 and the atomic ratio of Zn is greater than 0.1 and less than or equal to 2 with the atomic ratio of In being 1.

The transistor 410 included in the circuit 364 and the transistor 408 and the transistor 409 included in the display portion 362 may have the same structure or different structures. A plurality of transistors included in the circuit 364 may have the same structure or two or more kinds of structures. Similarly, a plurality of transistors included in the display portion 362 may have the same structure or two or more kinds of structures.

A connection portion 404 is provided in a region of the substrate 353 that does not overlap with the substrate 354. In the connection portion 404, the wiring 365 is electrically connected to the FPC 372 through a conductive layer 366 and a connection layer 442. The conductive layer 366 obtained by processing the same conductive film as the pixel electrode 311 and the pixel electrode 391 is exposed on a top surface of the connection portion 404. Thus, the connection portion 404 and the FPC 372 can be electrically connected to each other through the connection layer 442.

A variety of optical members can be arranged on the outer side of the substrate 354. Examples of the optical members include a polarizing plate, a retardation plate, a light diffusion layer (a diffusion film or the like), an anti-reflective layer, and a light-condensing film. Furthermore, an antistatic film preventing the attachment of dust, a water repellent film inhibiting the attachment of stain, a hard coat film inhibiting generation of a scratch caused by the use, a shock absorption layer, or the like may be placed on the outer side of the substrate 354.

When a flexible material is used for the substrate 353 and the substrate 354, the flexibility of the display apparatus can be increased. The material is not limited thereto, and glass, quartz, ceramic, sapphire, resin, or the like can be used for each of the substrate 353 and the substrate 354.

As the adhesive layer, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-component resin may be used. An adhesive sheet or the like may be used.

As the connection layer, an anisotropic conductive film (ACF), an anisotropic conductive paste (ACP), or the like can be used.

Examples of materials that can be used for a gate, a source, and a drain of a transistor and conductive layers such as a variety of wirings and electrodes included in a display apparatus include metals such as aluminum, titanium, chromium, nickel, copper, yttrium, zirconium, molybdenum, silver, tantalum, or tungsten, and an alloy containing any of these metals as its main component. A film containing any of these materials can be used as a single layer or in a stacked-layer structure.

As a light-transmitting conductive material, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Further alternatively, a nitride of the metal material (e.g., titanium nitride) or the like may be used. Note that in the case of using the metal material or the alloy material (or the nitride thereof), the thickness is preferably set small enough to be able to transmit light. A stacked-layer film of any of the above materials can be used as a conductive layer. For example, a stacked-layer film of indium tin oxide and an alloy of silver and magnesium, or the like is preferably used for increased conductivity. These materials can also be used for conductive layers such as a variety of wirings and electrodes that constitute a display apparatus, and conductive layers (conductive layers functioning as a pixel electrode, a common electrode, or the like) included in a light-emitting element and a light-receiving element (or a light-emitting and light-receiving element).

As an insulating material that can be used for each insulating layer, for example, a resin such as an acrylic resin or an epoxy resin, and an inorganic insulating material such as silicon oxide, silicon oxynitride, silicon nitride oxide, silicon nitride, or aluminum oxide can be given.

At least part of this embodiment can be implemented in combination with the other embodiments described in this specification as appropriate.

Embodiment 3

In this embodiment, a circuit that can be used in the display apparatus of one embodiment of the present invention will be described.

Figure 18A:
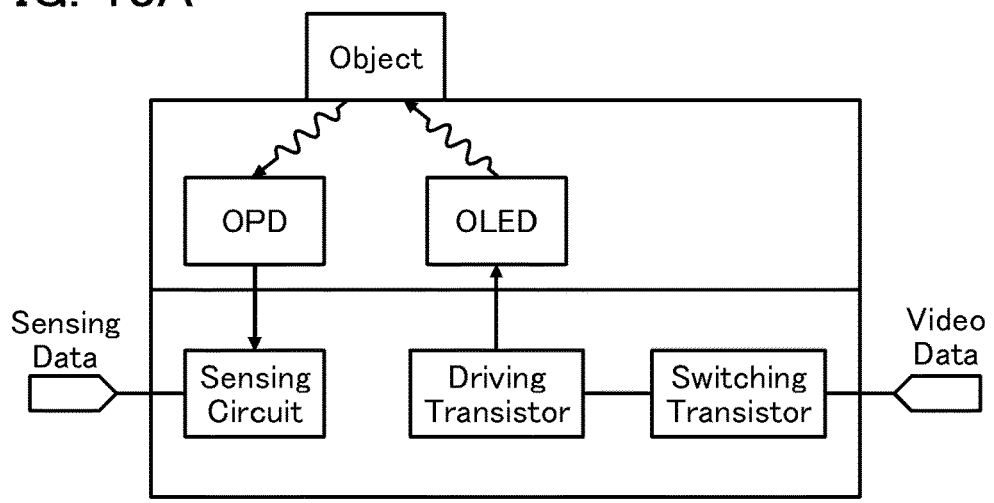
FIG. 18A and FIG. 18B are diagrams illustrating structure examples of a pixel.

FIG. 18A is a block diagram of a pixel of the display apparatus of one embodiment of the present invention.

The pixel includes an OLED, an OPD (Organic Photo Diode), a sensing circuit (denoted as Sensing Circuit), a driving transistor (denoted as Driving Transistor), and a selection transistor (denoted as Switching Transistor).

Light emitted from the OLED is reflected by an object (denoted as Object), and the reflected light is received by the OPD, whereby an image of the object can be captured. One embodiment of the present invention can function as a touch sensor, an image sensor, an image scanner, and the like. With image capturing for a fingerprint, a palm print, a blood vessel (e.g., a vein), or the like, one embodiment of the present invention can be applied to a biometric authentication. Furthermore, an image of a printed matter with a photograph, letters, and the like, or a surface of an article or the like can be captured to be obtained as image information.

The driving transistor and the selection transistor form a driver circuit for driving the OLED. The driving transistor has a function of controlling a current flowing to the OLED, and the OLED can emit light with a luminance according to the current. The selection transistor has a function of controlling selection/non-selection of the pixel. The amount of current flowing to the driving transistor and the OLED is controlled depending on the value (e.g., the voltage value) of video data (denoted as Video Data) that is input from the outside through the selection transistor, whereby the OLED can be emit light with a desired emission luminance.

The sensing circuit corresponds to a driver circuit for controlling the operation of the OPD. The sensing circuit can control operations such as a reset operation for resetting the potential of an electrode of the OPD, a light exposure operation for accumulating charge in the OPD in accordance with the amount of irradiation light, a transfer operation for transferring the charge accumulated in the OPD to a node in the sensing circuit, and a reading operation for outputting a signal (e.g., a voltage or a current) corresponding to the magnitude of the charge, to an external reading circuit as sensing data (denoted as Sensing Data).

Figure 18B:
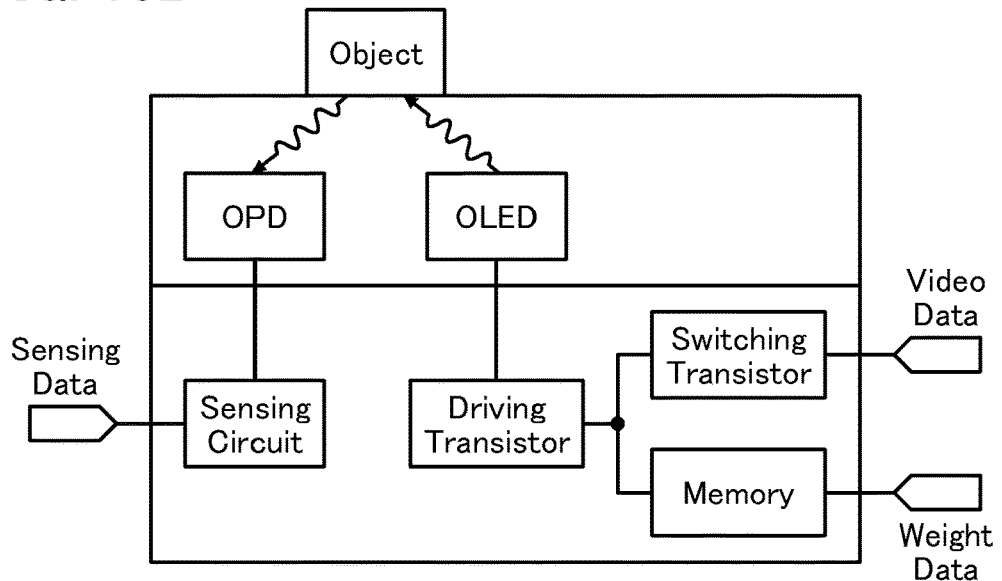

A pixel illustrated in FIG. 18B differs from that described above mainly in including a memory portion (denoted as Memory) connected to the driving transistor.

Weight data (denoted as Weight Data) is supplied to the memory portion. Data obtained by adding video data input through the selection transistor and the weight data retained in the memory portion is supplied to the driving transistor. With the weight data retained in the memory portion, the luminance of the OLED can be changed from that of the case where only the video data is supplied. Specifically, it is possible to increase or decrease the luminance of the OLED. For example, increasing the luminance of the OLED can increase the light sensitivity of the sensor.

Figure 18C:
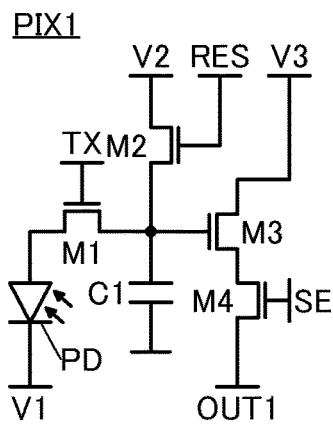
FIG. 18C to FIG. 18E are diagrams illustrating structure examples of pixel circuits.

FIG. 18C illustrates an example of a pixel circuit that can be used for the sensing circuit.

A pixel circuit PIX1 illustrated in FIG. 18C includes a light-receiving element PD, a transistor M1, a transistor M2, a transistor M3, a transistor M4, and a capacitor C1. Here, an example in which a photodiode is used as the light-receiving element PD is illustrated.

A cathode of the light-receiving element PD is electrically connected to a wiring V1, and an anode thereof is electrically connected to one of a source and a drain of the transistor M1. A gate of the transistor M1 is electrically connected to a wiring TX, and the other of the source and the drain thereof is electrically connected to one electrode of the capacitor C1, one of a source and a drain of the transistor M2, and a gate of the transistor M3. A gate of the transistor M2 is electrically connected to a wiring RES, and the other of the source and the drain thereof is electrically connected to a wiring V2. One of a source and a drain of the transistor M3 is electrically connected to a wiring V3, and the other of the source and the drain thereof is electrically connected to one of a source and a drain of the transistor M4. A gate of the transistor M4 is electrically connected to a wiring SE, and the other of the source and the drain thereof is electrically connected to a wiring OUT1.

A constant potential is supplied to each of the wiring V1, the wiring V2, and the wiring V3. When the light-receiving element PD is driven with a reverse bias, a potential lower than the potential of the wiring V1 is supplied to the wiring V2. The transistor M2 is controlled by a signal supplied to the wiring RES and has a function of resetting the potential of a node connected to the gate of the transistor M3 to a potential supplied to the wiring V2. The transistor M1 is controlled by a signal supplied to the wiring TX and has a function of controlling the timing at which the charge accumulated in the light-receiving element PD is transferred to the node. The transistor M3 functions as an amplifier transistor for performing output corresponding to the potential of the node. The transistor M4 is controlled by a signal supplied to the wiring SE and functions as a selection transistor for reading an output corresponding to the potential of the node by an external circuit connected to the wiring OUT1.

Here, the light-receiving element PD corresponds to the above-described OPD. A potential or a current output from the wiring OUT1 corresponds to the above-described sensing data.

Figure 18D:
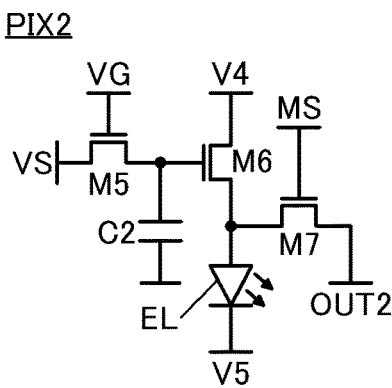

FIG. 18D illustrates an example of a pixel circuit for driving the above-described OLED.

A pixel circuit PIX2 illustrated in FIG. 18D includes a light-emitting element EL, a transistor M5, a transistor M6, a transistor M7, and a capacitor C2. Here, an example in which a light-emitting diode is used as the light-emitting element EL is illustrated. In particular, an organic EL element is preferably used as the light-emitting element EL.

The light-emitting element EL corresponds to the above-described OLED, the transistor M5 corresponds to the above-described selection transistor, and the transistor M6 corresponds to the above-described driving transistor. A wiring VS corresponds to a wiring to which the above-described video data is input.

A gate of the transistor M5 is electrically connected to a wiring VG, one of a source and a drain thereof is electrically connected to the wiring VS, and the other of the source and the drain thereof is electrically connected to one electrode of the capacitor C2 and a gate of the transistor M6. One of a source and a drain of the transistor M6 is electrically connected to a wiring V4, and the other of the source and the drain thereof is electrically connected to an anode of the light-emitting element EL and one of a source and a drain of the transistor M7. A gate of the transistor M7 is electrically connected to a wiring MS, and the other of the source and the drain thereof is electrically connected to a wiring OUT2. A cathode of the light-emitting element EL is electrically connected to a wiring V5.

A constant potential is supplied to each of the wiring V4 and the wiring V5. In the light-emitting element EL, the anode side can have a high potential and the cathode side can have a lower potential than the anode side. The transistor M5 is controlled by a signal supplied to the wiring VG and functions as a selection transistor for controlling a selection state of the pixel circuit PIX2. The transistor M6 functions as a driving transistor that controls a current flowing through the light-emitting element EL, in accordance with a potential supplied to the gate. When the transistor M5 is in an on state, a potential supplied to the wiring VS is supplied to the gate of the transistor M6, and the emission luminance of the light-emitting element EL can be controlled in accordance with the potential. The transistor M7 is controlled by a signal supplied to the wiring MS and has a function of making the potential between the transistor M6 and the light-emitting element EL a potential to be supplied to the wiring OUT2 and/or a function of outputting the potential between the transistor M6 and the light-emitting element EL to the outside through the wiring OUT2.

Figure 18E:
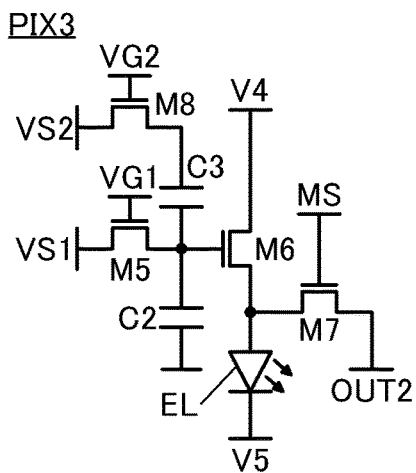

FIG. 18E illustrates an example of a pixel circuit provided with a memory portion, which can be applied to the structure illustrated in FIG. 18B as an example.

A pixel circuit PIX3 illustrated in FIG. 18E has the structure of the pixel circuit PIX2 to which a transistor M8 and a capacitor C3 are added. The wiring VS and the wiring VG in the pixel circuit PIX2 are denoted as a wiring VS1 and a wiring VG1, respectively, in the pixel circuit PIX3.

A gate of the transistor M8 is electrically connected to a wiring VG2, one of a source and a drain of the transistor M8 is electrically connected to a wiring VS2, and the other thereof is electrically connected to one electrode of the capacitor C3. The other electrode of the capacitor C3 is electrically connected to the gate of the transistor M6, one electrode of the capacitor C2, and the other of the source and the drain of the transistor M5.

The wiring VS1 corresponds to the above-described wiring to which the video data is supplied. The wiring VS2 corresponds to a wiring to which the above-described weight data is supplied. A node to which the gate of the transistor M6 is connected corresponds to the above-described memory portion.

An example of a method for operating the pixel circuit PIX3 is described. First, a first potential is written from the wiring VS1 to the node to which the gate of the transistor M6 is connected, through the transistor M5. After that, the transistor M5 is turned off, whereby the node becomes in a floating state. Next, a second potential is written from the wiring VS2 to the one electrode of the capacitor C3 through the transistor M8. Accordingly, the potential of the node changes from the first potential in accordance with the second potential owing to capacitive coupling of the capacitor C3, thereby becoming a third potential. Then, a current corresponding to the third potential flows to the transistor M6 and the light-emitting element EL, whereby the light-emitting element EL emits light with a luminance corresponding to the potential.

Note that in the display apparatus of this embodiment, the light-emitting element may be made to emit light in a pulsed manner so as to display an image. A reduction in the driving time of the light-emitting element can reduce the power consumption of the display apparatus and suppress heat generation of the display apparatus. An organic EL element is particularly preferable because of its favorable frequency characteristics. The frequency can be higher than or equal to 1 kHz and lower than or equal to 100 MHz, for example. Alternatively, a driving method in which the light-emitting element is made to emit light with the pulse width being varied, which is also referred to as Duty driving, may be used.

Here, a transistor including a metal oxide (an oxide semiconductor) in a semiconductor layer where a channels is formed is preferably used as each of the transistor M1, the transistor M2, the transistor M3, and the transistor M4 included in the pixel circuit PIX1, the transistor M5, the transistor M6, and the transistor M7 included in the pixel circuit PIX2, and the transistor M8 included in the pixel circuit PIX3.

Alternatively, a transistor including silicon as a semiconductor where a channel is formed can be used as each of the transistor M1 to the transistor M8. In particular, the use of silicon with high crystallinity, such as single crystal silicon or polycrystalline silicon, is preferable because high field-effect mobility is achieved and higher-speed operation is possible.

Alternatively, a transistor including an oxide semiconductor may be used as one or more of the transistor M1 to the transistor M8, and transistors including silicon may be used as the other transistors.

For example, transistors that include an oxide semiconductor and have an extremely low off-state current are preferably used as the transistor M1, the transistor M2, the transistor M5, the transistor M7, and the transistor M8 that function as switches for retaining charge. In this case, a transistor including silicon can be used as one or more of the other transistors.

Although n-channel transistors are shown as the transistors in the pixel circuit PIX1, the pixel circuit PIX2, and the pixel circuit PIX3, p-channel transistors can also be used. Alternatively, a structure in which n-channel transistor and p-channel transistor are mixed may be employed.

At least part of this embodiment can be implemented in combination with the other embodiments described in this specification as appropriate.

Embodiment 4

Described in this embodiment is a metal oxide (also referred to as an oxide semiconductor) that can be used in a transistor described in the above embodiment.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

The metal oxide can be formed by a sputtering method, a chemical vapor deposition (CVD) method such as a metal organic chemical vapor deposition (MOCVD) method, an atomic layer deposition (ALD) method, or the like.

<Classification of Crystal Structures>

Amorphous (including a completely amorphous structure), CAAC (c-axis-aligned crystalline), nc (nanocrystalline), CAC (cloud-aligned composite), single crystal, and polycrystalline (poly crystal) structures can be given as examples of a crystal structure of an oxide semiconductor.

A crystal structure of a film or a substrate can be analyzed with an X-ray diffraction (XRD) spectrum. For example, evaluation is possible using an XRD spectrum obtained by GIXD (Grazing-Incidence XRD) measurement. Note that a GIXD method is also referred to as a thin film method or a Seemann-Bohlin method.

For example, the XRD spectrum of a quartz glass substrate shows a peak with a substantially bilaterally symmetrical shape. On the other hand, the peak of the XRD spectrum of an IGZO film having a crystal structure has a bilaterally asymmetrical shape. The asymmetrical peak of the XRD spectrum clearly shows the existence of crystal in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction method (NBED) (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the IGZO film deposited at room temperature. Thus, it is suggested that the IGZO film deposited at room temperature is in an intermediate state, which is neither a crystal state nor an amorphous state, and it cannot be concluded that the IGZO film is in an amorphous state.

<<Structure of Oxide Semiconductor>>

Oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM (Transmission Electron Microscope) image, for example.

When the CAAC-OS film is subjected to structural analysis by out-of-plane XRD measurement with an XRD apparatus using $\theta/2\theta$ scanning, for example, a peak indicating c-axis alignment is detected at $2\theta$ of 31° or around 31°. Note that the position of the peak indicating c-axis alignment (the value of $2\theta$) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, or the like.

A crystal structure in which a clear crystal grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, or the like, the CAAC-OS can be regarded as an oxide semiconductor that has a small amount of impurities and defects (e.g., oxygen vacancies). Hence, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Hence, the orientation in the whole film is not observed. Accordingly, the nc-OS cannot be distinguished from an a-like OS or an amorphous oxide semiconductor by some analysis methods. For example, when an nc-OS film is subjected to structural analysis using out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., greater than or equal to 1 nm and less than or equal to 30 nm).

[a-Like OS]

The a-like OS is an oxide semiconductor having a structure between those of the nc-OS and the amorphous oxide semiconductor. The a-like OS includes a void or a low-density region. That is, the a-like OS has lower crystallinity than the nc-OS and the CAAC-OS. Moreover, the a-like OS has higher hydrogen concentration in the film than the nc-OS and the CAAC-OS.

<<Composition of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions randomly exist to form a mosaic pattern. Thus, it is suggested that the CAC-OS has a structure in which metal elements are unevenly distributed.

The CAC-OS can be formed by a sputtering method under a condition where a substrate is not heated, for example. Moreover, in the case of forming the CAC-OS by a sputtering method, any one or more selected from an inert gas (typically, argon), an oxygen gas, and a nitrogen gas are used as a deposition gas. The ratio of the flow rate of the oxygen gas to the total flow rate of the deposition gas in deposition is preferably as low as possible; for example, the ratio of the flow rate of the oxygen gas to the total flow rate of the deposition gas in deposition is higher than or equal to 0% and lower than 30%, preferably higher than or equal to 0% and lower than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has a higher conductivity than the second region. In other words, when carriers flow through the first region, the conductivity of a metal oxide is exhibited. Accordingly, when the first regions are distributed in a metal oxide as a cloud, high field-effect mobility (μ) can be achieved.

The second region has a higher insulating property than the first region. In other words, when the second regions are distributed in a metal oxide, a leakage current can be inhibited.

Thus, in the case where the CAC-OS is used for a transistor, a switching function (On/Off switching function) can be given to the CAC-OS owing to the complementary action of the conductivity derived from the first region and the insulating property derived from the second region. A CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility (μ), and excellent switching operation can be achieved.

A transistor using a CAC-OS has high reliability. Thus, the CAC-OS is most suitable for a variety of semiconductor devices such as display apparatuses.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for the transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm', yet further preferably lower than $1\times10^{10}$ cm$^{-3}$, and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurities>

Here, the influence of each impurity in the oxide semiconductor is described.

When silicon, carbon, or the like, which is one of Group 14 elements, is contained in the oxide semiconductor, defect states are formed in the oxide semiconductor. Thus, the concentration of silicon, carbon, or the like in the oxide semiconductor and the concentration of silicon, carbon, or the like in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Accordingly, a transistor including an oxide semiconductor that contains an alkali metal or an alkaline earth metal tends to have normally-on characteristics. Thus, the concentration of an alkali metal or an alkaline earth metal in the oxide semiconductor, which is obtained by SIMS, is lower than or equal to $1\times10^{18}$ atoms/cm$^3$, preferably lower than or equal to $2\times10^{16}$ atoms/cm$^3$.

When the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

At least part of this embodiment can be implemented in combination with the other embodiments described in this specification as appropriate.

REFERENCE NUMERALS

10: vehicle control device, 20 and 20a to 20d: light-emitting and light-receiving unit, 21, 21R, 21G, 21B, and 21IR: light-emitting element, 22: light-receiving element, 23: driver circuit, 24: reading circuit, 25r: reflected light, 25: light, 30: control unit, 31: data generation portion, 32: determination portion, 33: processing portion, 40: operation unit, 41: steering wheel, 42: rim, 42a and 42b: member, 43: hub, 44: spoke, 45: shaft, 51: hand, 51L: left hand, 51R: right hand.

The invention claimed is:

1. A vehicle control device comprising:
an operation unit comprising a steering wheel, the steering wheel comprising a rim, a hub, and a spoke;
a first unit comprising a first light-emitting element and a first light-receiving element; and
a control unit,
wherein the rim is connected to the hub through the spoke,
wherein the first unit is provided along a surface of the rim,
wherein the first light-emitting element is configured to emit light with a first wavelength range,
wherein the first light-receiving element is configured to convert the light with the first wavelength range into an electrical signal,
wherein the first unit is configured to output received-light data to the control unit,
wherein the control unit is configured to obtain biological information of a driver from the received-light data,
wherein the first light-emitting element has a stacked-layer structure in which a first electrode, a light-emitting layer, and a common electrode are stacked,
wherein the first light-receiving element has a stacked-layer structure in which a second electrode, an active layer, and the common electrode are stacked,
wherein the light-emitting layer and the active layer contain different organic compounds,
wherein the first electrode and the second electrode are apart from each other on a same plane, and
wherein the common electrode covers the light-emitting layer and the active layer.

2. The vehicle control device according to claim 1, wherein the biological information is at least one of a pulse wave, a heart rate, a pulse, and artery blood oxygen saturation.

3. The vehicle control device according to claim 1, wherein the biological information is a vein, a fingerprint, or a palm print.

4. The vehicle control device according to claim 1, further comprising a second unit,
wherein the second unit is provided along a surface of one of the hub and the spoke,
wherein the second unit comprises a second light-emitting element and a second light-receiving element,
wherein the second light-emitting element is configured to emit light with a second wavelength range, and
wherein the second light-receiving element is configured to convert the light with the second wavelength range into an electric signal.

5. The vehicle control device according to claim 1, wherein the light with the first wavelength range comprises infrared light.

6. The vehicle control device according to claim 4, wherein the light with the second wavelength range comprises infrared light.

7. The vehicle control device according to claim 1,
wherein the first unit further comprises a third light-emitting element, and
wherein the third light-emitting element is configured to emit light with a third wavelength range comprising visible light.

8. The vehicle control device according to claim 4,
wherein the second unit further comprises a fourth light-emitting element, and
wherein the fourth light-emitting element is configured to emit light with a fourth wavelength range comprising visible light.

9. The vehicle control device according to claim 1,
wherein the first light-emitting element further comprises a common layer,
wherein the first light-receiving element further comprises the common layer, and
wherein the common layer is provided to cover the first electrode and the second electrode.

10. The vehicle control device according to claim 1, wherein the surface of the rim is flat.

* * * * *